US008497142B2

(12) United States Patent
Yang et al.

(10) Patent No.: US 8,497,142 B2

(45) Date of Patent: Jul. 30, 2013

(54) METHODS OF FORMING CONDUCTIVE LAYER PATTERNS USING GAS PHASE CLEANING PROCESS AND METHODS OF MANUFACTURING SEMICONDUCTOR DEVICES

(75) Inventors: Jun-Kyu Yang, Seoul (KR); Young-Geun Park, Suwon-si (KR); Ki-Hyun Hwang, Seongnam-si (KR); Han-Mei Choi, Seoul (KR); Dong-Chul Yoo, Seongnam-si (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 114 days.

(21) Appl. No.: 13/102,218

(22) Filed: May 6, 2011

(65) Prior Publication Data

US 2011/0281379 A1 Nov. 17, 2011

(30) Foreign Application Priority Data

May 11, 2010 (KR) ........................ 10-2010-0043835

(51) Int. Cl.
*H01L 21/66* (2006.01)
*H01L 21/44* (2006.01)

(52) U.S. Cl.
USPC .. 438/16; 438/660; 257/E21.295; 257/E21.53

(58) Field of Classification Search
USPC ....................................... 438/660, 16; 134/31
See application file for complete search history.

(56) References Cited

U.S. PATENT DOCUMENTS 6,692,903 B2* 2/2004 Chen et al. .................... 430/329
6,709,610 B2* 3/2004 Van Buskirk et al. .......... 216/64
7,042,564 B2* 5/2006 Shoham et al. ............ 356/237.2
7,134,941 B2* 11/2006 Boumerzoug et al. .......... 451/39
2001/0008138 A1* 7/2001 Demos et al. .................. 134/1.1
2002/0011463 A1* 1/2002 Buskirk et al. .................. 216/64
2005/0126586 A1* 6/2005 Ha et al. ............................ 134/2
2008/0248656 A1* 10/2008 Chen et al. .................... 438/798
2008/0286075 A1* 11/2008 Horii ............................ 414/147
2011/0226734 A1* 9/2011 Sumiya et al. .................. 216/41

FOREIGN PATENT DOCUMENTS

KR 1020080060361 7/2008

* cited by examiner

*Primary Examiner* — Lex Malsawma
(74) *Attorney, Agent, or Firm* — Stanzione & Kim, LLP

(57) ABSTRACT

Methods of forming conductive patterns include forming a conductive layer including a metal element on a substrate. The conductive layer is partially etched to generate a residue including an oxide of the metal element and to form a plurality of separately formed conductive layer patterns. A cleaning gas is inflowed onto the substrate including the conductive layer pattern. The metal compound is evaporated to remove the metal element contained in the residue and to form an insulating interface layer on the conductive layer pattern and a surface portion of the substrate through a reaction of a portion of the cleaning gas and oxygen. The residue may be removed from the conductive layer pattern to suppress generation of a leakage current.

46 Claims, 33 Drawing Sheets

20
16
18
12
10
Cl
Si
12

240
236
216 217
205d
205c
205b
205a
205
200
202
238
217
216
202
232d
232c
232b
232a
228
226
224
200

METHODS OF FORMING CONDUCTIVE LAYER PATTERNS USING GAS PHASE CLEANING PROCESS AND METHODS OF MANUFACTURING SEMICONDUCTOR DEVICES

CROSS-REFERENCE TO RELATED APPLICATIONS

This application claims priority under 35 USC §119 from Korean Patent Application No. 10-2010-0043835, filed on May 11, 2010 in the Korean Intellectual Property Office (KIPO), the disclosure of which is incorporated herein by reference in its entirety.

BACKGROUND

1. Field of the General Inventive Concept

The general inventive concept relates to methods of forming a conductive layer pattern using a gas phase cleaning process and methods of manufacturing a semiconductor device using the methods of forming the conductive layer pattern.

2. Description of the Related Art

As semiconductor devices have been highly integrated, physical sizes of various structures constituting the semiconductor devices including a line width and spaces of cell transistors and metal wirings, a size of capacitors, etc., have become remarkably decreased. Recently, dynamic random access memory (DRAM) devices having a critical size of about 40 nm have been developed and flash memory devices having a critical size of about 30 nm have been developed. However, the decrease of the physical size of each device structure can frequently cause problems such as lowering electric characteristics or generation of an operation defect. Accordingly, in order to manufacture highly integrated devices, a process technique on manufacturing semiconductor devices having even higher reliability has been required.

SUMMARY

Example embodiments of the present general inventive concept provide methods of removing conductive and metallic residue.

Example embodiments of the present general inventive concept also provide methods of forming a conductive layer pattern capable of reducing a generation of a leakage current.

Example embodiments of the present general inventive concept also provide methods of manufacturing a semiconductor device using the methods of forming the conductive layer pattern.

Example embodiments of the present general inventive concept also provide semiconductor devices manufactured by the methods of manufacturing the semiconductor device.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept may be achieved by providing methods of removing conductive residue in which a cleaning gas is inflowed onto a substrate including a residue containing a metal element. The cleaning gas contains an element to react with the metal element and generating a volatile metal compound. The volatile metal compound is evaporated to remove the metal component in the residue.

In some embodiments, the residue may include an oxide compound of the metal element.

In some embodiments, the metal element contained in the residue may be at least one of tungsten, titanium, tantalum and platinum.

In some embodiments, the element to generate the volatile metal compound in the cleaning gas may include chlorine.

In some embodiments, the cleaning gas may include an element to generate a volatile metal oxide and silicon.

In some embodiments, the cleaning gas may include at least one of tetrachloro silane ($SiCl_4$), hexachloro silane ($Si_2Cl_6$), dichloro silane ($SiCl_2H_2$), trichloro silane ($SiCl_3H$) and monochloro silane ($SiClH_3$).

In some embodiments, oxygen and the silicon contained in the cleaning gas may react to form silicon oxide on the substrate while evaporating the metal compound to remove the metal element contained in the residue.

In some embodiments, the method of removing residue may further perform a process of removing the silicon oxide.

The foregoing and/or other aspects and utilities of the present general inventive concept may also be achieved by providing in a method of forming a conductive layer pattern, a conductive layer containing a metal element is formed on a substrate. The conductive layer is partially etched to generate a residue including an oxide of the metal element and to form a plurality of separately formed conductive layer patterns. A cleaning gas is inflowed onto the substrate including the conductive layer pattern. The cleaning gas contains an element to react with the metal element and generating a volatile metal compound. The metal compound is evaporated to remove the metal element contained in the residue and an insulating interface layer is formed on the conductive layer pattern and a surface portion of the substrate through a reaction of a portion of the cleaning gas and oxygen.

In some embodiments, the conductive layer pattern may include at least one of tungsten, titanium, tantalum and platinum.

In some embodiments, the cleaning gas may include an element to generate a volatile metal oxide and silicon.

In some embodiments, the cleaning gas may include at least one of tetrachloro silane ($SiCl_4$), hexachloro silane ($Si_2Cl_6$), dichloro silane ($SiCl_2H_2$), trichloro silane ($SiCl_3H$) and monochloro silane ($SiClH_3$).

In some embodiments, a removing process of the insulating interface layer may be further performed.

In some embodiments, the inflowing of the cleaning gas and the evaporating of the metal compound may be performed at a temperature range of from about 200° C. to about 1,000° C.

In some embodiments, a heat treating process of the conductive layer pattern may be further performed to increase hardness of the conductive layer pattern.

In some embodiments, the heat treating process may be performed simultaneously with the inflowing of the cleaning gas and the evaporating of the metal compound.

In some embodiments, after the insulating interface layer is formed, the metal compound remaining in the metal element is lifted up above the insulating interface layer such that a bonding state of the metal material to the insulating interface layer is weakened and the metal compound is removed.

The foregoing and/or other aspects and utilities of the present general inventive concept may also be achieved by providing in a method of forming a conductive layer pattern, a conductive layer including a metal element is formed in a first region of a substrate. A polysilicon layer is formed in a second region of the substrate. The polysilicon layer is partially etched to form a polysilicon pattern. The conductive layer is partially etched to form a plurality of separated conductive layer patterns and generate a residue including an oxide compound of the metal element. A cleaning gas is inflowed onto the substrate including the conductive layer pattern. The cleaning gas contains an element to react with the metal element and generating a volatile metal compound. The volatile metal compound is evaporated to remove the residue. A sidewall portion of the polysilicon pattern is selectively oxidized to form an oxide layer. An insulating layer to form a capping state or layer is formed along surface portions of the conductive layer pattern, the oxide layer and the substrate.

In some embodiments, the inflowing of the cleaning gas, the evaporation of the volatile metal compound, the selective oxidization to form the oxide layer and the formation of the insulating layer to form a capping state or layer may be performed in-situ.

In some embodiments, the method may further include performing a post treating process after performing the heat treatment to exhaust out remaining gas and to remove polymers remaining on the conductive layer pattern during and after the cleaning process.

The foregoing and/or other aspects and utilities of the present general inventive concept may also be achieved by providing, in a method of manufacturing a nonvolatile memory device, a tunnel insulating layer is formed on a substrate. A charge trapping layer and a blocking dielectric layer is formed on the tunnel insulating layer. A conductive layer including a metal element is formed on the blocking dielectric layer. The conductive layer is partially etched to form a plurality of separated conductive layer patterns on the blocking dielectric layer and generate a residue including an oxide compound of the metal element. A cleaning gas containing an element to react with the metal element contained in the residue and generating a volatile metal compound is inflowed. The metal compound is evaporated to remove the metal element in the residue and a portion of the cleaning gas reacts with oxygen to form an insulating interface layer on surface portions of the conductive layer pattern and the substrate.

In some embodiments, the cleaning gas may include chlorine and silicon.

In some embodiments, the conductive layer may include at least one metal element among tungsten, titanium, tantalum and platinum.

In some embodiments, the blocking dielectric layer may include at least one metal oxide of aluminum oxide and silicon oxide.

In some embodiments, a removing process of the insulating interface layer by providing a solution to etch the insulating interface layer onto the substrate may be further performed after inflowing the cleaning gas.

In some embodiments, the inflowing of the cleaning gas may be performed at a temperature range of from about 200° C. to about 1,000° C.

In some embodiments, the conductive layer may include tungsten and the inflowing of the cleaning gas may be performed at a temperature of about 227° C. or higher.

In some embodiments, the blocking dielectric layer and the charge trapping layer may be partially removed prior to performing the inflowing of the cleaning gas to form a blocking dielectric layer pattern and a charge trapping layer pattern.

In some embodiments, the method may further include generating a residue including an oxide compound of the metal element on side portions of the tunnel insulating layer, charge trapping layer and blocking dielectric layer, and forming an insulating interface layer on the side portions of the tunnel insulating layer, charge trapping layer and blocking dielectric layer after evaporating the metal compound.

The foregoing and/or other aspects and utilities of the present general inventive concept may also be achieved by providing, in a method of manufacturing a nonvolatile memory device, a substrate including a cell region and a peripheral circuit region is prepared. A gate insulating layer and a gate electrode including silicon is formed in the peripheral circuit region on the substrate. A tunnel insulating layer, a charge trapping layer, a blocking dielectric layer and a conductive layer pattern including a metal element is successively formed in the cell region on the substrate. A gas containing chlorine and silicon is provided onto the substrate to remove a conductive residue remaining between the conductive layer patterns. A surface portion of a sidewall of the gate electrode is selectively oxidized by providing an oxidizing gas and a reducing gas onto the substrate.

In some embodiments, the removing process of the conductive residue and the oxidation of the surface of the sidewall of the gate electrode may be performed in-situ in a same equipment.

In some embodiments, an insulating layer to form a capping state or layer may be formed on the gate electrode, the conductive layer pattern and the substrate in-situ in the same equipment after performing the selective oxidization of the surface of the sidewall of the gate electrode.

The foregoing and/or other aspects and utilities of the present general inventive concept may also be achieved by providing, in a method of manufacturing a vertical type nonvolatile memory device, a vertically extended semiconductor pattern is formed on a substrate. An insulating layer surrounding the semiconductor pattern is formed. A plurality of separated opening portions are formed along a vertical direction of the substrate on the insulating layer, and the opening portions expose a portion of a sidewall of the semiconductor pattern. A tunnel insulating layer is formed at an exposed sidewall portion of the semiconductor pattern by the opening portions. A conductive layer including a charge trapping layer, a blocking dielectric layer and a metal element are successively formed on the tunnel insulating layer. The conductive layer is partially removed to form a plurality of conductive layer patterns filling up the opening portions. A gas containing chlorine and silicon is provided onto the substrate including the conductive layer pattern to remove a residue remaining between the conductive layer patterns.

In some embodiments, the conductive layer may include at least one metal element among tungsten, titanium, tantalum and platinum.

In some embodiments, the successively formed conductive layer may be a control gate layer of a string of serially connected cell transistors.

In some embodiments, the charge trapping layer may be connected between the string of serially connected cell transistors.

In some embodiments, the method may further include forming a second vertically extended semiconductor pattern and a second insulating layer surrounding the second vertically extended semiconductor pattern, and forming a conductive bit line to connect the vertically extended semiconductor pattern to the second vertically extended semiconductor pattern.

In some embodiments, the conductive layers may extend in a first direction and the conductive bit line extends in a second direction perpendicular to the first direction.

The foregoing and/or other aspects and utilities of the present general inventive concept may also be achieved by providing, in a method of manufacturing a transistor, a gate insulating layer is formed on a substrate and a conductive layer including a metal element is formed on the gate insulating layer. The conductive layer is partially removed to form a plurality of separated conductive layer patterns on the insulating layer. A gas containing chlorine and silicon is inflowed to remove a residue remaining between the conductive layer patterns.

In some embodiments, the removing process of the residue may be performed as follows. A reaction of chlorine in the cleaning gas with the metal element in the residue may generate a volatile metal compound. The metal compound may be evaporated to remove the metal element in the residue. Then, a reaction of silicon in the cleaning gas with oxygen may form an insulating interface layer on surface portions of the conductive layer pattern and the substrate.

The foregoing and/or other aspects and utilities of the present general inventive concept may also be achieved by providing, in a method of manufacturing a DRAM, a gate electrode structure is formed on a substrate. A first insulating interlayer including a first contact plug electrically connected to a portion of the substrate is formed on the gate electrode structure. A bit line structure including a metal element is formed on the first insulating interlayer. Residue remaining between the bit line structures is removed by inflowing the gas containing chlorine and silicon. A second insulating interlayer including a second contact plug electrically connected to a portion of the first contact plug is formed on the bit line structure. A capacitor electrically connected to the second contact plug is formed.

In some embodiments, the gate electrode structure may include the metal element and a process of removing a residue remaining between the gate electrode structures may be further performed by inflowing the gas containing chlorine and silicon.

The foregoing and/or other aspects and utilities of the present general inventive concept may also be achieved by providing, in a manufacturing process of a semiconductor device including conductive layer patterns containing a metal, a metal-containing residue generated during a formation of the conductive layer patterns while suppressing damage of the conductive layer patterns may be selectively removed. The residue may be conductive or may remain between the conductive layer patterns to lower electric characteristics of devices. The residue may not be easily removed through a wet etching process and the conductive layer pattern may be over etched through a dry etching process. In some embodiments, the residue may be selectively removed through a gas phase cleaning process for the conductive layer pattern having a minute line width and/or space of about 40 nm or less. A leakage current caused by the remaining residue between the conductive layer patterns may be remarkably decreased and electric properties of the device may be largely improved. Highly integrated semiconductor devices having a high reliability including a flash memory device, a DRAM device, a resistive memory device, etc., may be manufactured.

The foregoing and/or other aspects and utilities of the present general inventive concept may also be achieved by providing a method of testing a semiconductor device, including patterning a layer of a first metal formed on an oxide layer of a second metal on a substrate, measuring a first amount of a residue of the first metal formed on the oxide layer of a second metal; performing a gas phase cleaning process using on the substrate including the pattern of the first metal, measuring a second amount of the metal residue remaining on the oxide of the second metal after performing the gas phase cleaning process, and comparing a difference between the second amount and the first amount to determine an amount of the first metal decreased by performing the gas phase cleaning process.

In some embodiments, the measuring of the first and second amounts of residue of the first metal may be conducted by measuring an X-ray photoelectron spectroscopy (XPS) spectrum of the oxide layer of the second metal positioned between neighboring patterns of the first metal.

In some embodiments, the first metal may be tungsten and the second metal may be aluminum.

In some embodiments, the gas cleaning process may use hexachloro disilane ($Si_2Cl_6$) at a temperature of about 600° C. for a first time period.

BRIEF DESCRIPTION OF THE DRAWINGS

Example embodiments will be more clearly understood from the following detailed description taken in conjunction with the accompanying drawings. FIGS. 1 to 26 represent example embodiments as described herein. These and/or other features and utilities of the present general inventive concept will become apparent and more readily appreciated from the following description of the embodiments, taken in conjunction with the accompanying drawings of which:

FIG. 4 is an X-ray photoelectron spectroscopy (XPS) spectrum illustrating an amount of a metal residue remaining on an aluminum oxide layer before and after performing a gas phase cleaning process in accordance with some example embodiments.

FIGS. 5 and 6 are cross-sectional views illustrating a method of forming a conductive layer pattern in accordance with some example embodiments.

FIG. 7 is a cross-sectional view illustrating a method of forming a conductive layer pattern in accordance with some other example embodiments.

FIG. 9 is a cross-sectional view illustrating an equipment to perform a gas phase cleaning process during a formation of a conductive layer pattern in accordance with some example embodiments.

FIG. 12 is a plan view illustrating a method of manufacturing a nonvolatile memory device in accordance with some example embodiments.

FIG. 15 is a perspective view illustrating a method of manufacturing a vertical nonvolatile memory device in accordance with some example embodiments.

FIG. 19 illustrates a semiconductor apparatus including a semiconductor device manufactured in accordance with some example embodiments.

FIG. 20 illustrates a semiconductor apparatus including a semiconductor device manufactured in accordance with some other example embodiments.

FIG. 21 illustrates a semiconductor apparatus including a semiconductor device manufactured in accordance with some other example embodiments.

FIG. 22 illustrates a portable apparatus including a semiconductor device manufactured in accordance with some example embodiments.

FIG. 23 illustrates a portable apparatus including a semiconductor device manufactured in accordance with some other example embodiments.

FIG. 24 illustrates a semiconductor apparatus including a semiconductor device manufactured in accordance with some other example embodiments.

FIG. 25 illustrates a semiconductor apparatus including a semiconductor device manufactured in accordance with some other example embodiments.

FIG. 26 illustrates a semiconductor apparatus including a semiconductor device manufactured in accordance with some other example embodiments.

DETAILED DESCRIPTION OF THE PREFERRED EMBODIMENTS

Figure 1A:
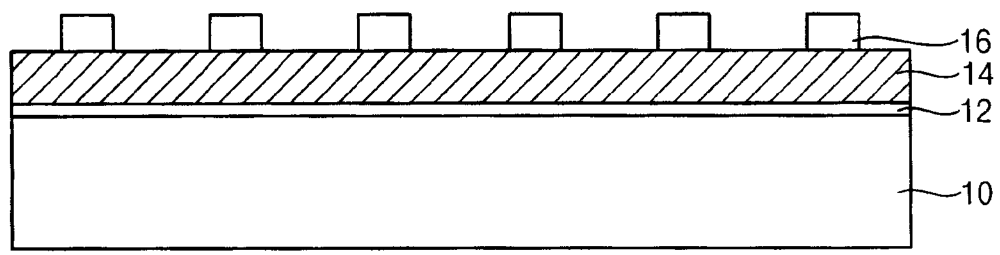
FIGS. 1A to 1C are cross-sectional views illustrating a method of forming a conductive layer pattern in accordance with some example embodiments.

Various example embodiments will be described more fully hereinafter with reference to the accompanying drawings, in which some example embodiments are illustrated. Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The present general inventive concept may, however, be embodied in many different forms and should not be construed as limited to the example embodiments set forth herein. Rather, these example embodiments are provided so that this description will be thorough and complete, and will convey the scope of the present general inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 1B:
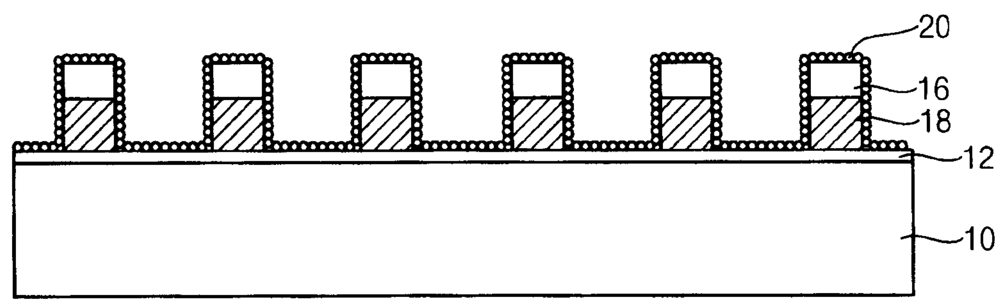
Figure 1C:
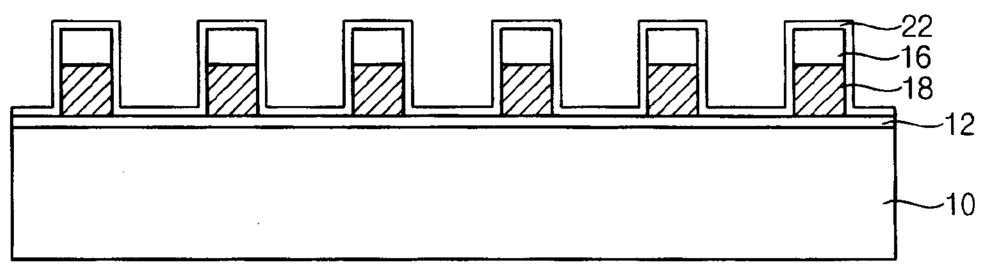

FIGS. 1A to 1C are cross-sectional views illustrating a method of forming a conductive layer pattern in accordance with some example embodiments.

In accordance with these example embodiments, a conductive layer pattern may be formed by removing a metal residue remaining between the conductive layer patterns so as to suppress a defect ratio generated by the metal residue.

Referring to FIG. 1A, a lower layer 12 and a conductive layer 14 may be subsequently formed on a substrate 10. The substrate 10 may include various kinds of substrates without limitation such as a semiconductor substrate, a silicon-on-insulator (SOI) substrate, a glass substrate, a ceramic substrate, a printed circuit substrate, a polymer plate, a metal plate, etc.

The lower layer 12 may be formed using a material having an insulating property such as an insulating interlayer, an etch stopping layer, a dielectric layer, etc. The lower layer 12 may include an insulating material such as silicon oxide, silicon oxynitride, silicon nitride, metal oxide, combinations thereof, etc. Alternatively, the lower layer 12 may not be formed and a metal layer may be formed directly on the substrate.

In some embodiments, various structures including a device, a wiring, a pattern, a layer, a hole, a trench, etc., may be formed on the substrate 10 prior to forming the lower layer 12.

The conductive layer 14 may be formed using a conductive material including a metal element. The conductive material may include a material having a low electric resistivity such as tungsten, tungsten nitride, titanium, titanium nitride, tantalum, tantalum nitride, platinum, etc. The lower layer 12 and the conductive layer 14 may be formed on the substrate 10 by using a deposition method such as a chemical vapor deposition method, a plasma enhanced chemical vapor deposition method, an atomic layer deposition method, a physical vapor deposition method, etc.

On the conductive layer 14, a mask pattern 16 having a predetermined image to pattern the conductive layer 14 may be formed. The mask pattern 16 may be formed to expose a portion of the conductive layer 14 to be subsequently removed. The mask pattern 16 may be formed using a material having an etching selectivity with respect to the conductive layer 14 including an organic hard mask material, an inorganic hard mask material and a photoresist. Particularly, when the conductive layer 14 includes a metal, the mask pattern 16 may be formed using a hard mask material including silicon oxide, silicon nitride and silicon oxynitride. When the mask pattern 16 includes the hard mask material, the hard mask pattern 16 may be formed by etching thus formed hard mask material layer through a photo process using photoresist.

Referring to FIG. 1B, the conductive layer 14 exposed by the mask pattern 16 may be partially etched to form a conductive layer pattern 18. The conductive layer 14 may be etched by a dry etching process or a wet etching process.

While performing the etching process with respect to the conductive layer 14, a residue 20 originated from the material constituting the conductive layer 14 may remain on the substrate 10 including the conductive layer pattern 18. The residue 20 may be a conductive material or a metal oxide. In some embodiments, the conductive layer 14 may include tungsten. In this case, the residue 20 may include tungsten oxide. The residue 20 may be a metal oxide compound obtained through an oxidation by oxygen contained in the lower layer 12 or the mask pattern 16 or by oxygen present around the substrate 10 while performing the etching process.

A metal oxide type residue 20 may exhibit a conductive property. In this case, a leakage current may be generated through the residue 20 present between neighboring conductive layer patterns 18. In some embodiments, when different voltage values are applied to the two neighboring conductive layer patterns 18, a leakage current may be generated between the two conductive layer patterns 18 through the conductive residue 20 to induce a maloperation or a defect of a semiconductor device. In addition, when the lower layer 12 is a dielectric layer having a high dielectric constant, the metal oxide type residue 20 may contaminate the lower dielectric layer or may change the properties of the lower layer 12 to change the dielectricity of the dielectric layer. Accordingly, a process of removing the residue 20 without damaging the conductive layer pattern 18 may be necessary.

Referring to FIG. 1C, the residue 20 remaining on each of the conductive layer pattern 18, the mask pattern 16 and the lower layer 12 may be removed through performing a gas phase cleaning process. The gas phase cleaning process may suppress damage of the conductive layer pattern 18, the mask pattern 16, and the lower layer 12, while selectively removing the residue 20 from the substrate 10.

While performing the gas phase cleaning process, a non-volatile insulating interface layer 22 may be formed on the lower layer 12, the conductive layer pattern 18 and the mask pattern 16 through reactions of the gas phase cleaning gas with the lower layer 12, the mask pattern 16 and the residue 20. In some embodiments, a portion of the gas phase cleaning gas may combine with the residue 20 to form a volatile metal compound. This formed metal compound may be evaporated and removed. The remaining portion of the gas phase cleaning gas may react with oxygen generated while performing the cleaning process to produce an oxide compound having an insulating property. The oxide may be silicon oxide and provided as the insulting interface layer 22 covering surface portions of the lower layer 12, the conductive layer pattern 18 and the mask pattern 16.

After completing the gas phase cleaning process, a portion of the residue 20 may remain on the insulating interface layer 22. Since the surface portions of the conductive layer pattern 18 and the lower layer 12 may be covered with the insulating interface layer 22, the generation of defects including a leakage current generation due to the residue 20 may be prevented. Further, since the lower layer 12 and the residue 20 may be electrically separated by the insulating interface layer 22, the properties of the lower layer 12 may not change due to the residue 20.

Hereinafter, the gas phase cleaning process to remove the residue 20 from the substrate 10 including the conductive layer pattern 18 will be described in detail, with reference to FIGS. 2A to 2C.

Figure 2A:
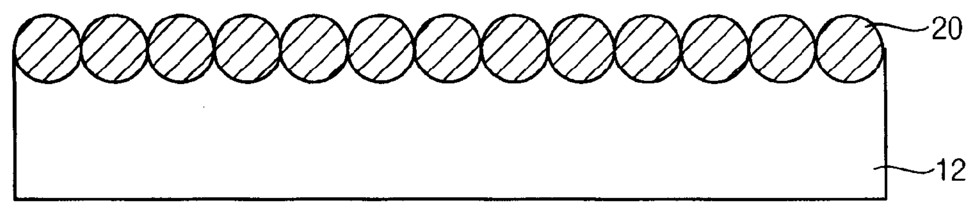
FIGS. 2A to 2C are schematic diagrams illustrating a method of selectively removing conductive residue in accordance with some example embodiments.
Figure 2B:
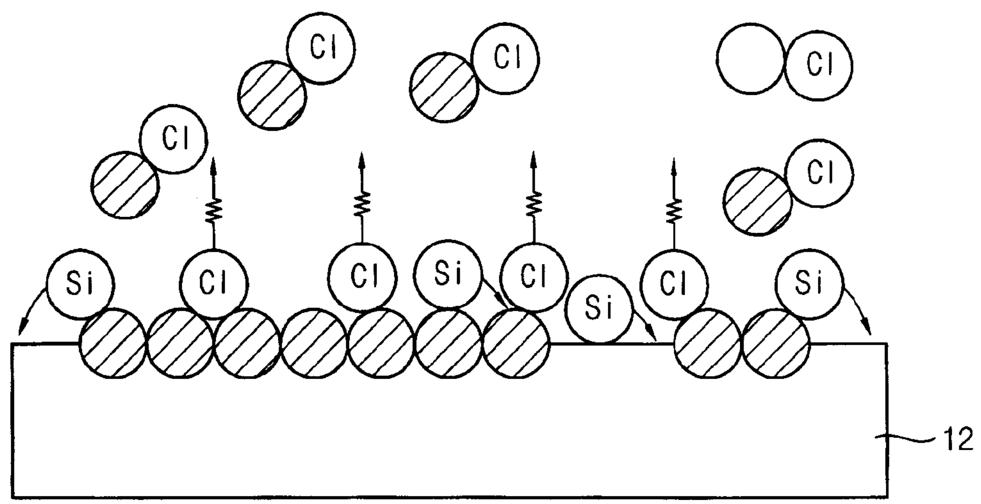
Figure 2C:
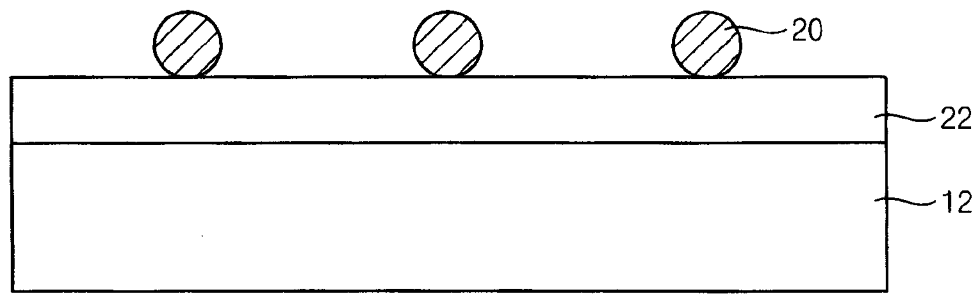

FIGS. 2A to 2C are schematic diagrams illustrating a method of selectively removing a conductive residue in accordance with some example embodiments. FIGS. 2A to 2C are schematic diagrams cut between the conductive layer patterns along an extended direction of the conductive layer pattern.

Referring to FIGS. 2A and 2B, the residue 20 generated while performing an etching process to form the conductive layer pattern 18 may become present on the lower layer 12 between the conductive layer patterns 18. The residue 20 may be removed by providing a cleaning gas to the lower layer 12 including the residue 20 thereon.

The cleaning gas may be a gas including an element to generate a volatile metal compound through a reaction with a metal or metal oxide contained in the residue 20. By contacting the residue with the cleaning gas, the metal component contained in the residue 20 may be volatilized and removed. In addition, the cleaning gas may include an element to generate a nonvolatile insulating material through a reaction with oxygen contained in the lower layer 12, in the mask pattern 16, in the residue, or with oxygen generated while performing the cleaning process. Examples of the elements that may react with the metal or the metal oxide contained in the residue 20 and produce a volatile metal compound include halogen elements including chlorine, fluorine, etc. Examples of elements that may react with oxygen to produce the nonvolatile insulating material include silicon.

The conductive layer pattern 18 may be required not to react with the cleaning gas while performing the gas phase cleaning process. That is, the conductive layer pattern 18 may be required to remain without undergoing deformation or removal while performing the gas phase cleaning process. In order to solve this problem, a cleaning gas reacting in a different manner with the conductive layer pattern 18 and the residue 20, respectively, may be used.

In some embodiments, the cleaning gas may include silane gas substituted with chlorine including $Si_xCl_y$ gas and $Si_xCl_yH_z$ gas. Particularly, the cleaning gas may include tetrachloro silane ($SiCl_4$), hexachloro silane ($Si_2Cl_6$), dichloro silane ($SiCl_2H_2$), trichloro silane ($SiCl_3H$), monochloro silane ($SiClH_3$), etc.

Referring to FIG. 2B, the chlorine element contained in the cleaning gas may react with the metal element contained in the residue 20 to generate the volatile metal compound such as a metal chloride. The metal compound generated through the contact of the residue 20 with the cleaning gas may be easily vaporized and removed through controlling a temperature of a chamber receiving the cleaning gas to be higher than an evaporation point of the volatile metal compound. Boiling points and melting points of some metal chlorides and some metal compounds are illustrated in Table 1.

TABLE 1

| Compound | Boiling point (° C.) | Melting point (° C.) |
|---|---|---|
| $WO_2$ | 1,730 | 1,500 |
| $WO_3$ | 1,837 | 1,470 |
| $WOCl_4$ | 227 | 211 |
| $WCl_5$ | 275 | 248 |
| $WCl_6$ | 347 | 275 |
| $WF_4$ | — | 800 |
| $WF_6$ | 17 | 2 |
| $WOF_4$ | 186 | 108 |
| $TiF_4$ | 284 | — |
| $TiCl_4$ | 58 | — |
| $TaCl_5$ | 233 | 210 |
| $Ta_2O_5$ | — | 1,880 |
| $PtCl_3$ | — | 400 |
| $PtCl_4$ | — | 370 |
| $SiF_4$ | −86 | −90 |
| $SiCl_4$ | 58 | −69 |
| $SiO_2$ | 2,590 | 1,710 |

Referring to Table 1, since metal oxides such as tungsten oxide and tantalum oxide have high boiling points and high melting points, these compounds may not be easily removed through a heat treatment but may remain on the substrate or a structure. In contrast, metal halogen compounds including $WOCl_4$, $WCl_5$, $WCl_6$, $TiCl_4$, $TaCl_5$, etc., have relatively low boiling points and may be easily vaporized or detached from an object through the heat treatment.

Other chlorine-based gases including $Cl_2$ and $BCl_3$, that may have a reactivity with the metal and generate the volatile compound may be used to remove the residue 20 as well as the $Si_xCl_y$-based gas. The chlorine-based gas including $Cl_2$ and $BCl_3$ may have relatively a high reactivity with the metal so that a concentration and an inflowing amount of the gas, a reacting temperature, etc., may be limited in order to decrease an etching degree or damaging with respect to the conductive layer pattern 18 including a metal. Examples of the cleaning gas may further include a fluorine-containing gas including $SiF_4$ and $SiF_6$. The fluorine-containing gas may also remove the residue 20 and may etch a silicon-containing layer including a silicon substrate, a polysilicon layer and a silicon oxide layer. Accordingly, an application of the fluorine-containing gas as the cleaning gas may be limited when the silicon-containing layer is exposed to the cleaning gas. When an aluminum oxide layer is exposed to the cleaning gas while performing the gas phase cleaning process, the fluorine-containing gas may produce aluminum fluoride ($AlF_3$) crystal of a perovskite structure to deteriorate characteristics of the aluminum oxide layer.

Since the silane gas substituted with chlorine may have a relatively low reactivity with the metal when comparing with other chlorine-based gas or the fluorine-containing gas, controlling of a reaction rate with the metal for a selective removal of the residue 20 may be advantageous. Only the residue 20 may be selectively removed while suppressing the damage and etching onto the conductive layer when the conductive layer is exposed to an environment.

Referring to FIG. 2C, the residue 20 may be removed through a reaction of the cleaning gas with the metal included in the residue 20 and a generation of a volatile metal compound. Other elements unreacted with the metal in the residue 20 and included in the cleaning gas may react with oxygen to produce the nonvolatile insulating interface layer 22. The unreactive elements may include silicon and the nonvolatile insulating interface layer 22 may be silicon oxide. Once the insulating interface layer 22 is formed, the metal material remaining in the metal residue 20 may be lifted up above the insulating interface layer 22 and a bonding state of the metal material to the insulating interface layer 22 may be weakened and the metal material may be removed. Thus formed insulating interface layer 22 may remain in an integrated state on the lower layer 12, the mask pattern 16, and the conductive layer pattern 18. In this case, the insulating interface layer 22 may form a capping state or layer of the conductive layer pattern 18, the mask pattern 16, and the lower layer 12.

In some embodiments, the cleaning gas may be provided at a temperature range of about 200° C. to about 1,000° C. In other embodiments, the cleaning gas may be provided at a temperature range of about 250° C. to about 800° C. Particularly, the cleaning gas may be provided at a temperature range of about 400° C. to about 700° C.

In some embodiments, when the conductive layer pattern 18 includes tungsten, the $Si_xCl_y$-based gas may be provided at a temperature of about 227° C. or higher. Since the evaporation point of $WOCl_4$ is about 227° C., the cleaning gas may be provided at a temperature higher than about 227° C. to vaporize and remove the tungsten residue as a $WOCl_4$ gaseous state. In some other embodiments, the cleaning gas may be provided at a temperature of about 295° C. or higher. The residue including tungsten oxide may make contact with $Si_xCl_y$ gas or $Si_xCl_yH_z$ gas to be vaporized as a $WOCl_4$ or $WO_2Cl_2$ gaseous state. The detaching temperature of $WOCl_4$ or $WO_2Cl_2$ gas from the insulating layer such as the aluminum oxide layer may be confirmed to be about 295° C. through a thermodynamic calculation. Accordingly, when the conductive layer 14 includes tungsten, the cleaning gas may be provided at a temperature range of about 295° C. or higher to effectively remove the tungsten residue.

In some embodiments, the cleaning gas may be provided in a vacuum atmosphere. Selectively, nitrogen gas, an inert gas including an argon gas, etc., may be provided along with the cleaning gas. Particularly, the cleaning gas may be provided under a pressure range of about 1 torr to about 100 torr with an inflowing amount of about 10 standard cubic centimeters per minute (sccm) to about 1,000 sccm. The volatile metal compound generated from the reaction of the cleaning gas and the residue 20 may be easily removed through a thermal desorption without other treatments such as a plasma application.

As described above, the residue 20 between the conductive layer patterns 18 may be removed through the gas phase cleaning process. Further, on the lower layer 12, the conductive layer pattern 18 and the mask pattern 16, the insulating interface layer 22 to form the capping state or layer may be formed.

When the residue including tungsten oxide is formed between tungsten patterns, the gas phase cleaning process using the $Si_xCl_y$-based gas may be performed to remove the residue while maintaining the tungsten pattern in accordance with some embodiments. Hereinafter, data concerning the gas phase cleaning with respect to the tungsten pattern may be illustrated.

Figure 3A:
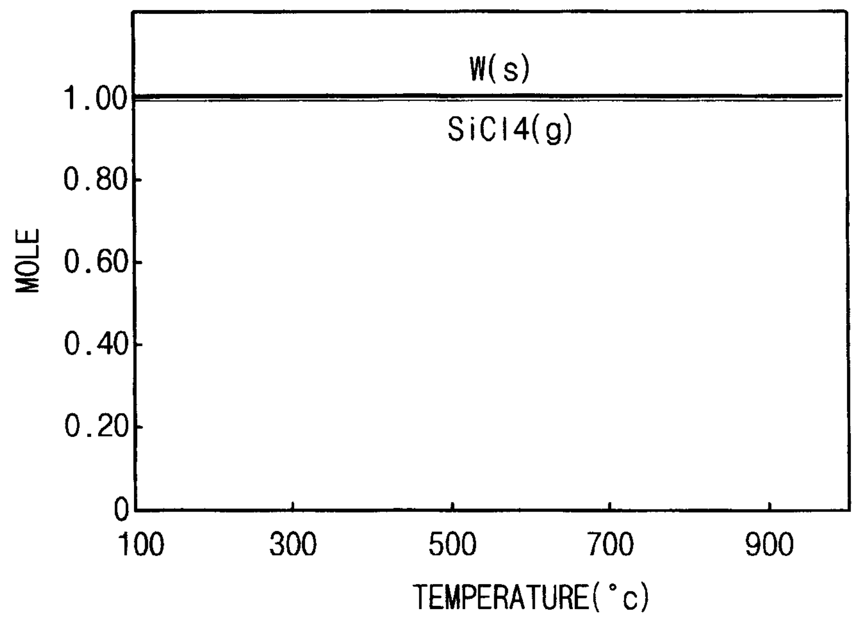
FIG. 3A is a schematic diagram illustrating a chemical reaction between $Si_xCl_y$-based gas and tungsten.
Figure 3B:
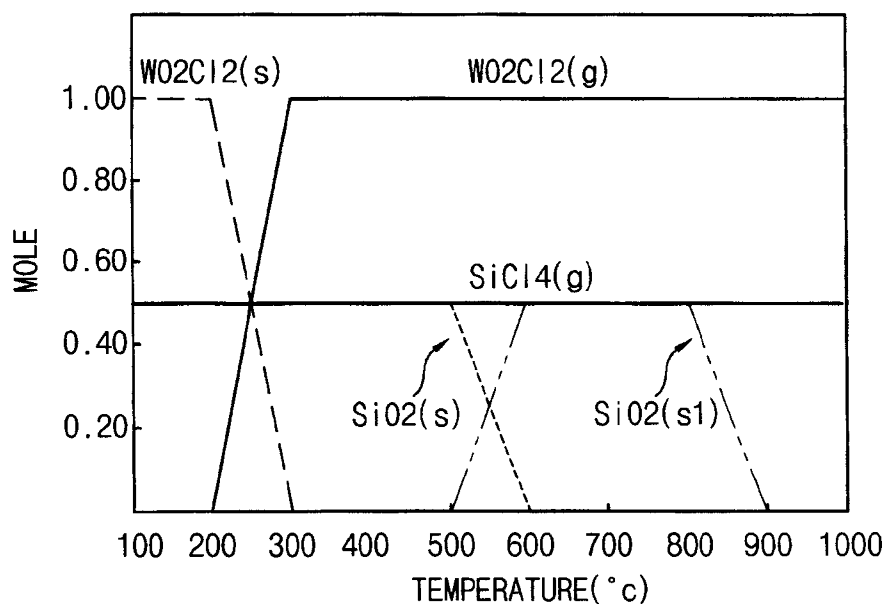
FIG. 3B is a schematic diagram illustrating a chemical reaction between $Si_xCl_y$-based gas and tungsten oxide.

FIG. 3A is a schematic diagram illustrating a chemical reaction between $Si_xCl_y$-based gas and tungsten. FIG. 3B is a schematic diagram illustrating a chemical reaction between $Si_xCl_y$-based gas and tungsten oxide.

Referring to FIG. 3A, both of the $Si_xCl_y$-based gas and tungsten are thermodynamically stable at a temperature of from about 100° C. to about 1,000° C. and no reaction occurs between them. Accordingly, tungsten provided to form the conductive layer pattern 18 may not be damaged but remain during the cleaning process using the $Si_xCl_y$-based gas as the cleaning gas.

Referring to FIG. 3B, when the $Si_xCl_y$-based gas and tungsten oxide react, $WO_2Cl_2$ gas and $SiCl_4$ gas may be generated to evaporate the tungsten oxide while silicon oxide ($SiO_2$) remains. Thus, the residue 20 of the conductive layer pattern 18 including tungsten may be evaporated by the $Si_xCl_y$-based gas. Therefore, the damage on the conductive layer pattern 18 may be prevented while removing the residue 20 generated at the conductive layer pattern 18 using the $Si_xCl_y$-based gas.

Figure 4:
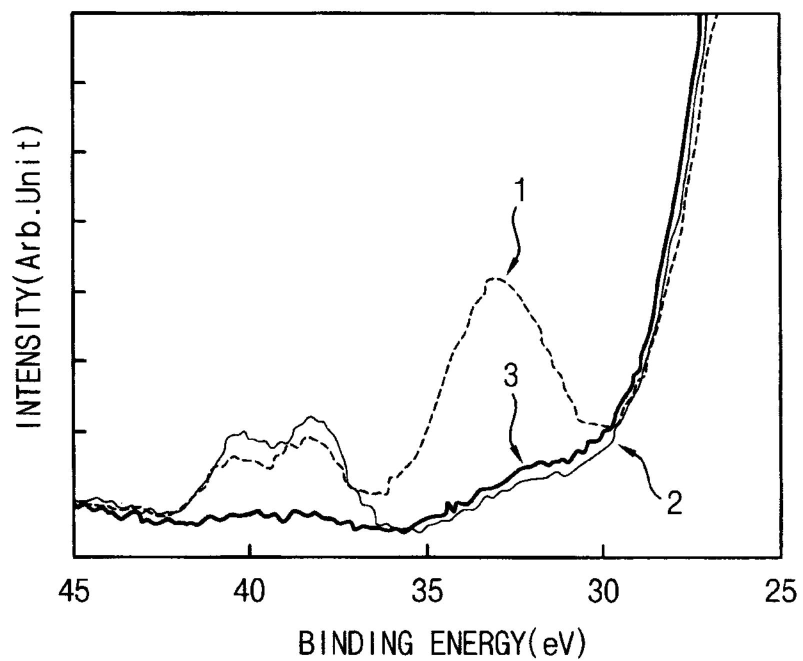

FIG. 4 is an X-ray photoelectron spectroscopy (XPS) spectrum illustrating an amount of a metal residue remaining on an aluminum oxide layer before and after performing a gas phase cleaning process in accordance with some example embodiments.

An amount of residual tungsten may be confirmed by measuring the XPS spectrum of an aluminum oxide layer positioned between neighboring tungsten patterns, before and after patterning a tungsten layer formed on the aluminum oxide layer through a dry etching process. Hexachloro disilane ($Si_2Cl_6$) was provided to a substrate including a tungsten pattern at a temperature of about 600° C. to perform a gas phase cleaning process. The amount of tungsten present on the aluminum oxide layer was measured by an XPS before and after the gas cleaning process.

In FIG. 4, graph "1" corresponds to an aluminum oxide layer prior to performing the gas phase cleaning process, graph "2" corresponds to an aluminum oxide layer after performing the gas phase cleaning process using hexachloro disilane ($Si_2Cl_6$) at a temperature of about 600° C. for about a first time period and graph "3" corresponds to an aluminum oxide layer after performing the gas phase cleaning process using hexachloro disilane ($Si_2Cl_6$) at a temperature of about 600° C. for about a second time period which is twice longer than the first time period.

Referring to FIG. 4, the size of tungsten (W) peak may be largely decreased after performing the gas phase cleaning process. Therefore, the residue of the tungsten oxide may react with $Si_xCl_y$ cleaning gas and may be easily desorbed from the aluminum oxide layer.

Figure 5:
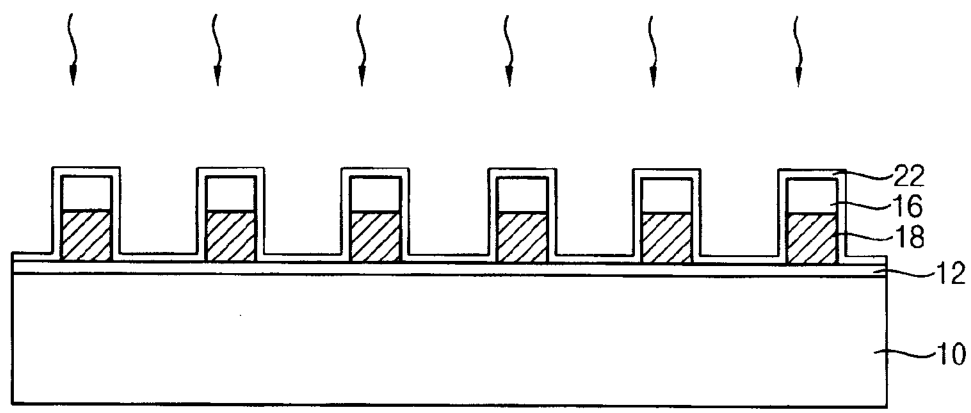
Figure 6:
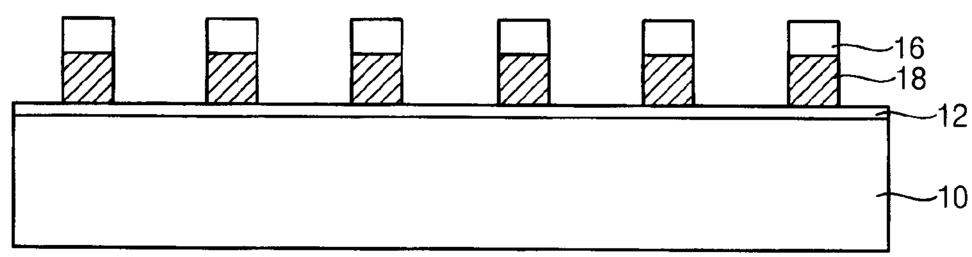

FIGS. 5 and 6 are cross-sectional views illustrating a method of forming a conductive layer pattern in accordance with some example embodiments.

A conductive layer pattern in accordance with some example embodiments may be formed through performing the processes explained referring to FIGS. 1A to 1C and then performing the following processes. Therefore, the same processes explained referring to FIGS. 1A to 1C may be performed and explanation thereof will be omitted. Then, a conductive layer pattern from which almost all of metallic residue has been removed may be formed. An insulating interface layer to form the capping state or layer may be formed on the conductive layer pattern, a hard mask pattern and a lower layer.

Referring to FIGS. 5 and 6, the insulating interface layer 22 may be removed. The insulating interface layer 22 to form the capping state or layer may be removed through a wet etching process. When the insulating interface layer 22 is removed through the wet etching process, a portion of the residue remaining on the insulating interface layer 22 may be completely lifted up and removed. Particularly, when the metallic residue remains on the insulating interface layer 22, the metallic residue may be completely removed from the conductive layer pattern 18 without damaging the conductive layer pattern 18. In some embodiments, both of the insulating interface layer 22 and the residue may be removed using a solution including hydrogen fluoride as illustrated in FIG. 6.

In some embodiments, a cleaning gas including chlorine atoms may be used to remove the residue. In this case, a portion of the chlorine atoms may remain on a surface portion of the insulating interface layer 22 or the lower layer 12. The chlorine atoms remaining on the lower layer 12 adjacent to the conductive layer pattern 18 and on the insulating interface layer 22 may increase a back tunneling through the lower layer 12. By performing the wet etching process, the insulating interface layer 22 and the surface portion of the lower layer 12 including a small amount of the chlorine atoms may be removed to prevent deterioration of a device due to the back tunneling.

Figure 7:
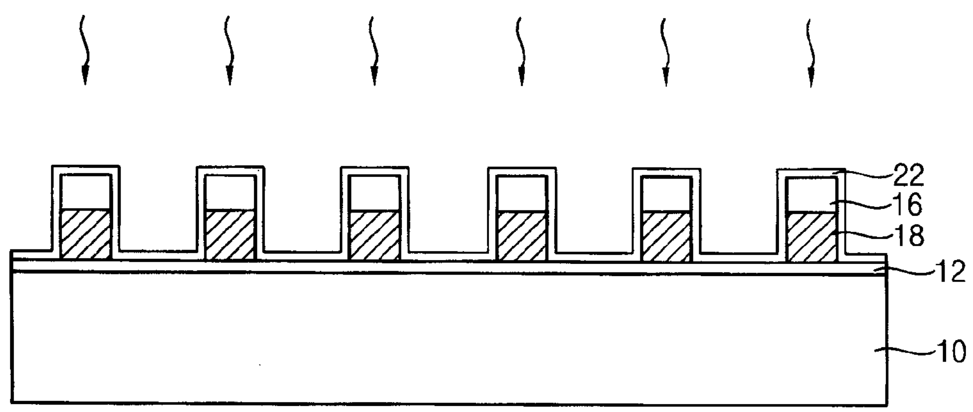

FIG. 7 is a cross-sectional view illustrating a method of forming a conductive layer pattern in accordance with some other example embodiments.

A conductive layer pattern in accordance with some example embodiments may be formed through performing the processes explained referring to FIGS. 1A to 1C and then performing the following processes. Therefore, the same processes explained referring to FIGS. 1A to 1C may be performed first and explanation thereof will be omitted. Then, a conductive layer pattern from which almost all of metallic residue has been removed may be formed. An insulating interface layer to form the capping state or layer may be formed on the conductive layer pattern, a hard mask pattern and a lower layer.

Referring to FIG. 7, a heat treatment may be performed to improve a side wall profile of the conductive layer pattern and to increase hardness of the conductive layer pattern. The heat treatment may be preferably performed at a temperature of about 500° C. or higher. The heat treatment may be performed separately after performing a gas phase cleaning process. Alternatively, the heat treatment may be performed while performing the gas phase cleaning process at an increased temperature of about 500° C. or higher simultaneously.

In some embodiments, a post treating process may be further performed after performing the heat treatment, to exhaust out remaining gas and to remove polymers remaining on the conductive layer pattern during and after the cleaning process. The post treating process may be performed using a diluted sulfate peroxide (DSP) solution including hydrogen sulfate, hydrogen peroxide and hydrogen fluoride for a time period of from a few seconds to several minutes.

After forming the conductive layer pattern through a dry etching process, the heat treatment may be performed to increase the hardness of the conductive layer pattern and to form the conductive layer pattern having a nearly vertical side wall profile.

The methods of forming the conductive layer pattern in accordance with the above described example embodiments may be applied to form a semiconductor device structure such as a gate electrode, a metal wiring, etc. In some embodiments, a gate insulating layer may be formed as the lower layer, the conductive layer pattern 18 may be formed and then, impurities may be doped into the substrate 10 near the conductive layer pattern 18 to form a source/drain region to manufacture a MOS transistor. Damage onto the conductive layer pattern 18 may be suppressed and the metallic residue present between the neighboring conductive layer patterns 18 may be selectively removed to suppress generation of a leakage current and a device defect.

FIGS. 8A to 8E are cross-sectional views illustrating a method of forming a conductive layer pattern in accordance with some other example embodiments.

Figure 8A:
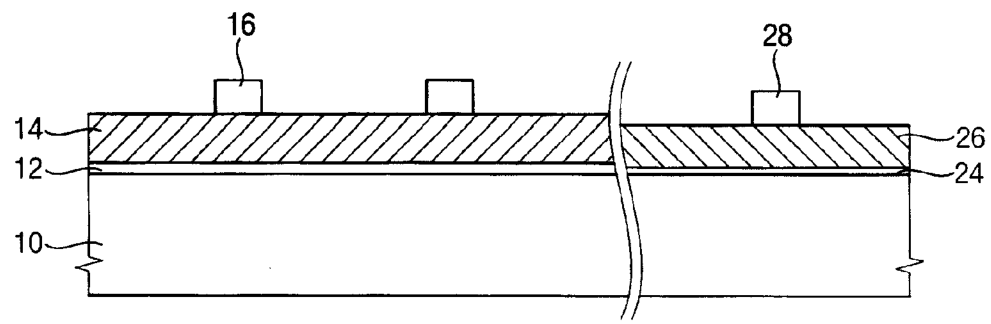
FIGS. 8A to 8E are cross-sectional views illustrating a method of forming a conductive layer pattern in accordance with some other example embodiments.

Referring to FIG. 8A, a substrate 10 may be separated into a first region and a second region. Particularly, the first region may be a cell forming region and the second region may be a peripheral circuit forming region. On the substrate 10 in the first region, a lower layer 12 and a conductive layer 14 such as a metal layer may be formed. On the substrate 10 in the second region, a gate insulating layer 24 and a polysilicon layer 26 may be formed.

In some embodiments, the gate insulating layer 24 and the polysilicon layer 26 may be formed on the substrate 10 in the first and second regions. Then, the gate insulating layer 24 and the polysilicon layer 26 formed on the substrate 10 in the first region may be removed. The lower layer 12 and the conductive layer 14 may be formed on the substrate 10 in the first region and on the polysilicon layer 26. The lower layer 12 may be formed using a material having an insulating property such as an insulating interlayer, an etch stopping layer, a dielectric layer, etc.

Prior to forming the lower layer 12, various structures including a device, a wiring, a pattern, a layer, a hole, a trench, etc., may be formed on the substrate 10.

The conductive layer 14 may be formed using a conductive material including a metal. Examples of the conductive material may include a material having a low electric resistance and include tungsten, tungsten nitride, titanium, titanium nitride, tantalum, tantalum nitride, platinum, etc. The lower layer 12 and the conductive layer 14 may be formed on the substrate 10 by using a layer depositing technique such as a chemical vapor deposition, a plasma enhanced chemical vapor deposition, an atomic layer deposition, a physical vapor deposition, etc. After that, the conductive layer 14 and the lower layer 12 formed on the polysilicon layer 26 may be removed.

The sequence of the deposition and the patterning of the conductive layer 14 and the polysilicon layer 26 may be exchanged.

First and second hard mask patterns 16 and 28 may be formed respectively on the polysilicon layer 26 and the conductive layer 14.

Figure 8B:
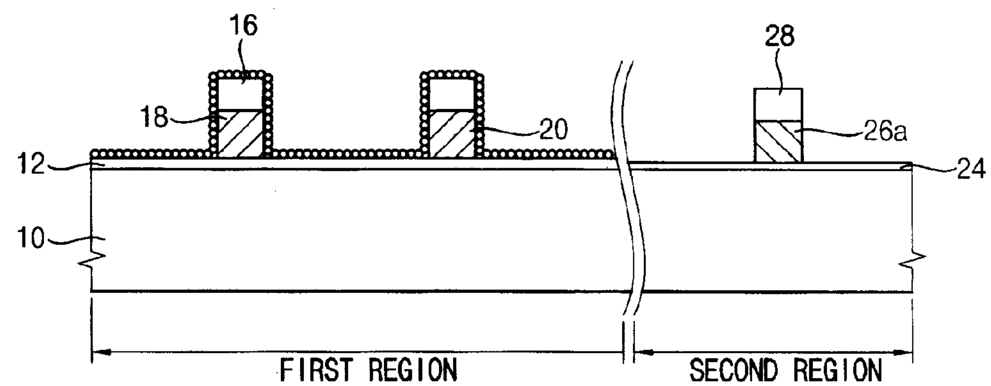

Referring to FIG. 8B, the polysilicon layer 26 may be etched using the second hard mask pattern 28 to form a gate electrode 26*a*. The conductive layer 14 may be etched using the first hard mask pattern 16 to form a conductive layer pattern 18.

Since the conductive layer 14 may include a metal, a metal oxide type residue 20 may remain after the conductive layer 14 is etched. Particularly, when the conductive layer 14 includes tungsten, the residue 20 may include tungsten oxide.

Figure 8C:
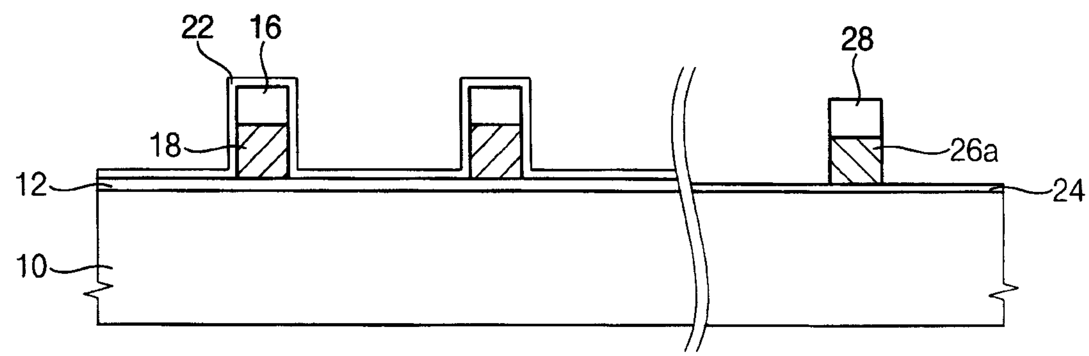

Referring to FIG. 8C, a gas phase cleaning process may be performed to remove the residue 20 remaining on the conductive layer pattern 18, the mask pattern 16 and the lower layer 12. The gas phase cleaning process may suppress the damage onto the conductive layer pattern 18, the mask pattern 16, and the lower layer 12 and may selectively remove the residue 20 from the substrate 10. The removing process of the residue may be performed in accordance with processes explained with reference to FIGS. 1C and 2A to 2C. The gas phase cleaning process to remove the residue may be performed in a batch type furnace equipment. The gas phase cleaning process may be performed at a temperature range of from about 500° C. to about 600° C.

After removing the residue, an insulating interface layer 22 may be formed on the conductive layer pattern 18, the mask pattern 16 and the substrate 10 in the first region. The insulating interface layer 22 may remain as illustrated in FIG. 8C. Alternatively, a removing process of the insulating interface layer 22 may be further performed.

After performing the gas phase cleaning process to remove the residue, a DSP cleaning process to remove remaining polymer on the conductive layer pattern 18 may be further performed in the batch type furnace equipment.

Figure 8D:
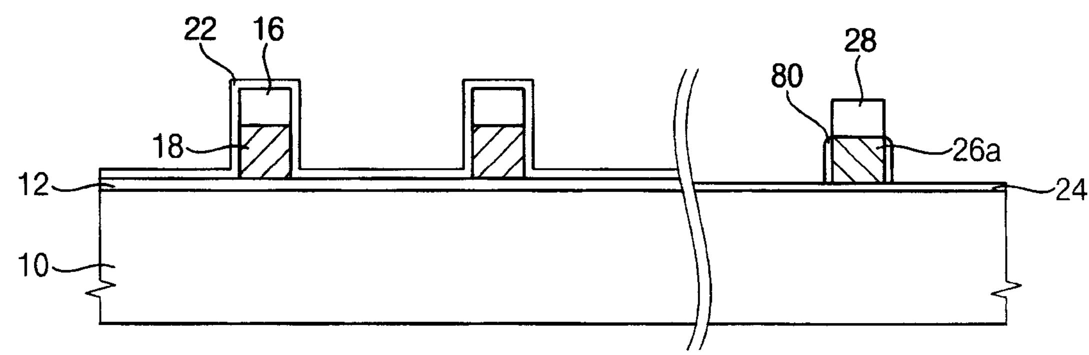

Referring to FIG. 8D, a selective oxidation process of side wall portions of the gate electrode 26*a* may be performed to form a spacer 80. Through the selective oxidation process, electric characteristics of a MOS transistor including the gate electrode 26*a* may be improved. While performing the selective oxidation process, oxidation of the conductive layer pattern 18 including the metal or electric characteristic change of the conductive layer pattern 18 may be prevented.

Through the selective oxidation, the metal material may not be oxidized but only polysilicon may be oxidized. To accomplish this requirement, the process temperature of the selective oxidation process may be from about 600° C. to about 700° C. and an oxidizing gas and a reducing gas may be applied at the same time. In some embodiments, oxygen gas and hydrogen gas may be applied during performing the selective oxidation process. Further, a partial pressure of hydrogen gas in a process chamber may be controlled while performing the oxidation process so that the conductive layer pattern 18 including the metal may not be oxidized.

The selective oxidation process may be performed along with the gas phase cleaning process in-situ within the batch type furnace equipment. That is, after performing the gas phase cleaning process, the selective oxidation process may be performed by changing only kinds of treating gas and pressure condition in a chamber without breaking vacuum.

Alternatively, the oxidation process of the sidewall portion of the gate electrode 26*a* may be performed before performing the gas phase cleaning process. That is, the gas phase cleaning process may be performed after performing the oxidizing process of the sidewall portion of the gate electrode 26*a*.

Figure 8E:
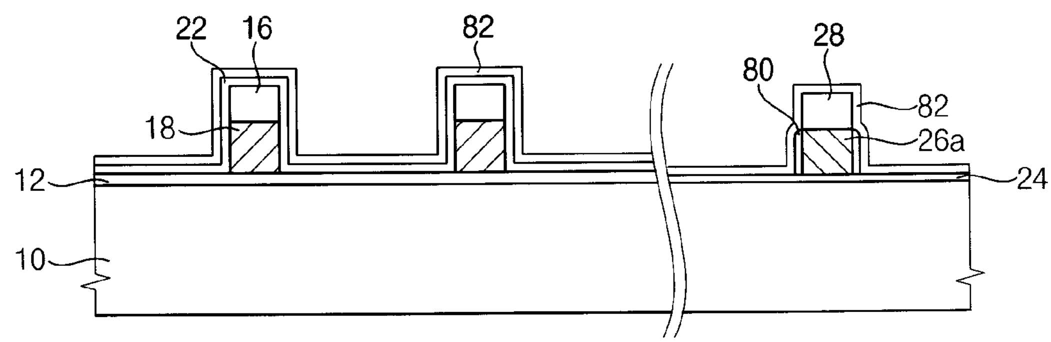

Referring to FIG. 8E, a silicon oxide layer 82 to form a capping state or layer may be formed on surface portions of the conductive layer pattern 18, the gate electrode 26*a*, the lower layer 12 and the gate insulating layer 24. The silicon oxide layer 82 to form a capping state or layer may be formed as a medium temperature oxide layer. The silicon oxide layer 82 to form a capping state or layer may be formed by providing chlorine substituted silane gas as a silicon source gas and then providing a mixture gas of an oxidizing gas used for the selective oxidation process or oxygen with hydrogen. In some embodiments, the silicon oxide layer 82 to form a capping state or layer may be performed at a temperature range of from about 600° C. to about 700° C.

The silicon oxide layer 82 to form a capping state or layer may be formed in-situ in the batch type furnace equipment in which the gas phase cleaning process may be performed. That is, the gas phase cleaning process, the selective oxidation process and the insulating layer forming process may be performed within the same equipment without transferring of the substrate 10. In this case, the gas phase cleaning process, the selective oxidation process and the insulating layer forming process may be performed by changing kinds of an applying gas and/or changing a processing temperature.

In accordance with above described process, a metal-containing conductive layer pattern without residue may be formed in the first region of the substrate. The conductive layer pattern having a low resistance, generating little leakage current and having a good sidewall profile may be formed. In the second region of the substrate, a gate pattern may be formed using polysilicon. A selective oxidation process may be performed to form an oxide layer with respect to the gate pattern in the second region to further improve characteristics of a MOS transistor.

Figure 9:
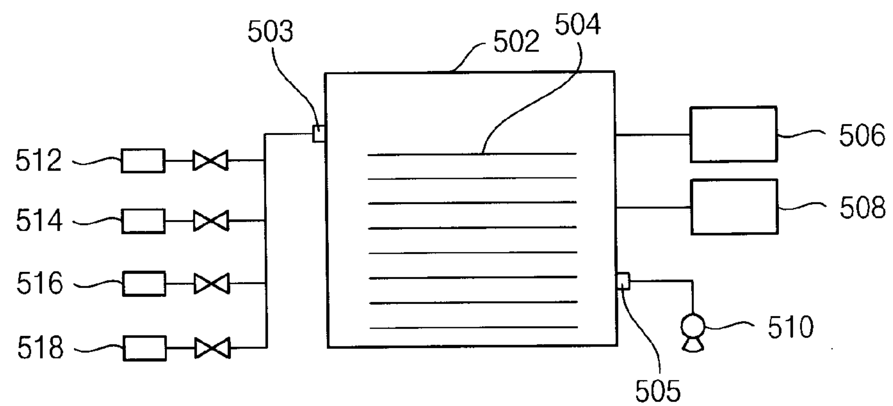

FIG. 9 is a cross-sectional view illustrating equipment to perform a gas phase cleaning process while forming a conductive layer pattern in accordance with some example embodiments.

Referring to FIG. 9, gas phase cleaning equipment 500 may include a chamber 502 to receive a substrate 504, first to fourth gas supplying members 512, 514, 516 and 518 to supply gases into the chamber 502, a temperature controlling member 506 to control the temperature of the chamber 502, a pressure measuring member 508 to measure a pressure of the chamber 502 and a gas exhausting member 510 to exhaust out a gas.

The chamber 502 may receive one or more substrates 504 and the size of the substrate 504 may vary without limitation. The chamber 502 may be provided with a gas inlet 503 to receive gases from the first to fourth gas supplying members 512, 514, 516 and 518 and a gas outlet 505 connected to the gas inlet 503. The gas inlet 503 and gas supplying members 512, 514, 516 and 518, and the gas outlet 505 and gas exhausting member 510 may be provided at any position of the chamber 502 including a front or rear portion, an upper or lower portion or a left or right portion, and so on without a specific limitation.

The first to fourth gas supplying members 512, 514, 516 and 518 to supply gases may be connected to the chamber 502 via the gas exhausting member 510. The first to fourth gas supplying members 512, 514, 516 and 518 may include respective gases storing containers, respective valves to control an inflowing amount of different gases and respective supplying pipes to connect the respective gas storing containers with the gas inlet 503 of the chamber 502.

In some embodiments, the first gas supplying member 512 may supply a gas containing an element to react with a metal material to produce a volatile metal compound and silicon. Particularly, the first gas supplying member 512 may supply a silane gas substituted with chlorine including $Si_xCl_y$ and $Si_xCl_yH_z$. The second gas supplying member 514 may supply an oxidizing gas including oxygen, water vapor, ozone, etc. The third gas supplying member 516 may supply a reducing gas including hydrogen. The fourth gas supplying member 518 may supply nitrogen, or an inert gas including argon, etc.

The temperature of the chamber 502 may be controlled by means of the temperature controlling member 506. Particularly, a thermocouple may be provided onto the inner wall of the chamber 502 and power may be applied to the thermocouple to control the temperature of the chamber 502. The pressure exerted by the gases in the chamber 502 may be measured using the pressure measuring member 508 such as a pressure gauge, connected to the chamber 502. Through the gas exhausting member 510, gas in the chamber 502 may be exhausted out. The gas exhausting member 510 may be connected with the gas outlet 505 of the chamber 502 and may further include a pressure controlling member such as a pump.

In some embodiments, the gas phase cleaning equipment 500 may be used to manufacture a semiconductor device including the gas phase cleaning process described herein to remove residual impurities remaining on a conductive layer pattern, a selective oxidation process of a surface portion of the exposed polysilicon layer and/or a forming process of a silicon oxide-based insulating layer on the substrate. Particularly, the above-described processes may be performed in-situ using the gas phase cleaning equipment 500.

Figure 10A:
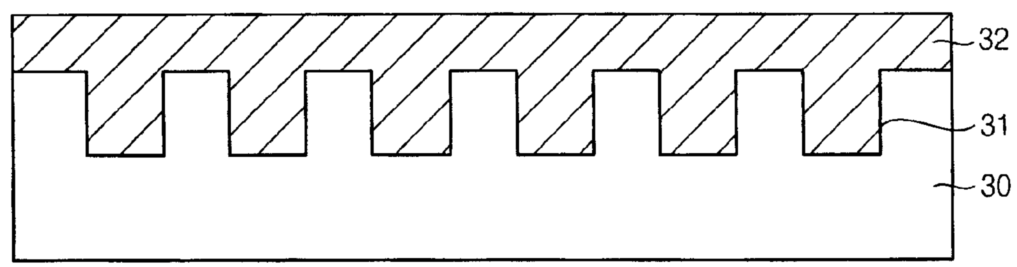
FIGS. 10A to 10C are cross-sectional views illustrating a method of forming a conductive layer pattern in accordance with some other example embodiments.
Figure 10B:
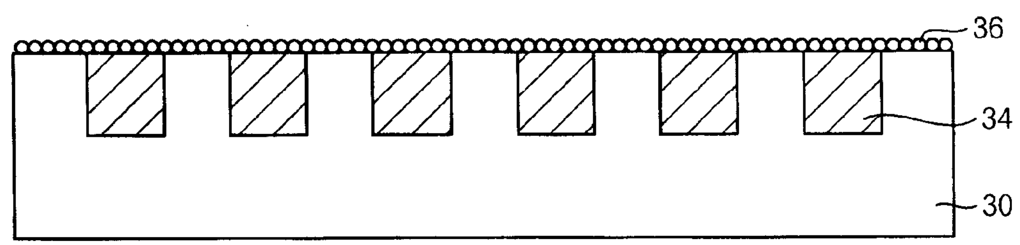
Figure 10C:
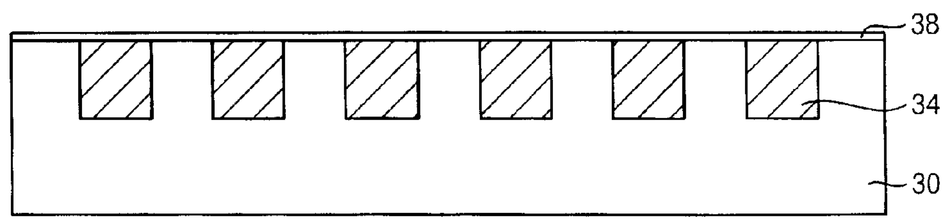

FIGS. 10A to 10C are cross-sectional views illustrating a method of forming a conductive layer pattern in accordance with some example embodiments.

Referring to FIG. 10A, on an insulating layer 30 including a recess 31, a conductive layer 32 filling up the recess 31 may be formed. A conductive material may be deposited onto the insulating layer 30 so that the recess 31 may be sufficiently filled up with the conductive material while forming the conductive layer 32. The insulating layer 30 may include an insulating material and may be silicon oxide, silicon oxynitride, silicon nitride, metal oxide, etc. The conductive layer 32 may be formed using a conductive material containing one of a metal among tungsten, tungsten nitride, titanium, titanium nitride, tantalum, tantalum nitride, platinum, etc.

A plurality of recesses 31 may be formed on and in the insulating layer 30. In some embodiments, the plurality of recesses 31 may be arranged in parallel in an extended direction or a horizontal direction of the substrate including the insulating layer 30 in which they are formed. In this case, the insulating layer 30 may be formed on a substrate and then, a portion of the insulating layer 30 may be partially removed by means of a photo-lithography process using a photoresist to form the recesses 31. In some other embodiments, the plurality of recesses 31 may be arranged in a perpendicular direction with respect to the extended direction of the substrate including the insulating layer 30. In this case, the insulating layer 30 and a sacrificial layer may be formed alternately and an opening may be formed in the insulating layer 30 and the sacrificial layer. The exposed portion of the sacrificial layer through the opening may be selectively etched to form a recess in the insulating layer 30. The sacrificial layer may be formed using a material having an etching selectivity with respect to the insulating layer 30.

Referring to FIG. 10B, the upper portion of the conductive layer 32 positioned on the insulating layer 30 may be removed to form a conductive layer pattern 34 partially or completely filling up the recess 31. Removal of a portion of the conductive layer 32 may be performed by a planarization process such as a chemical mechanical polishing, a wet etching process and/or a dry etching process. The conductive layer patterns 34 filling up the plurality of the recesses 31 may be separated by the insulating layer 30. However, when residue 36 is generated while etching or polishing of the conductive layer 32, a current leakage may be generated between the conductive layer patterns 34 by the residue 36.

Referring to FIGS. 10B and 10C, the residue 36 present at the insulating layer 30 and the conductive layer pattern 34 may be removed by performing a gas phase cleaning process. As explained referring to FIGS. 2A to 2C, the gas phase cleaning process may be performed by providing a cleaning gas that may react with the residue 36 and may produce a volatile compound at an evaporation point or higher of the volatile compound. When the cleaning gas also includes an element to produce a nonvolatile insulating material, an insulating interface layer 38 may be formed on the insulating layer 30 and the conductive layer pattern 34.

Hereinafter, methods of manufacturing a semiconductor device using the above-described gas phase cleaning process will be described in detail.

Figure 11A:
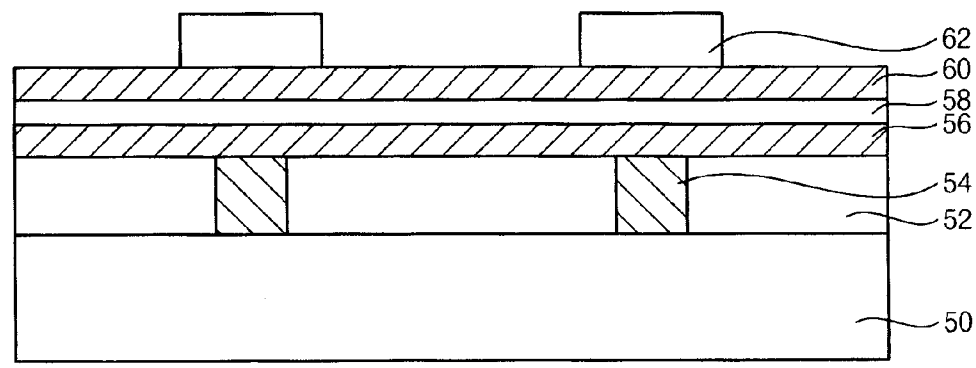
FIGS. 11A to 11C are cross-sectional views illustrating a method of forming a capacitor by applying a method of forming a conductive layer in accordance with some example embodiments.
Figure 11B:
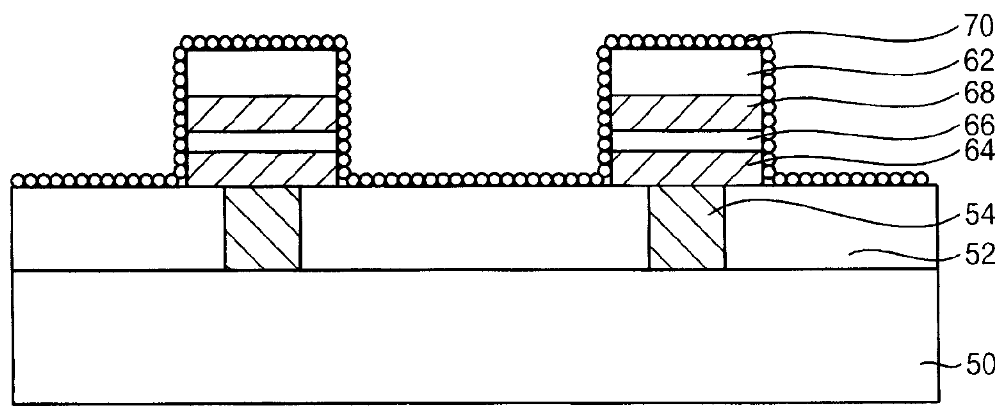
Figure 11C:
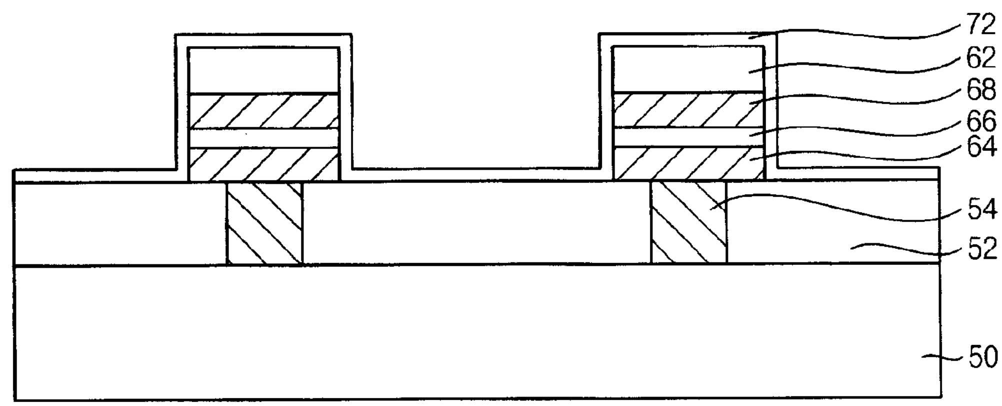

FIGS. 11A to 11C are cross-sectional views illustrating a method of forming a capacitor by applying a method of forming a conductive layer pattern in accordance with some example embodiments.

Referring to FIG. 11A, an insulating layer 52 including a conductive pad 54 may be formed on a substrate 50. A portion of the insulating layer 52 formed on the substrate 50 may be partially removed to form an opening portion. A conductive material such as polysilicon or a metal may be deposited to fill up the opening portion to form the pad 54.

A first conductive layer 56, a dielectric layer 58 and a second conductive layer 60 may be formed sequentially on the insulating layer 52 and the pad 54. The first conductive layer 56 and the second conductive layer 60 may be respectively used as a lower electrode and an upper electrode of a capacitor. The first conductive layer 56 and/or the second conductive layer 60 may be formed using a conductive material containing a metal. In some embodiments, the first conductive layer 56 and/or the second conductive layer 60 independently may be formed using a conductive material including tungsten, tungsten nitride, titanium, titanium nitride, tantalum, tantalum nitride, platinum, etc. On the second conductive layer 60, a mask pattern 62 partially exposing the second conductive layer 60 may be formed. The mask pattern 62 may be formed using an organic and/or inorganic mask material.

Referring to FIG. 11B, an etching process using the mask pattern 62 may be performed to sequentially pattern the second conductive layer 60, the dielectric layer 58 and the first conductive layer 56. After performing the etching process, a first conductive layer pattern 64, a dielectric layer pattern 66 and a second conductive layer pattern 56 may be sequentially formed on the pad 54. On the first conductive layer pattern 64, the dielectric layer pattern 66, the second conductive layer pattern 68 and the insulating layer 52, residue 70 may remain after performing the etching process. The residue 70 may include a metallic residue that may be originated from the first conductive layer 56 and/or the second conductive layer 60. Also, the residue 70 may induce a device defect.

Referring to FIG. 11C, a gas phase cleaning process may be performed to remove the residue 70 remaining on the insulating layer 52 and the first and second conductive layer patterns 64 and 68. As explained referring to FIGS. 2A to 2C, the gas phase cleaning process may be performed by providing a cleaning gas to react with the residue 70 and produce a volatile compound at an evaporation point or higher of the volatile compound. When the cleaning gas includes an element to produce a nonvolatile insulating material, an insulating interface layer 72 may be formed on the insulating layer 52, the first and second conductive layer patterns 64 and 68 and the mask pattern 62. A capacitor may include the first conductive layer pattern 64, the dielectric layer pattern 66 and the second conductive layer pattern 68 formed by applying the above-described gas phase cleaning process. By using the gas cleaning process described herein, the residue 70 that may generate degrees of electric shorts and/or a leakage current between neighboring capacitors may be decreased and reliability of semiconductor devices may be improved.

In accordance with the method of forming the capacitor referring to FIGS. 11A to 11C, the first conductive layer pattern 56 and the second conductive layer pattern 60 may be formed and the residue 70 remaining on the structures of the first and second conductive layer patterns 56 and 60 may be removed by means of the gas phase removing process. Further, the gas phase cleaning process in accordance with some example embodiments may be applied to remove the residue generated while etching the first conductive layer pattern 56 and the second conductive layer pattern 60, separately.

Figure 12:
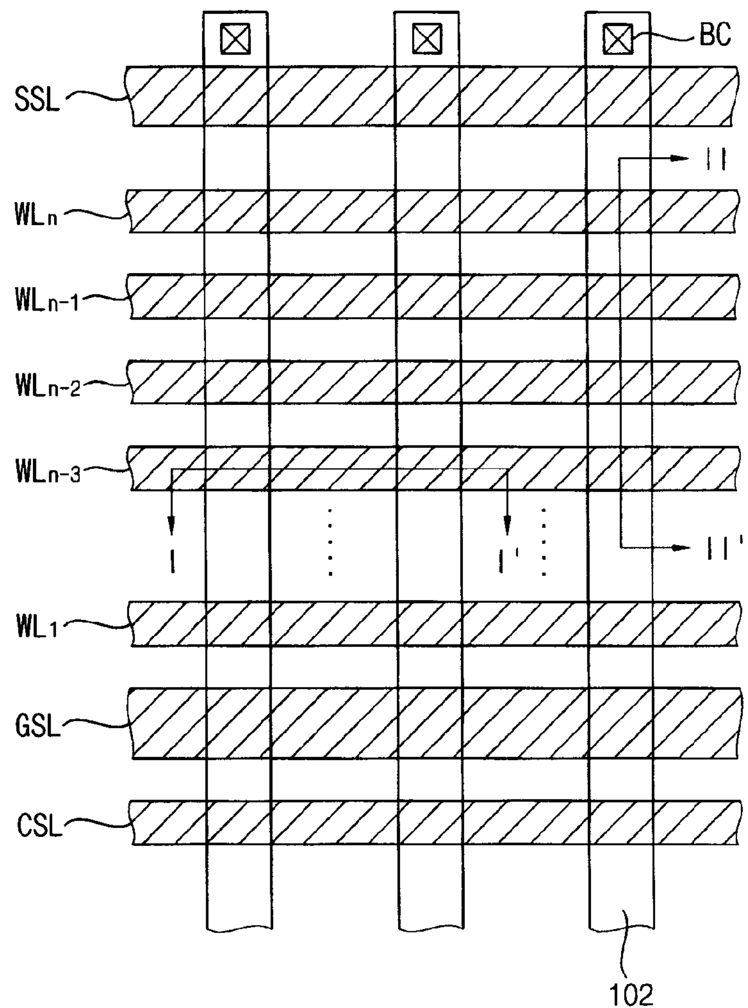
Figure 12:
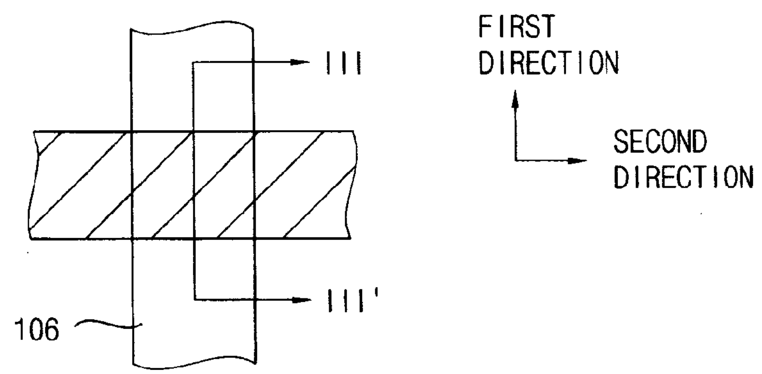

FIG. 12 is a plan view illustrating a method of manufacturing a nonvolatile memory device in accordance with some example embodiments. FIGS. 13A to 13F are cross-sectional views illustrating a method of manufacturing a nonvolatile memory device in accordance with some example embodiments and illustrates cross-sectional views cut along a line I-I', a line II-II' and a line III-III' in FIG. 12.

Referring to FIG. 12, a nonvolatile memory device may be formed on a substrate 100 including a cell region and a peripheral circuit region in accordance with some embodiments. In the cell region, an active region 102 extended in a first direction, n numbers of word lines WL1~WLn extended in a second direction perpendicular to the first direction, a source selecting line SSL, a ground selecting line GSL and a common source line CSL may be formed. In the peripheral circuit region, a gate structure crossing the active region 106 of a peripheral circuit may be formed.

Figure 13A:
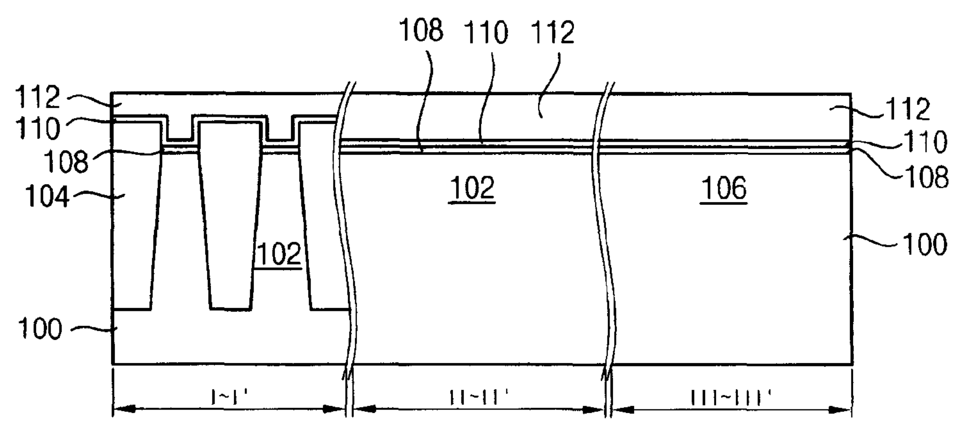
FIGS. 13A to 13F are cross-sectional views illustrating a method of manufacturing a nonvolatile memory device illustrated in FIG. 12 in accordance with some example embodiments.

Referring to FIG. 13A, an active region 102 of a cell may be defined in a cell region of a substrate 100 by a device isolation layer 104. A first mask pattern extended in a first direction may be formed on the substrate 100. The exposed portion of the substrate 100 by the first mask pattern may be etched to form a trench. The trench may be filled up with an insulating material to form the device isolation layer 104. In some embodiments, an insulating material may fill up the trench to an upper surface portion of the first mask pattern and then, the first mask pattern may be removed to form the device isolation layer 104 having a protruded upper surface higher than the upper surface of the substrate 100. In the peripheral circuit region, an active region 106 of a peripheral circuit may be defined by a device isolation layer (not illustrated).

On the substrate 100 including the defined active regions 102 and 106, a tunnel insulating layer 108, a charge trapping layer 110 and a sacrificial layer 112 may be formed. The tunnel insulating layer 108 may be formed using silicon oxide, silicon oxynitride and/or metal oxide. When the tunnel insulating layer 108 includes a silicon oxide-based insulating material, the tunnel insulating layer 108 may be formed by thermally oxidizing the exposed portion of the substrate 100.

The charge trapping layer 110 may be a non-conducting charge storing layer. The charge trapping layer 110 may include an insulating material having a high trap density with respect to charge. Examples of such an insulating material include silicon nitride, aluminum oxide, hafnium oxide, zirconium oxide, tantalum oxide, hafnium aluminum oxide, hafnium silicon oxide, lanthanum hafnium oxide, lanthanum aluminum oxide, hafnium oxynitride, zirconium oxynitride, hafnium silicon oxynitride, hafnium aluminum oxynitride, etc. Further, the insulating material may include a nanocrystal or a quantum dot. The sacrificial layer 112 may be formed using an insulating material.

Figure 13B:
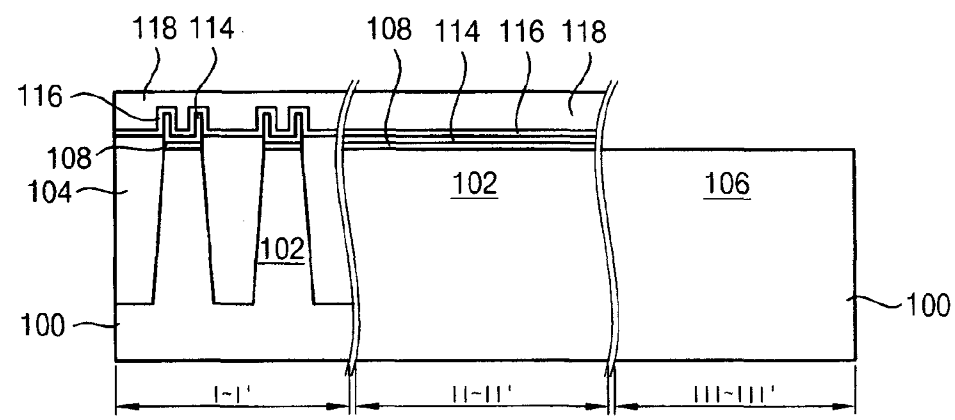

Referring to FIG. 13B, the removal of the sacrificial layer 112 and an upper portion of the charge trapping layer 110 may be performed until the charge trapping layer 110 provided on the device isolation layer 104 is removed. Then, a charge trapping layer pattern 114 extended in a first direction may be formed on the active region 102. A portion of the sacrificial layer 112 and the device isolation layer 104 may be removed.

On the substrate 100 including the charge trapping layer pattern 114, a blocking dielectric layer 116 may be formed. The blocking dielectric layer 116 may be formed using a material having a high dielectric constant. Examples of the material having the high dielectric constant may include aluminum oxide, oxide/nitride/oxide (ONO), lanthanum hafnium oxide, lanthanum aluminum oxide, dysprosium scandium, etc. The blocking dielectric layer 116 may further include a barrier layer on and/or under thereof such as a silicon oxide layer to prevent a leakage current.

In some embodiments, charge trapping layers in a cell region may be formed in a connected state to each other different from the structure illustrated in FIG. 13B. In such a case, a tunnel insulating layer, a charge trapping layer and a blocking dielectric layer may be sequentially formed on a substrate including a device isolation layer formed thereon.

A first mask layer 118 covering the cell region and exposing the peripheral circuit region may be formed. From the peripheral circuit region exposed by the first mask layer 118, the blocking dielectric layer 116, the charge trapping layer 110 and the tunnel insulating layer 108 may be removed. The cell region may be protected by the first mask layer 118 while removing the layers in the peripheral circuit region. After removing the layers in the peripheral circuit region, the first mask layer 118 in the cell region may be removed.

Figure 13C:
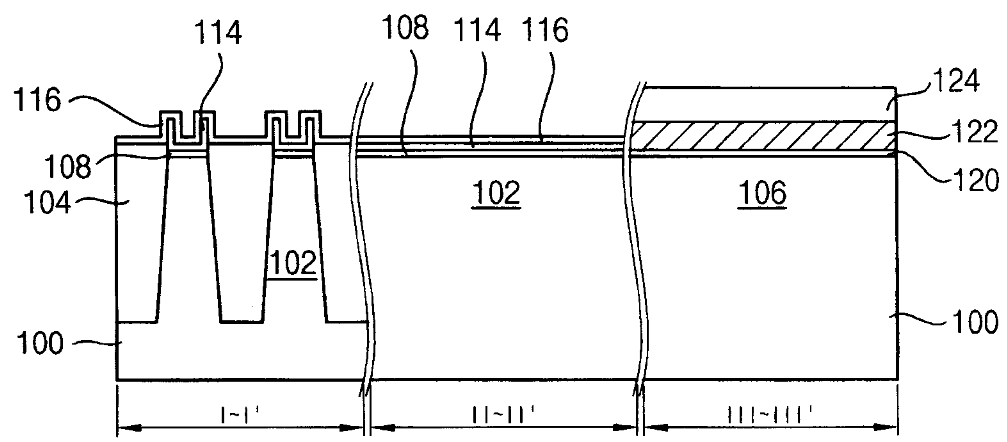

Referring to FIG. 13C, a gate insulating layer 120 and a first conductive layer 122 may be formed on the substrate 100 in the cell region and the peripheral circuit region. The gate insulating layer 120 may be formed using silicon oxide, silicon oxynitride, silicon nitride and/or metal oxide. In the peripheral region, the gate insulating layer 120 may be formed on the exposed substrate 100. The first conductive layer 122 may be formed using conductive polysilicon.

After forming the gate insulating layer 120 and the first conductive layer 122, a second mask layer 124 covering the peripheral circuit region while exposing the cell region may be formed. From the cell region exposed by the second mask layer 124, the first conductive layer 122 and the gate insulating layer 120 may be removed. After removing the first conductive layer 122 and the gate insulating layer 120 provided in the cell region, the second mask layer 124 in the peripheral circuit region may be removed.

Figure 13D:
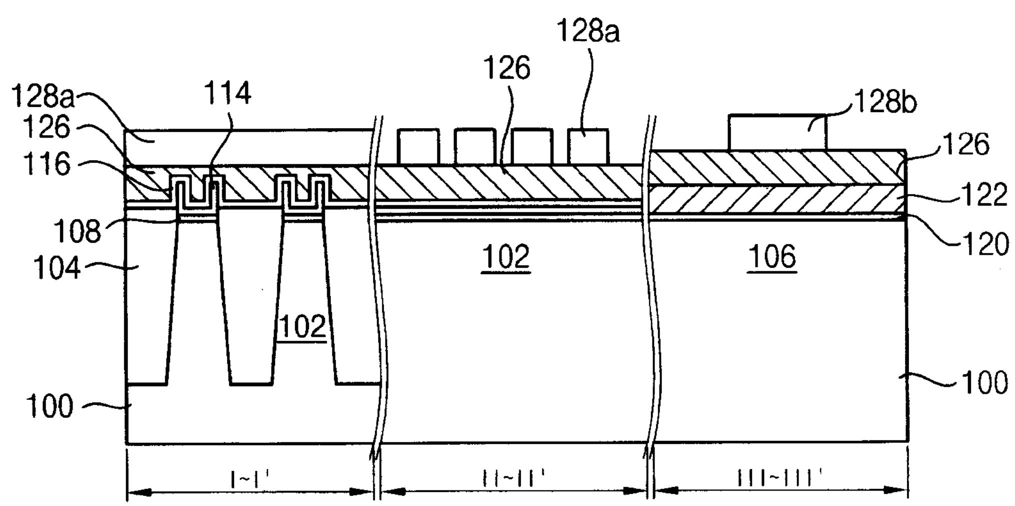

Referring to FIG. 13D, a second conductive layer 126 may be formed in the cell region and in the peripheral circuit region. In the cell region, the second conductive layer 126 may be formed on the blocking dielectric layer 116, and in the peripheral circuit region, the second conductive layer 126 may be formed on the first conductive layer 122. The second conductive layer 126 may be formed using a conductive material containing a metal. The conductive material may have a low electric resistance. Examples of the conductive material may include tungsten, tungsten nitride, tungsten silicide, titanium, titanium nitride, tantalum titanium alloy, tantalum, tantalum nitride, tantalum oxynitride, tantalum silicon nitride, tantalum carbooxynitride, platinum, etc. The second conductive layer 126 may be a single layer of the above exemplified materials or a multi-layer of two or more of the materials. Particularly, the second conductive layer 126 may include a first thin film of tungsten nitride and a second thin film of tungsten.

In the cell region and the peripheral circuit region, second mask patterns 128*a* and 128*b* may be formed on the second conductive layer 126. The second mask pattern 128*a* in the cell region may be an extended pattern along a second direction perpendicular to an extended direction of the active region 102. The second mask patterns 128*a* and 128*b* may be formed using a material having an etching selectivity with respect to the second conductive layer 126. Particularly, the second mask patterns 128*a* and 128*b* may be formed using an inorganic mask material including silicon oxide, silicon oxynitride, silicon nitride, etc.

Figure 13E:
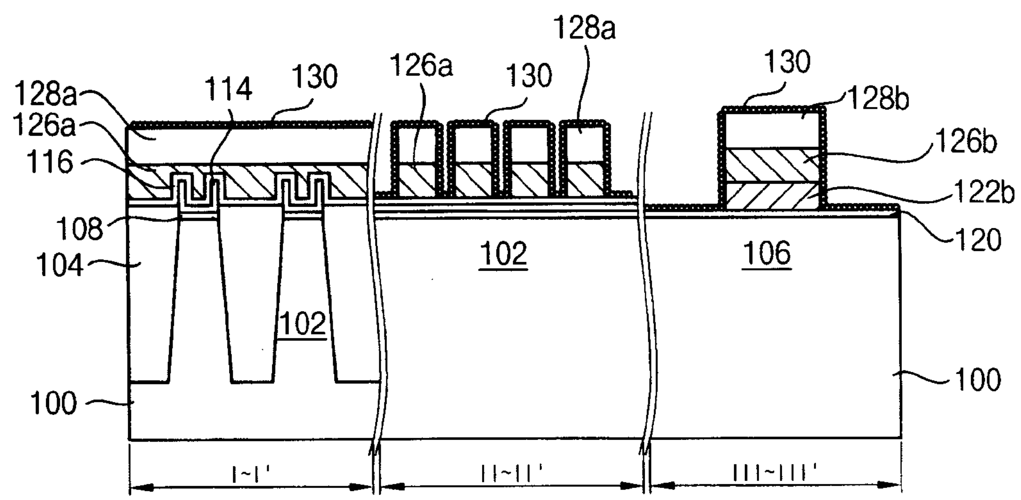

Referring to FIGS. 13D and 13E, the second conductive layer 126 provided in the cell region and the peripheral circuit region may be patterned using the second mask patterns 128*a* and 128*b* as etching masks. Through partially etching the second conductive layer 126, second conductive layer patterns 126*a* and 126*b* may be formed in the cell region and the peripheral circuit region, respectively. The patterning of the second conductive layer 126 may be performed by a dry etching and/or a wet etching process. Further, an etching process may be performed with respect to the first conductive layer 122 in the peripheral circuit region using a material capable of performing a selective etching to form a first conductive layer pattern 122*b*.

While performing the etching process of the second conductive layer 126, residue 130 originated from the material constituting the second conductive layer 126 may remain. The residue 130 may be a conductive material of a metal oxide type. In some embodiments, the second conductive layer 126 may include tungsten and the residue 130 may be tungsten oxide. The residue 130 may be oxidized by oxygen contained in the blocking dielectric layer 116 or the second mask patterns 128*a* and 128*b* or by oxygen remaining in the chamber during the etching process and may be present as a metal oxide type.

Problems may also arise when metallic residue 130 is present between the neighboring patterns of the second conductive layer pattern 126*a*, a leakage current may be generated through the residue 130. Particularly, when different voltages are applied to two neighboring second conductive layer patterns 126*a*, a leakage current may be generated between the second conductive layer patterns 126*a* through the residue 130 having a conductivity, thereby generating an operating defect or deficiency of a semiconductor device.

Figure 13F:
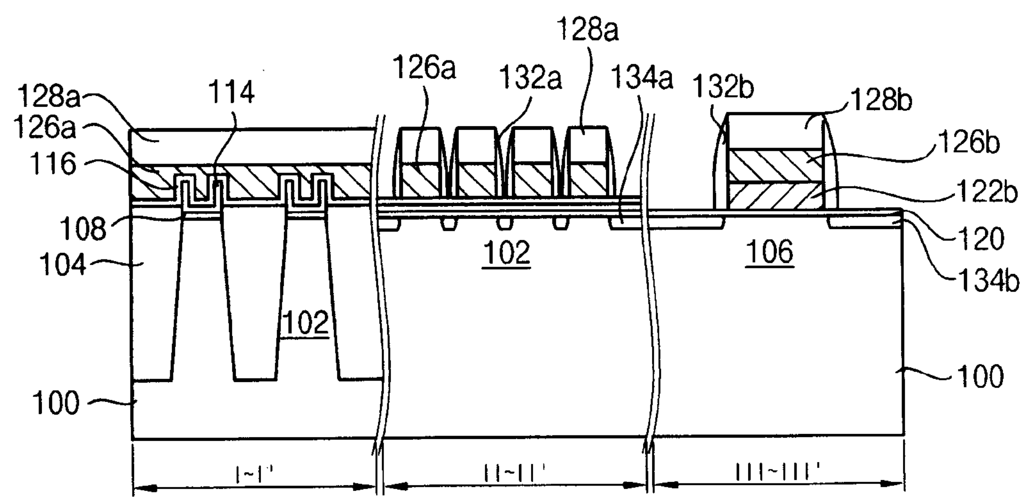

Referring to FIG. 13F, a cleaning process using a cleaning gas at a high temperature may be performed to remove the remaining residue 130 on the second conductive layer patterns 126*a* and 126*b*, the mask patterns 128*a* and 128*b* and the blocking dielectric layer 116. The gas phase cleaning process may be performed using a cleaning gas containing an element capable of reacting with a metal element of a metal oxide included in the residue 130 and producing a volatile metal compound. The cleaning gas may include an element capable of reacting with oxygen included in the blocking dielectric layer 116, the second mask patterns 128*a* and 128*b* or the residue 130 or with oxygen generated while performing the process to produce a nonvolatile insulating material. The cleaning gas may be applied at a temperature higher than the evaporation point of the volatile metal compound to remove the residue 130. The explanation on the gas phase cleaning process may be substantially the same as the explanation referring to FIGS. 2A to 2C.

In some embodiments, the gas phase cleaning process may be performed using $Si_xCl_y$-based gas including tetrachloro silane ($SiCl_4$), hexachloro disilane ($Si_2Cl_6$), dichloro silane ($SiCl_2H_2$), trichlorosilane ($SiCl_3H$), monochloro silane ($SiClH_3$), etc. The $Si_xCl_y$-based gas may have a not much rapid etching rate with respect to the conductive layer including the metal. Accordingly, control of the reaction rate of the $Si_xCl_y$-based gas with the residue 130 may be an easy task. Further, the $Si_xCl_y$-based gas may selectively remove the residue 130 while suppressing damage of the second conductive layer patterns 126*a* and 126*b*. The gas phase cleaning process may be performed at a temperature range of from about 250° C. to about 800° C.

Particularly, through removing the residue 130 from the blocking dielectric layer 116 provided between the second conductive layer patterns 126*a* and 126*b* neighboring the sidewall of the second conductive layer patterns 126*a* and 126*b*, the generation of the leakage current due to the residue 130 may be suppressed. In order to increase an integration degree of a device, a distance between the second conductive layer patterns 126*a* may be decreased to a critical value or less or an operating voltage may be lowered. Then, the effect of the leakage current due to the residue 130 may be relatively increased. Particularly, when the distance between neighboring second conductive layer patterns 126*a* may be about 100 nm or about 40 nm or less, the generation of the leakage current due to the residue 130 may be increased even higher.

When different voltage values are applied to two neighboring second conductive layer patterns 126*a*, a current between the second conductive layer patterns 126*a* may be measured to estimate a breaking point voltage which may be generated by the leakage current and may influence operation of a device. In accordance with experimental embodiments, the breaking point voltage between adjacent second conductive layer patterns 126*a* including tungsten, formed on an aluminum oxide layer, was increased by about 1.5 times in comparison to the breaking point voltage measured before performing the gas phase cleaning process and the breaking point voltage measured after performing the gas phase cleaning process using the $Si_xCl_y$-based gas.

In some embodiments, silicon included in the cleaning gas may react with surrounding oxygen or a component in an insulating layer such as a blocking dielectric layer to form an insulating interface layer including silicon on the second conductive layer patterns 126*a* and 126*b* and the blocking dielectric layer 116 during the process of removing the residue 130. The insulating interface layer may reinforce electric insulation between the neighboring second conductive layer patterns 126*a*.

In some embodiments, the formed insulating interface layer may be selectively removed using a cleaning solution including fluorine. Particularly, when a metal included in the second conductive layer pattern remains on the insulating interface layer as illustrated in FIG. 5, only the metal residue may be removed by lifting-off without damaging the second conductive layer pattern by removing the insulating interface layer. When an insulating layer including silicon is formed on the second conductive layer patterns 126*a* and 126*b* in a following process, the $Si_xCl_y$-based gas may be used as a silicon source gas. In this case, the same equipment may be used. That is, the removal of the residue, the removal of the insulating interface layer and the forming of the insulating layer may be performed in-situ using the same equipment.

In some embodiments, after performing the gas phase cleaning process or prior to performing the gas phase cleaning process, a selective oxidation process to suppress an oxidation of the second conductive layer patterns 126*a* and 126*b* containing a metal and to oxidize a surface portion of the first conductive layer pattern 122*b* containing polysilicon may be performed. Accordingly, electric characteristics of the first conductive layer pattern 122*b* formed in the peripheral circuit region may be improved. The selective oxidation process may be performed by providing an oxidizing gas including an oxygen gas and a reducing gas including a hydrogen gas successively or as a mixture state thereof. Particularly, the selective oxidation process may be performed at a temperature from about 400° C. to about 800° C. The selective oxidation process and the gas phase cleaning process may be performed in-situ in the same equipment.

In some embodiments, after performing the selective oxidation process, an insulating layer to form a capping state or layer of silicon oxide or the like may be formed by providing chlorine substituted silane gas used during the gas phase cleaning process as a silicon source gas and an oxidizing gas (or a mixture gas of oxygen and hydrogen) used during the selective oxidation process. Particularly, the forming process of the insulating layer to form a capping state or layer may be performed at a temperature range of about 400° C. to about 1,000° C. In this case, the gas phase cleaning process, the selective oxidation process and the insulating layer forming process may be performed in-situ in the same equipment without transferring the substrate 100. The gas phase cleaning process, the selective oxidation process and the insulating layer forming process may be performed by changing kinds of the providing gas and temperature condition.

In some embodiments, an insulating layer may be formed on the substrate 100 including the second conductive layer patterns 126*a* and 126*b* and the first conductive layer pattern 122*b*. The insulating layer may be anisotropically etched to form spacers 132*a* and 132*b* on a sidewall portion of the second conductive layer pattern 126*a* in the cell region and the second and first conductive layer patterns 126*b* and 122*b* in the peripheral circuit region.

In the cell region of the substrate 100, a unit cell of a nonvolatile memory device including the tunnel insulating layer 108, the charge trapping layer 114, the blocking dielectric layer 116 and the second conductive layer pattern 126*a* may be formed. Into the active region 102 of the substrate near the unit cell, impurities may be doped to form a source/drain 134*a*. In the peripheral circuit region of the substrate 100, a gate structure including the gate insulating layer 108, the first conductive layer pattern 122*b* and the second conductive layer pattern 126*b* may be formed. Into the active region 106 of the substrate near the gate structure, impurities may be doped to form a source/drain 134*b*.

Figure 14A:
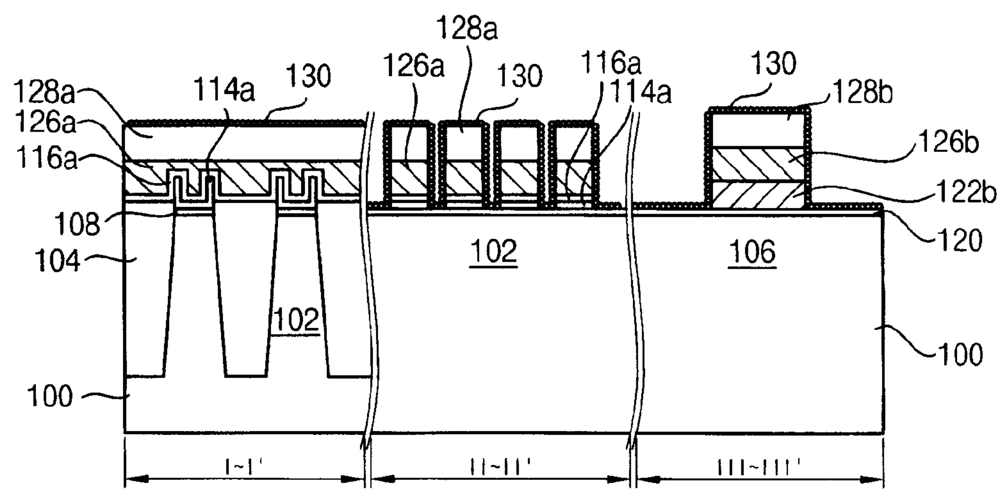
FIGS. 14A and 14B are cross-sectional views illustrating a method of manufacturing a nonvolatile memory device in accordance with some other example embodiments.
Figure 14B:
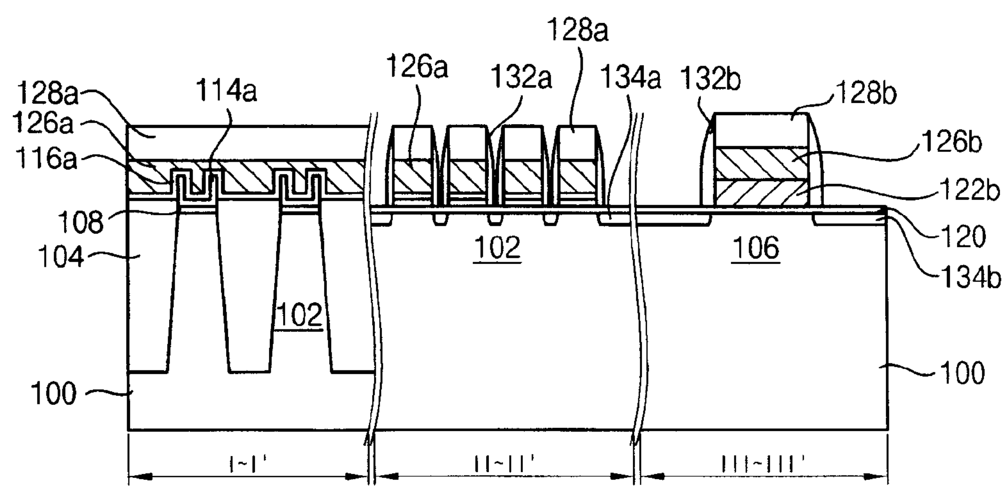

FIGS. 14A and 14B are cross-sectional views illustrating a method of manufacturing a nonvolatile memory device in accordance with some other example embodiments. Similar parts may be omitted and different parts may be explained from the explanation on the method of manufacturing a nonvolatile memory device referring to FIGS. 13A to 13F.

Referring to FIG. 14A, the second conductive layer 126, the blocking dielectric layer 116 and the charge trapping layer 114 may be successively etched to perform a gate patterning along a second direction perpendicular to an extended direction of the active region 102 in the cell region. Then, a unit cell of a charge trapping layer pattern 114*a*, a blocking dielectric layer pattern 116*a* and a second conductive layer pattern 126*a* successively formed on the tunnel oxide layer 108 in the cell region may be obtained. In the peripheral circuit region, a second conductive layer pattern 126*b* may be formed and then, a first conductive layer 122 may be etched using a material capable of etching the first conductive layer 122 selectively to form a first conductive layer pattern 122*b*.

After performing the gate patterning, the residue 130 of a metal or a metal oxide may remain on the tunnel oxide layer 108 or on the sidewall portions of the charge trapping layer pattern 114a, the blocking dielectric layer pattern 116a, the second conductive layer patterns 126a and 126b, the first conductive layer pattern 122b and the second mask patterns 128a and 128b. The residue 130 may not be easily removed by a heat treatment and may not be removed by a wet etching without affecting other structures or layers. When a leakage current is generated through the residue 130, electric characteristic of a nonvolatile memory device may be deteriorated or a defect of the device may be generated.

Referring to FIG. 14B, the residue 130 may be removed by providing a cleaning gas to react with a metal element in the residue 130 and generate a volatile metal compound. The cleaning gas may be supplied to the substrate 100 including the residue 130 at a temperature of an evaporating point or higher of the volatile metal compound to remove the residue 130 containing the metal. The gas phase cleaning process may be performed according to the same process explained referring to FIGS. 2A to 2C.

The generation of the leakage current due to the residue 130 may be suppressed by removing the residue 130 from the tunnel oxide layer 108 provided between the second conductive layer patterns 126a and 126b and from the sidewall portions of the second conductive layer patterns 126a and 126b, the blocking dielectric layer pattern 116a and the charge trapping layer pattern 114a. In accordance with experimental embodiments, a silicon nitride layer, an aluminum oxide layer and a tungsten layer successively formed on a silicon oxide layer may be patterned by a dry etching process and then a gas phase cleaning process may be performed using a $Si_xCl_y$-based gas. In this embodiment, the breaking point voltage between two neighboring tungsten patterns was increased by about 4 times when comparing the breaking voltage measured before performing the gas phase cleaning process was performed with the breaking point voltage measured after performing the gas phase cleaning process using the $Si_xCl_y$-based gas.

In some embodiments, silicon included in the cleaning gas may react with surrounding oxygen or insulating layer components while removing the residue 130 to form an insulating interface layer including silicon may be formed on the second conductive layer patterns 126a and 126b, the blocking dielectric layer pattern 116a, the charge trapping layer pattern 114a and the tunnel insulating layer 108. The insulating interface layer may reinforce electric insulation between neighboring second conductive layer patterns 126a. Particularly, the insulating interface layer may be selectively removed using a cleaning solution including a fluorine compound.

In some embodiments, an insulating layer may be formed on the substrate 100 including the second conductive layer patterns 126a and 126b and the first conductive layer pattern 122b. Then, the insulating layer may be anisotropically etched to form spacers 132a and 132b on sidewall portions of the second conductive layer pattern 126a in the cell region and the second and first conductive layer patterns 126b and 122b in the peripheral circuit region.

In the cell region of the substrate 100, a cell gate structure of a nonvolatile memory device including the tunnel insulating layer 108, the charge trapping layer pattern 114a, the blocking dielectric layer pattern 116a and the second conductive layer pattern 126a may be formed. Into the active region 102 of the substrate near the cell gate structure, impurities may be doped to form a source/drain 134a. In the peripheral circuit region of the substrate 100, a gate structure including a gate insulating layer 120, the first conductive layer pattern 122b and the second conductive layer pattern 126b may be formed. Into the active region 106 of the substrate near the gate structure, impurities may be doped to form a source/drain 134b.

NAND-type flash memory devices may be formed using method of manufacturing explained referring to FIGS. 12 to 14B. The gas phase cleaning process performed after the gate patterning to improve properties of the nonvolatile memory device may be also applied to a method of manufacturing NOR-type flash memory devices.

Figure 15:
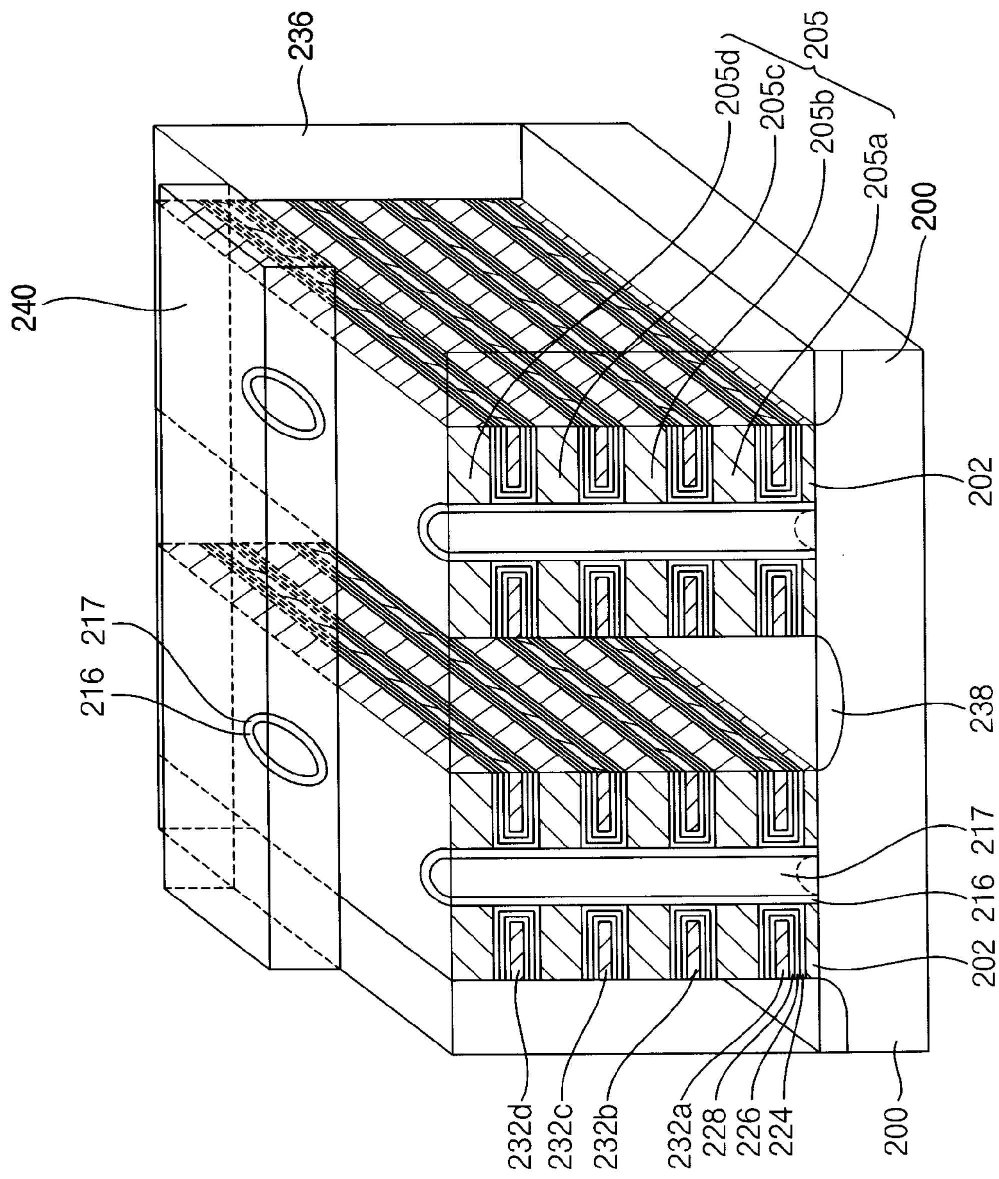

FIG. 15 is a perspective view illustrating a vertical nonvolatile memory device manufactured by applying a method of forming a conductive layer pattern in accordance with some example embodiments.

Referring to FIG. 15, a semiconductor pattern 216 may be formed on a substrate 200 in a vertical nonvolatile memory device. The semiconductor pattern 216 may be formed using single crystalline silicon or polysilicon. The semiconductor pattern 216 may have a hollow cylindrical shape, i.e., an oval, circular, or a macaroni shape as illustrated in FIG. 15. Alternatively, the semiconductor pattern 216 may have a pillar shape. Within the macaroni shape semiconductor pattern 216, a first insulating layer pattern 217 may be formed on the semiconductor pattern 216.

For one semiconductor pattern 216, cell transistors forming one cell string may be formed and the cell transistors may be serially connected in a vertical direction with respect to the surface of the substrate. Generally, $2^m$ (m represents a natural number) numbers of the cell transistors may be formed in one cell string formed on the substrate 200. In some embodiments, two or four cell transistors may be serially connected in one cell string. Between cell gate electrodes formed along the vertical direction with respect to the surface of the substrate, insulating interlayer patterns 205 including 205a, 205b, 205c and 205d may be formed. That is, the cell transistors may be formed in a groove provided between upper and lower insulating interlayer patterns 205a, 205b, 205c and 205d.

As illustrated in FIG. 15, each insulating interlayer pattern 205a, 205b, 205c and 205d may be formed on a different level, or floor, of the vertical transistor stack of the vertical non-volatile memory device illustrated therein. A tunnel insulating layer 224 may be formed on an outer sidewall portion of the semiconductor patterns 216 between the insulating interlayer patterns 205a, 205b, 205c and 205d. The tunnel insulating layer 224 may be deposited along the outer sidewall portion of the semiconductor pattern 216 exposed by the groove and the surface portions of the upper and lower insulating interlayer patterns 205a, 205b, 205c and 205d. Particularly, the tunnel insulating layer 224 may be formed to have a broken shape for each floor. Alternatively, the tunnel insulating layer 224 may be formed to have a continuous shape between the floors.

On the tunnel insulating layer 224, a charge trapping layer 226 may be provided. The charge trapping layer 226 may be formed using silicon nitride or metal oxide to trap charges. The charge trapping layer 226 may have a broken shape or a continuous shape between the floors.

On the charge trapping layer 226, a blocking dielectric layer 228 may be provided. The blocking dielectric layer 228 may be formed using silicon oxide or metal oxide.

On the blocking dielectric layer 228, conductive patterns 232a, 232b, 232c and 232d may be formed for each floor. The conductive patterns 232a, 232b, 232c and 232d may be provided as a control gate electrode and a word line. The conductive patterns 232a, 232b, 232c and 232d may fill up inner portions of the groove and may have a thick or broadened line shape extended in a first direction. In addition, the conductive patterns 232*a*, 232*b*, 232*c* and 232*d* may have a separated shape for each floor. Therefore, the conductive patterns 232*a*, 232*b*, 232*c* and 232*d* provided at a different floor may not be electrically connected. The conductive patterns 232*a*, 232*b*, 232*c* and 232*d* may include a metal.

Between the line-shaped conductive layer patterns 232*a*, 232*b*, 232*c* and 232*d*, a second insulating layer pattern 236 may be formed. In some embodiments, the second insulating layer pattern 236 may have an extended shape in the first direction. In the substrate under the second insulating layer pattern 236, impurity region 238 used as a common source line may be provided. Particularly, n-type impurities may be doped into the impurity region 238.

FIGS. 16A to 16I are cross-sectional views illustrating a method of manufacturing a vertical nonvolatile memory device illustrated in FIG. 15 in accordance with some example embodiments.

Figure 16A:
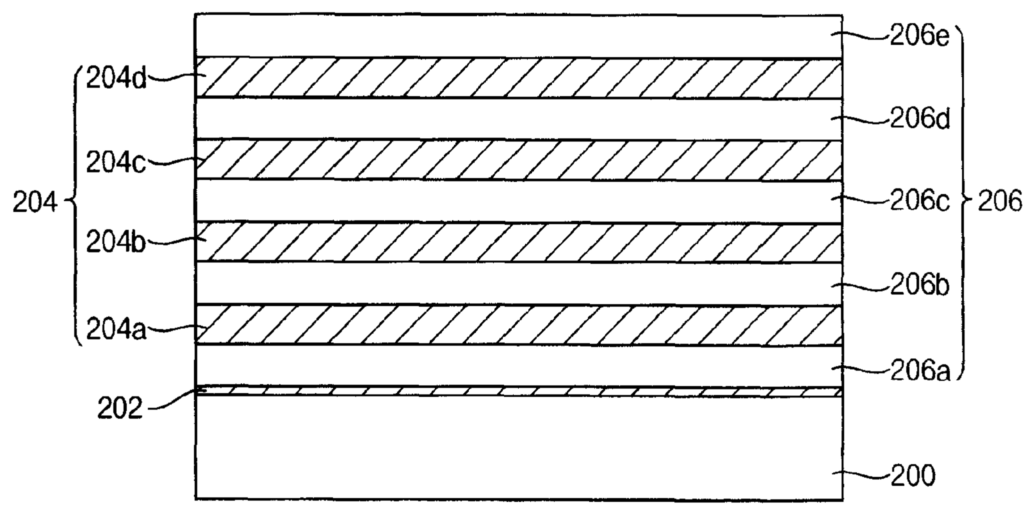
FIGS. 16A to 16I are cross-sectional views illustrating a method of manufacturing a vertical nonvolatile memory device illustrated in FIG. 15 in accordance with some example embodiments.

Referring to FIG. 16A, a pad insulating layer 202 may be formed on a substrate 200. The pad insulating layer 202 may be formed through a thermal oxidation of the substrate 200 and may suppress a stress generated when the insulating interlayer makes a direct contact with the substrate 200. Sacrificial layers 206 and insulating interlayers 204 may be repeatedly and alternately formed on the pad insulating layer 202 in a vertical direction with respect to the surface of the substrate. The sacrificial layers 206 and the insulating interlayers 204 may be formed through a chemical vapor deposition process.

A portion of the sacrificial layers 206 may be removed to define a space portion for a gate pattern of a transistor to be formed in each floor of the semiconductor device in a following process. In the space provided by removing the sacrificial layers 206, transistors corresponding to each floor may be formed. The sacrificial layers 206 may be formed to have the same or larger thickness as an effective length of the gate pattern of each floor. The sacrificial layers 206 may be formed using a material having an etching selectivity with respect to the insulating interlayer 204 and single crystalline silicon. The sacrificial layers 206 may be easily removed by a wet etching process. In some embodiments, the sacrificial layers 206 may be formed using silicon nitride and the insulating interlayers 204 may be formed using silicon oxide.

Transistors provided in each floor may be formed in the space portion formed by removing the sacrificial layers 206, and so the number of integration of the sacrificial layers 206 and the insulating interlayers 204 may be the same or larger than the number of the transistors included in the cell string. Particularly, the sacrificial layers 206 and the insulating interlayers 204 may be successively formed considering the formation of a cell selecting transistor and a ground selecting transistor as well as the cell transistors in the cell string.

Figure 16B:
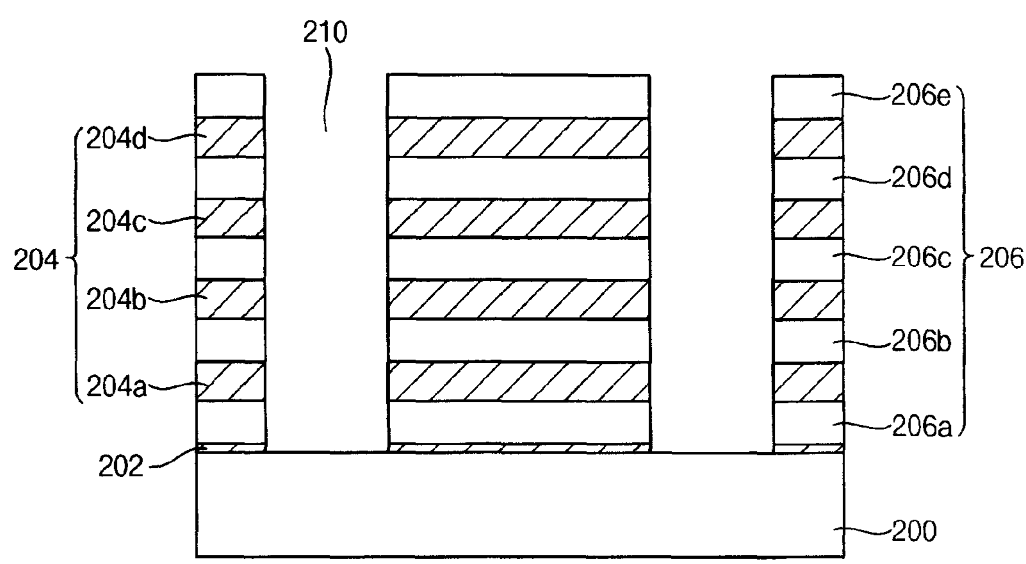

Referring to FIG. 16B, an etching mask pattern (not illustrated) may be formed on the uppermost sacrificial layer 206*e* and the sacrificial layers 206, the insulating interlayers 204 and the pad insulating layer 202 may be successively etched using the etching mask to form a mold structure having first openings 210. At the bottom portion of the first openings 210, the surface portion of the substrate 200 may be exposed.

Within the first openings 210, the semiconductor pattern provided as an active region to form each cell string may be formed in a following process. Therefore, the first openings 210 may be formed to have a regular arrangement along a first direction and a second direction perpendicular to the first direction. Further, the first openings 210 may have a hole shape.

Figure 16C:
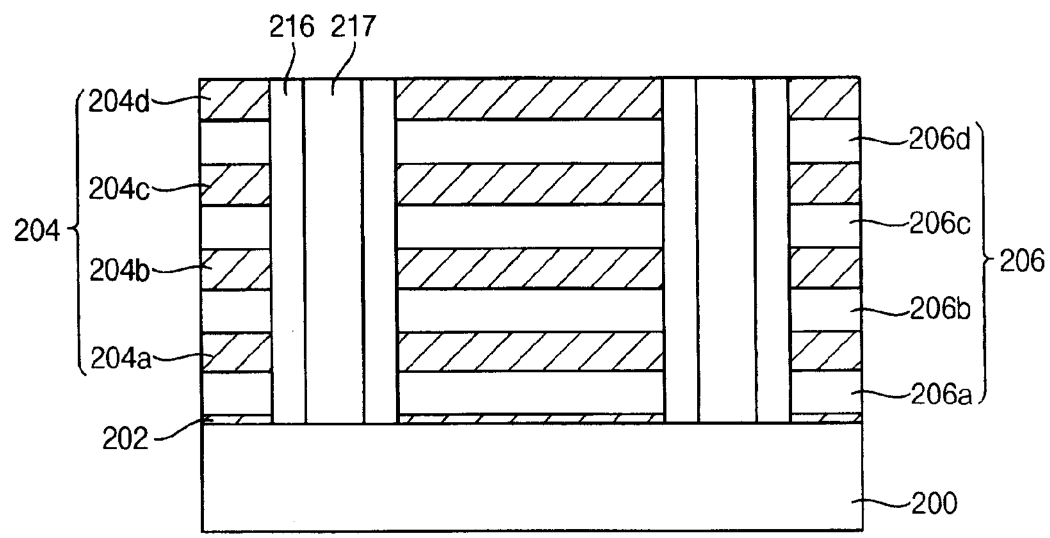

Referring to FIG. 16C, on inner sidewall portions of the first openings 210, a semiconductor pattern 216 may be formed. Within the first openings 210 having the semiconductor pattern 216, a first insulating layer pattern 217 may be formed. The semiconductor pattern 216 may have a hollow cylindrical shape, i.e., an oval, circular, or a macaroni shape. In some other embodiments, the semiconductor pattern 216 may have a pillar shape with substantially orthogonal side surfaces in which the inner portion of the first openings 210 may be completely filled up with the semiconductor pattern 216. The semiconductor pattern 216 may be formed using single crystalline silicon or polysilicon.

The semiconductor pattern 216 may be provided as an active region to form each cell string extended in a vertical direction with respect to the surface portion of the substrate.

In some embodiments, a polysilicon layer may be formed along the sidewall portion and the bottom portion of the first openings 210. Then, the polysilicon layer may be etched by an anisotropic etching process to form the macaroni or other shaped semiconductor pattern 216. Further, the inner portion of the first openings 210 may be filled up with an insulating layer and a polishing process may be performed to form the first insulating layer pattern 217.

Alternatively, the inner portion of the first openings 210 may be filled up with polysilicon or amorphous silicon and then, a thermal treatment or a laser beam exposing process may be performed to transform the polysilicon or the amorphous silicon into single crystalline silicon. A polishing process may be performed so that the single crystalline silicon may remain only within the first openings 210. The uppermost sacrificial layer 206*e* illustrated in FIGS. 16A and 16B may be removed while performing the polishing process.

Figure 16D:
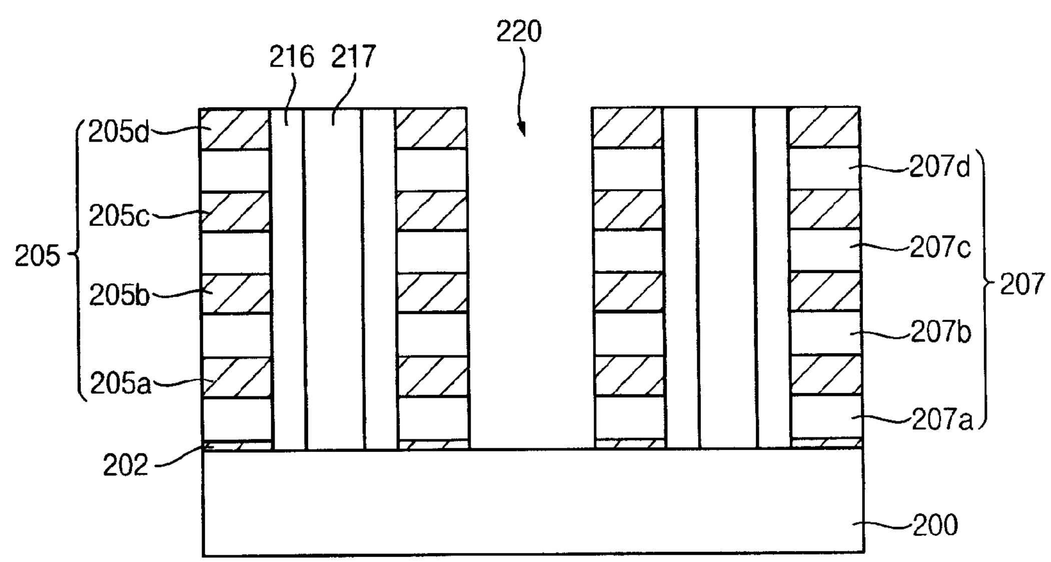

Referring to FIGS. 16C and 16D, the insulating interlayers 204 and the sacrificial layers 206 present between the semiconductor patterns 216 may be etched to form second openings 220. An etching mask pattern may be formed on the insulating interlayer pattern 205*d* and then, the insulating interlayers 204 and the sacrificial layers 206 may be successively etched using the etching mask to form the second openings 220. The second openings 220 may have a trench shape extended in a first direction. As the second openings 220 are formed, line shaped insulating interlayer patterns 205 and sacrificial layer patterns 207 extended in the first direction may be formed.

Figure 16E:
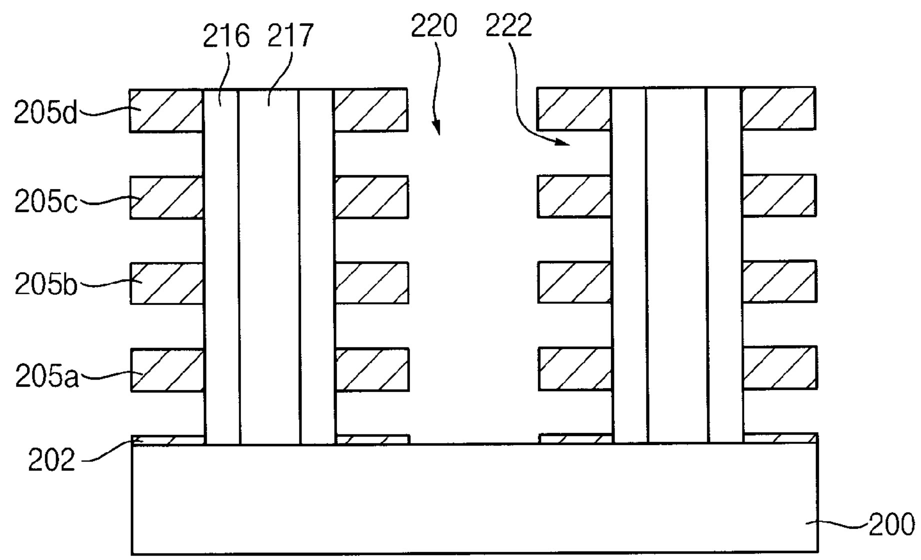

Referring to FIGS. 16D and 16E, the sacrificial layer patterns 207 exposed to the sidewall portion of the second openings 220 may be selectively removed. The sacrificial layer patterns 207 may be selectively removed through a selective wet etching process. Particularly, the sacrificial layer patterns 207 including silicon oxide may be removed using an aqueous solution containing fluorine. After performing the removing process, only insulating interlayer patterns 205 separated with a gap may remain at the sidewall portion of the semiconductor patterns 216. Upon an area where the sacrificial layer patterns 207*a*, 207*b*, 207*c* and 207*d* from the sidewall portion of the second openings 220 are removed, third openings 222 exposing the sidewall portion of the semiconductor patterns 216 may be formed.

Figure 16F:
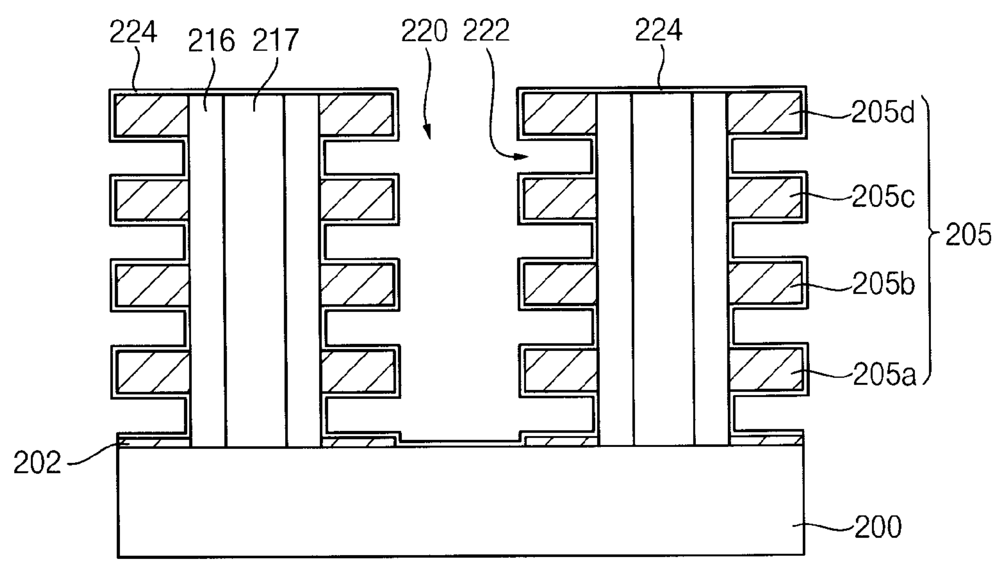

Referring to FIG. 16F, a tunnel insulating layer 224 may be formed along the surface portion of the exposed portion of the semiconductor patterns 216 and the insulating interlayer patterns 205. The tunnel insulating layer 224 may be formed by depositing silicon oxide. Alternatively, the tunnel insulating layer 224 may be formed only on the exposed portion of the semiconductor patterns 216. In this case, the tunnel insulating layer 224 may be formed by a thermal oxidation process. The tunnel insulating layer 224 may be one continuous layer that spans the different levels, or floors, of the memory device.

Figure 16G:
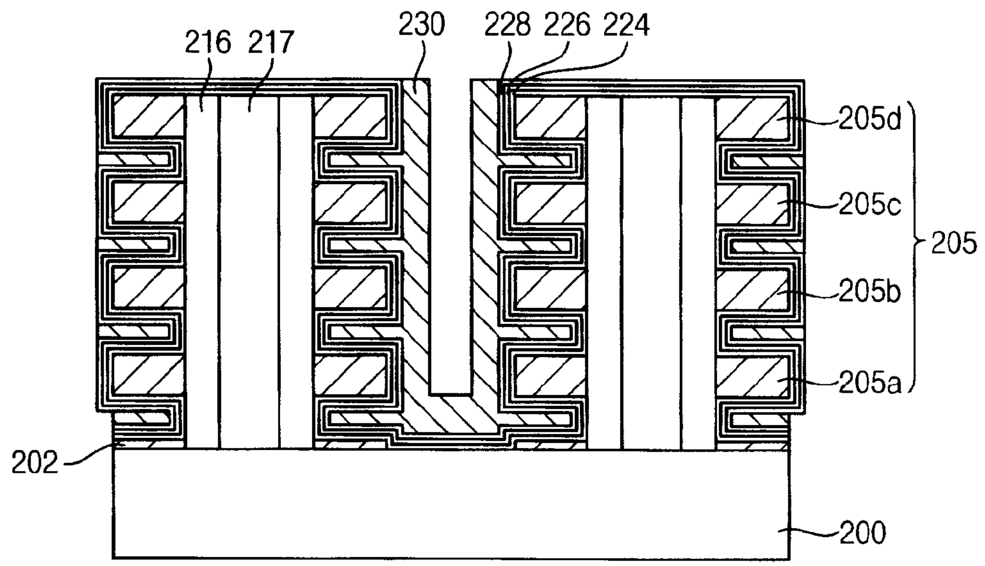

Referring to FIG. 16G, a charge trapping layer 226 may be formed on the tunnel insulating layer 224. The charge trapping layer 226 of each floor may be formed by a chemical vapor deposition process. The charge trapping layer 226 may be connected to each other across the floors. The charge trapping layer 226 may be formed so as to include silicon nitride or metal oxide. Since silicon nitride and metal oxide are insulating material, each cell transistor may not generate an electric short even though each cell transistor may be connected to each other.

On the charge trapping layer 226, a blocking dielectric layer 228 may be formed. The blocking dielectric layer 228 may be formed by depositing silicon oxide, aluminum oxide or other metal oxide. The blocking dielectric layer 228 may have a continuous connected shape through the floors as the charge trapping layer 226 and the tunnel insulating layer 224.

On the blocking dielectric layer 228, a conductive layer 230 completely filling up the third openings 222 may be formed. The conductive layer 230 may partially or completely fill up the inner portion of the second openings 220. The conductive layer 230 may form a U-shape layer within the second openings 220 when filling in the conductive layers in the third openings 222. The conductive layer 230 may be formed by depositing a conductive material having a good step coverage to suppress generation of voids. The conductive material may include a metal and may have a low electric resistance. Examples of the conductive material may include tungsten, tungsten nitride, titanium, titanium nitride, tantalum, tantalum nitride, platinum, etc. The upper portion of the conductive layer 230 may be planarized by a polishing process.

Figure 16H:
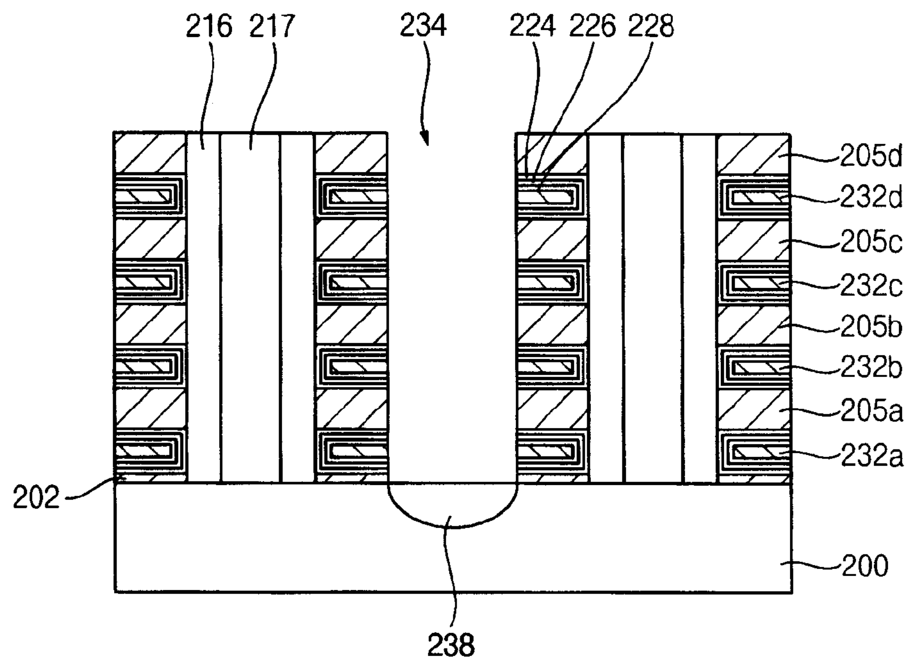

Referring to FIG. 16H, the conductive layer 230 formed in the second openings 220 may be etched and then, the tunnel insulating layer 224, the charge trapping layer 226 and the blocking dielectric layer 228 may be etched to form a fourth opening 234 exposing the surface of the substrate 200. Accordingly, conductive layer patterns 232*a*, 232*b*, 232*c* and 232*d* may be formed within the third openings 222. The conductive layer patterns 232*a*, 232*b*, 232*c* and 232*d* may be formed with a gap along a vertical direction with respect to the substrate and may be electrically and vertically separated by insulating interlayer patterns 205*a*, 205*b*, 205*c* and 205*d*. The conductive layer 230 may be etched by means of a dry etching process or a wet etching process.

The tunnel insulating layer 224, the charge trapping layer 226 and/or the blocking dielectric layer 228 formed on the insulating interlayer patterns 205*a*, 205*b*, 205*c* and 205*d* may be removed while performing the etching process to separate the tunnel insulating layer 224, the charge trapping layer 226 and/or the blocking dielectric layer 228 in each floor as illustrated in FIG. 16H. Alternatively, the tunnel insulating layer 224, the charge trapping layer 226 and/or the blocking dielectric layer 228 formed on the insulating interlayer patterns 205*a*, 205*b*, 205*c* and 205*d* may not be etched but may remain. In this case, the charge storing layer pattern in each floor may be connected to each other.

As described above, conductive layer patterns 232*a*, 232*b*, 232*c* and 232*d*, functioning as a control gate may be formed between the insulating interlayer patterns 205*a*, 205*b*, 205*c* and 205*d*. The conductive layer patterns 232*a*, 232*b*, 232*c* and 232*d* in each floor may have a line shape extended in the first direction. The conductive layer patterns 232*a*, 232*b*, 232*c* and 232*d* formed in different floors may be insulated by the insulating interlayer patterns 205*a*, 205*b*, 205*c* and 205*d*.

On the conductive layer patterns 232*a*, 232*b*, 232*c* and 232*d* and the insulating interlayer patterns 205*a*, 205*b*, 205*c* and 205*d*, conductive residue generated while etching the conductive layer 230 may be present. When the conductive layer 230 includes a metal, the residue may include a metal oxide. When the metallic residue remains between the neighboring conductive layer patterns 232*a*, 232*b*, 232*c* and 232*d*, a leakage current may be generated through the residue.

The residue remaining on the conductive layer patterns 232*a*, 232*b*, 232*c* and 232*d* and the insulating interlayer patterns 205*a*, 205*b*, 205*c* and 205*d* may be removed by performing a cleaning process using a cleaning gas at a high temperature. The cleaning process may be performed by providing the cleaning gas including an element to react with the metal or metal oxide included in the residue and may generate a volatile metal compound. The cleaning gas may also include an element like silicon that may react with oxygen included in the insulating interlayer patterns 205*a*, 205*b*, 205*c* and 205*d*, the blocking dielectric layer 228 and the residue or oxygen present in the surroundings and may generate a nonvolatile insulating material. The cleaning gas may be provided at a temperature higher than an evaporating point of the volatile metal compound to remove the residue. Explanation on the gas phase cleaning process may be substantially the same as the explanation referring to FIGS. 2A to 2C.

In some embodiments, the gas phase cleaning process may be performed using $Si_xCl_y$-based gas or $Si_xCl_yH_z$-based gas including tetrachloro silane ($SiCl_4$), hexachloro disilane ($Si_2Cl_6$), dichloro silane ($SiCl_2H_2$), trichlorosilane ($SiCl_3H$), monochloro silane ($SiClH_3$), etc. The $Si_xCl_y$-based gas or $Si_xCl_yH_z$-based gas may have an appropriate reaction rate with a metal and so that the residue may be selectively removed while suppressing damage on the conductive layer patterns 232*a*, 232*b*, 232*c* and 232*d*. Through removing the residue, a generation of a device defect such as a leakage current may be suppressed.

N-type impurities may be doped into the exposed portion of the substrate 200 by the bottom portion of the fourth opening 234 to form an impurity region 238 used as a source line (S/L) of a NAND flash memory device. Particularly, the impurity region 238 may be formed by doping the n-type impurities into the substrate 200.

Figure 16I:
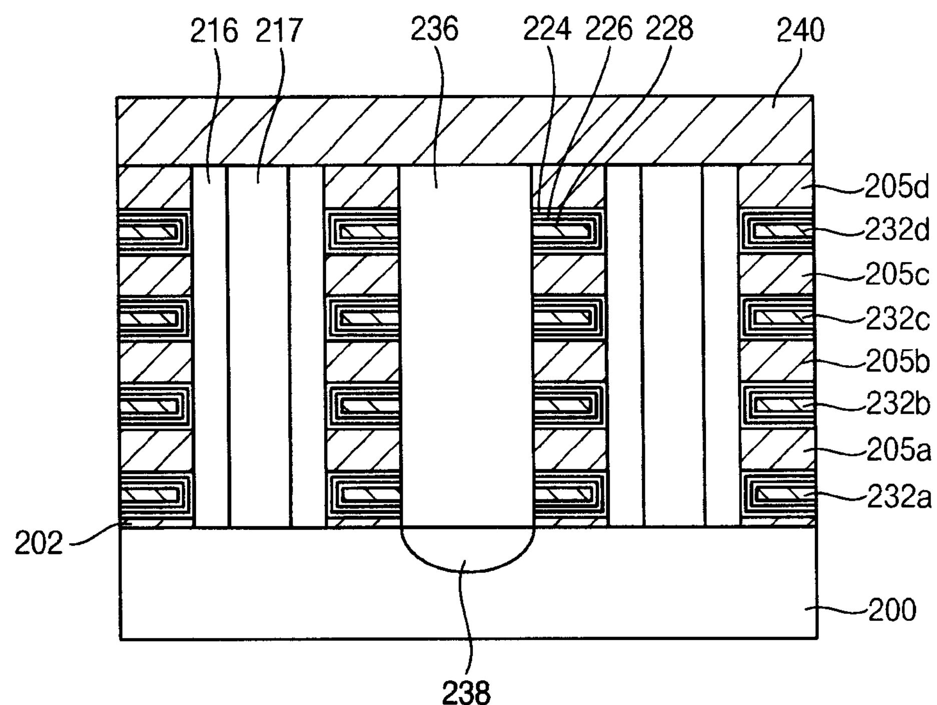

Referring to FIGS. 16H and 16I, an insulating layer filling up the fourth opening 234 may be formed and a planarization by means of a polishing process may be performed to form a second insulating layer pattern 236 within the fourth opening 234. A bit line 240 may be formed on the semiconductor pattern 216, the first insulating layer pattern 217, the second insulating layer pattern 236 and the insulating interlayer pattern 205*d*. The bit line 240 may have a line shape extended in the second direction perpendicular to the first direction and may be electrically connected with the semiconductor pattern 216.

FIGS. 17A to 17D are cross-sectional views illustrating a method of manufacturing a DRAM device in accordance with some example embodiments.

Figure 17A:
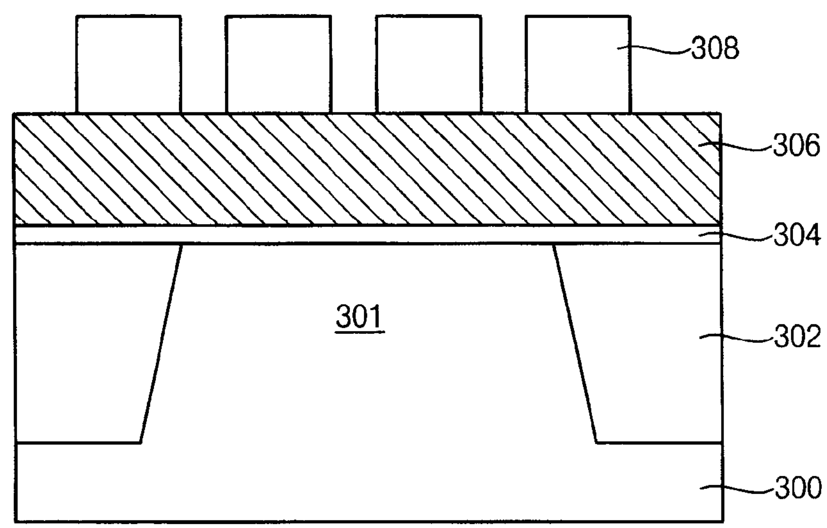
FIGS. 17A to 17D are cross-sectional views illustrating a method of manufacturing a DRAM device in accordance with some example embodiments.

Referring to FIG. 17A, a device isolation layer 302 may be formed on a substrate 300 by performing a device isolation process such as a shallow trench isolation (STI) process. The substrate 300 may include a semiconductor substrate, an SOI substrate, a single crystalline substrate, a metal oxide substrate, etc. An active region 301 of a DRAM device may be defined by the device isolation layer 302.

On the substrate 300 including the device isolation layer 302 formed thereon, a gate insulating layer 304 and a conductive layer 306 may be successively formed. The gate insulating layer 304 may be formed so as to include silicon oxide, silicon oxynitride or metal oxide. The gate insulating layer 304 may be formed by means of a thermal oxidation process or a thin film deposition process.

On the gate insulating layer 304, a gate conductive layer 306 may be formed. The gate conductive layer 306 may include a thin film containing a metal. The gate conductive layer 306 may include a conductive material having a low electric resistance such as tungsten, tungsten nitride, titanium, titanium nitride, tantalum, tantalum nitride, platinum, etc. In some embodiments, the gate conductive layer 306 may be a multi-layer including at least one of a polysilicon layer and a thin film containing a metal. In some other embodiments, the gate conductive layer 306 may be a multi-layer including a metal layer and a metal nitride layer. The gate conductive layer 306 may be formed by means of a sputtering process, a chemical vapor deposition process, etc.

On the gate conductive layer 306, a mask pattern 308 may be formed. The mask pattern 308 may be formed using a material having an etching selectivity with respect to the gate conductive layer 306. Particularly, the mask pattern 308 may include a hard mask material including silicon oxide, silicon oxynitride or silicon nitride. The mask pattern 308 may be formed by forming a mask layer and partially etching the mask layer using a photoresist pattern.

Figure 17B:
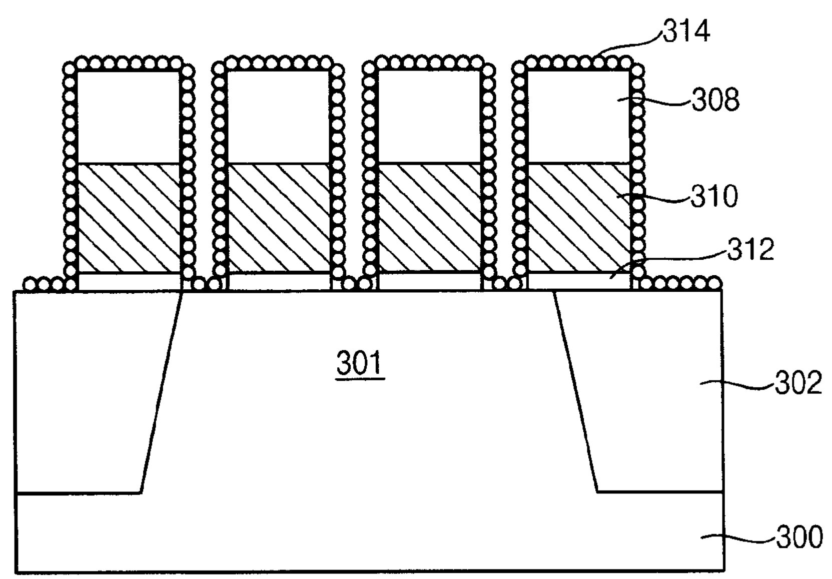

Referring to FIGS. 17A and 17B, the gate conductive layer 306 may be partially etched using the mask pattern 308 as an etching mask to form a gate conductive layer pattern 310. When the gate insulating layer 304 is etched, a gate insulating layer pattern 312 and the gate conductive layer pattern 310 may be successively formed on the substrate 300. The gate conductive layer 306 may be patterned by means of a dry etching process and/or a wet etching process.

On the substrate 300 including the gate conductive layer pattern 310 and the mask pattern 314 formed thereon, residue generated while etching the gate conductive layer 310 may be present. When the gate conductive layer 310 includes a metal, the residue may include a conductive metal oxide. When the conductive residue is present between the neighboring gate conductive layer patterns 310, a leakage current may be generated through the residue.

The residue remaining on the gate conductive layer pattern 310, the mask pattern 314 and the substrate 300 may be removed through performing the gas phase cleaning process using the cleaning gas at a high temperature. The cleaning process may be performed using a cleaning gas containing an element that may generate a volatile metal compound through a reaction with a metal or a metal oxide contained in the residue. The cleaning gas may also contain an element such as silicon that may generate a nonvolatile insulating material through a reaction with oxygen contained in the mask pattern 314, the gate insulating layer pattern 312, the residue or in the atmosphere. The cleaning gas may be supplied to remove the residue at a higher temperature than an evaporating point of the volatile metal compound. The explanation on the gas phase cleaning may be substantially the same as the explanation described referring to FIGS. 2A to 2C.

In some embodiments, the gas phase cleaning process may be performed using $Si_xCl_y$-based gas or $Si_xCl_yH_z$-based gas including tetrachloro silane ($SiCl_4$), hexachloro disilane ($Si_2Cl_6$), dichloro silane ($SiCl_2H_2$), trichlorosilane ($SiCl_3H$), monochloro silane ($SiClH_3$), etc. The $Si_xCl_y$-based gas or $Si_xCl_yH_z$-based gas may have an appropriate reaction rate with a metal and so that the residue may be selectively removed while suppressing damage of the gate conductive layer pattern 310. Through the removal of the residue, the generation of a device defect including the generation of the leakage current may be suppressed.

Figure 17C:
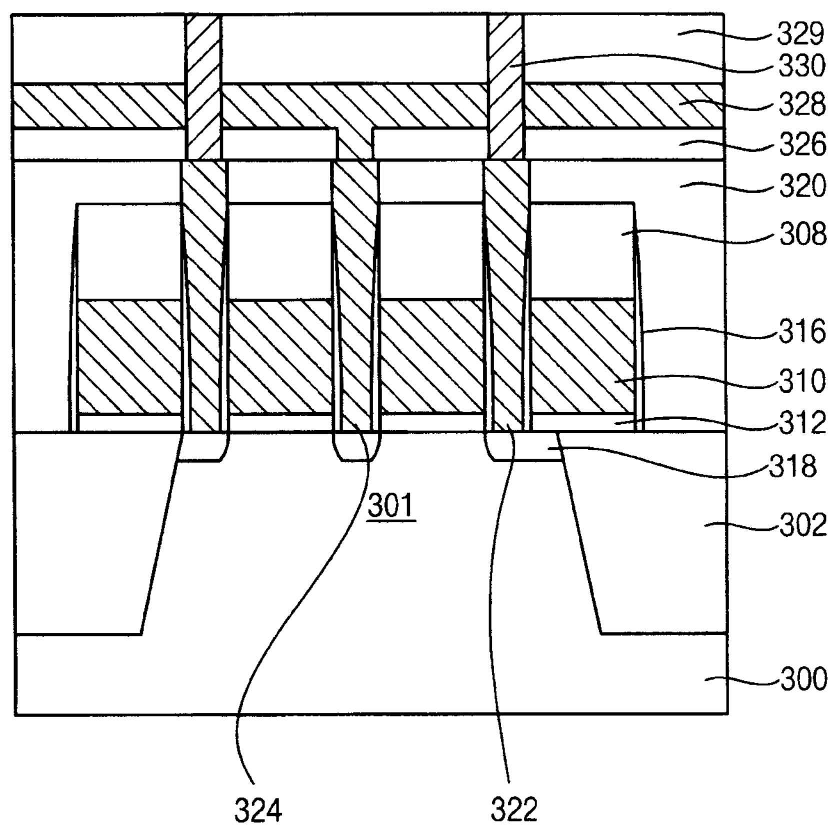

Referring to FIG. 17C, a gate spacer 316 may be formed on the sidewall portion of the gate conductive layer pattern 310. The gate spacer 316 may be formed by forming an insulating layer on the substrate 300 including the gate conductive layer pattern 310 formed thereon and performing an anisotropic etching of the insulating layer. On the substrate 300, a gate structure including the gate insulating layer pattern 312, the gate conductive layer pattern 310, the mask pattern 308 and the gate spacer 316 may be formed. An ion implantation process may be performed to dope impurities into the substrate 300 between the gate structures to form a source/drain 318. A transistor may be formed in the cell region of the substrate 300.

A first insulating interlayer 320 may be formed by depositing an insulating material on the substrate including the transistor formed thereon. The first insulating interlayer 320 may be partially removed to form an opening portion exposing the substrate 300 between the gate structures. The opening portion may be filled up with a conductive material to form a first pad 324 and a second pad 322. The first pad 324 may be electrically connected to a bit line 328 and the second pad 322 may be electrically connected to a capacitor.

On the first insulating interlayer 320 including the first pad 324 and the second pad 322 formed thereon, a second insulating interlayer 326 may be formed. The second insulating interlayer 326 may be partially removed to form an opening portion exposing the first pad 324. A conductive layer may be formed on the second insulating interlayer 326 while filling up the opening portion. The conductive layer may be patterned to form the bit line 328. After forming the bit line 328, residue generated while patterning the bit line 328 may be removed by means of the gas phase cleaning process. The gas phase cleaning process may be performed in accordance with substantially the same process explained referring to FIGS. 2A to 2C.

A third insulating interlayer 329 may be formed on the substrate 300 including the bit line 328 formed thereon. The second insulating interlayer 326 and the third insulating interlayer 329 may be partially removed to form a fourth pad 330 exposing the second pad 322.

Figure 17D:
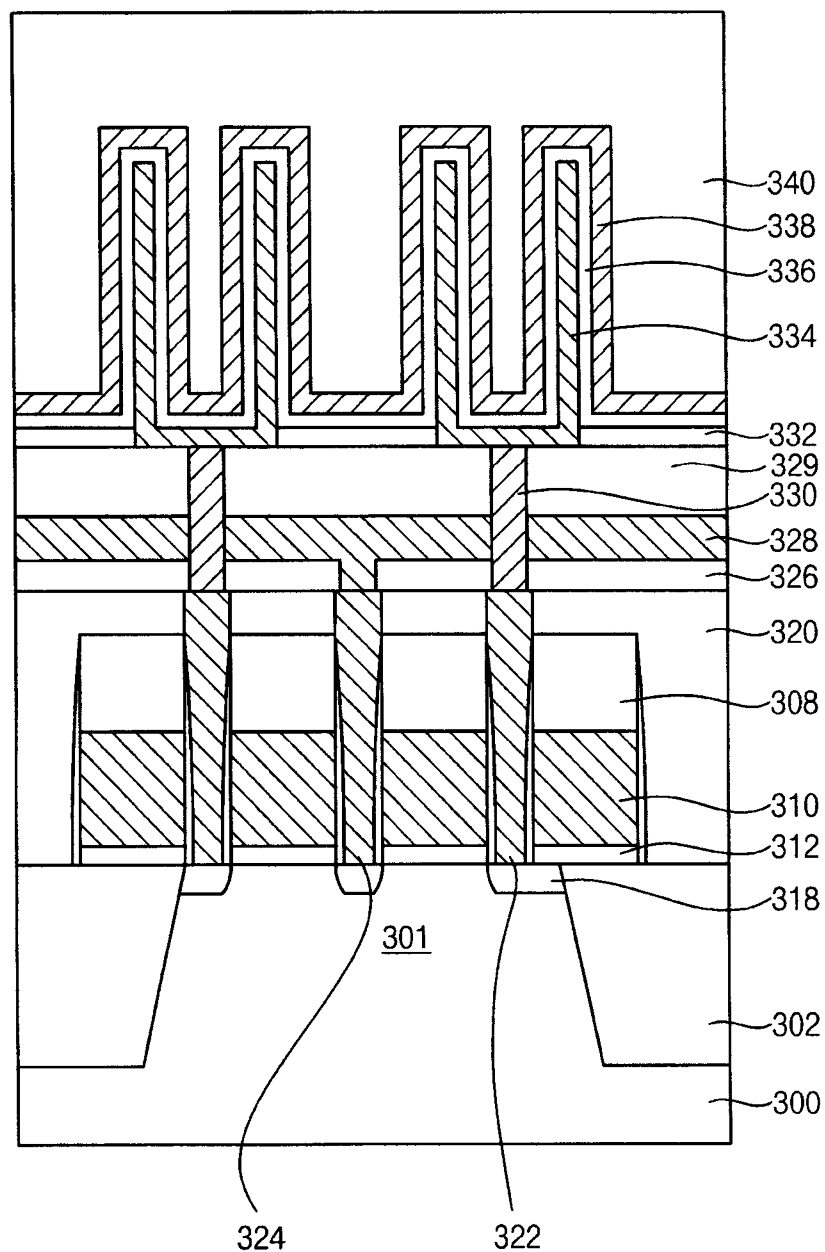

Referring to FIG. 17D, an etch stopping layer 332 may be formed on the third insulating interlayer 329 including the fourth pad 330 and a mold layer pattern (not illustrated) to form a lower electrode may be formed. The mold layer pattern may be formed by forming an insulating layer on the third insulating interlayer 329 and partially etching the insulating layer and the etch stopping layer 332 to expose the fourth pad 330. On the mold layer pattern, a conductive layer for the lower electrode may be formed and then, an upper portion of the conductive layer for the lower electrode may be removed to form a node separated lower electrode 334. After forming the lower electrode 334, the mold layer pattern may be removed.

When the conductive layer for the lower electrode includes a metal, a residue generated while removing the upper portion of the conductive layer for the lower electrode may be removed through performing substantially the same gas phase cleaning process as explained referring to FIGS. 2A to 2C.

A dielectric layer 336 may be formed on the lower electrode 334 and an upper electrode 338 may be formed by depositing a conductive material on the dielectric layer 336. On the upper electrode 338, an insulating layer 340 may be formed. A structure of a DRAM device in a cell region may be formed in accordance with the above-described process.

Figure 18A:
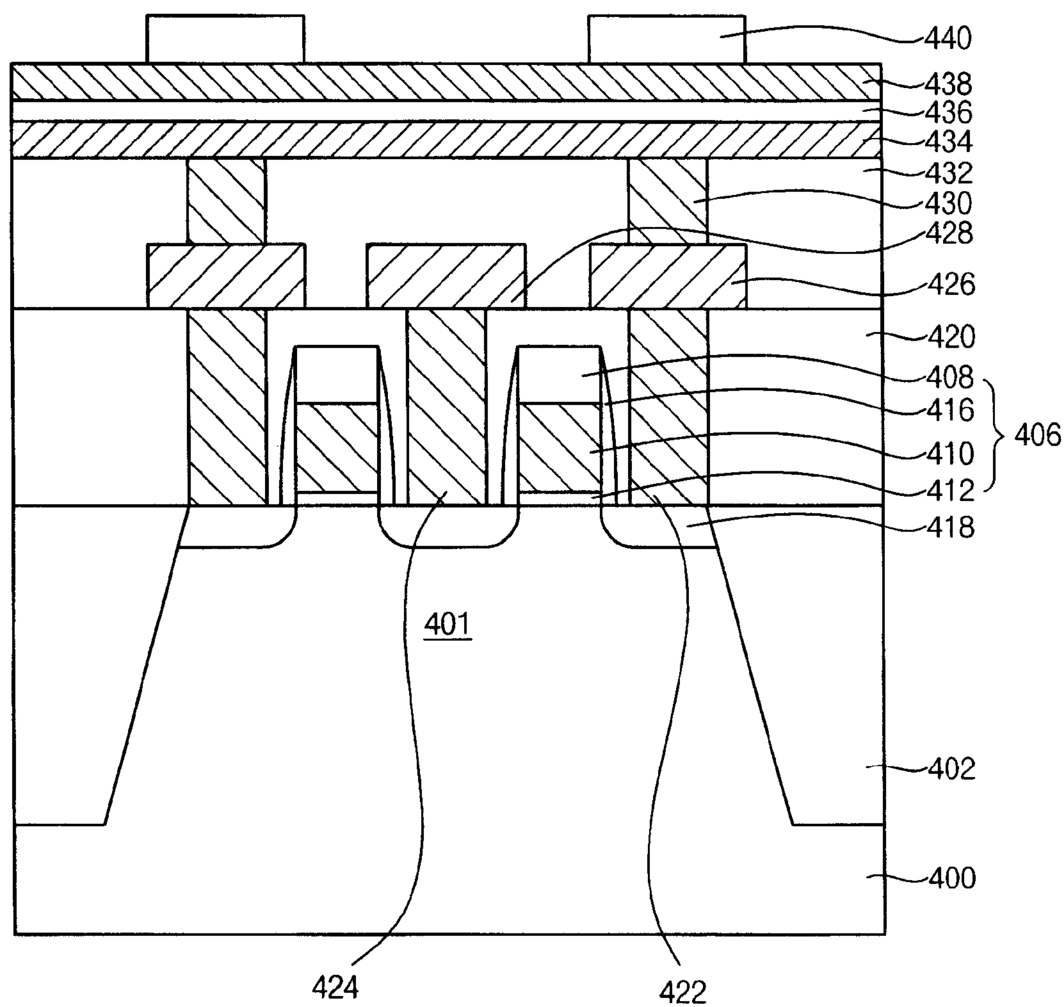
FIGS. 18A to 18C are cross-sectional views illustrating a method of manufacturing a resistive memory device in accordance with some example embodiments.
Figure 18B:
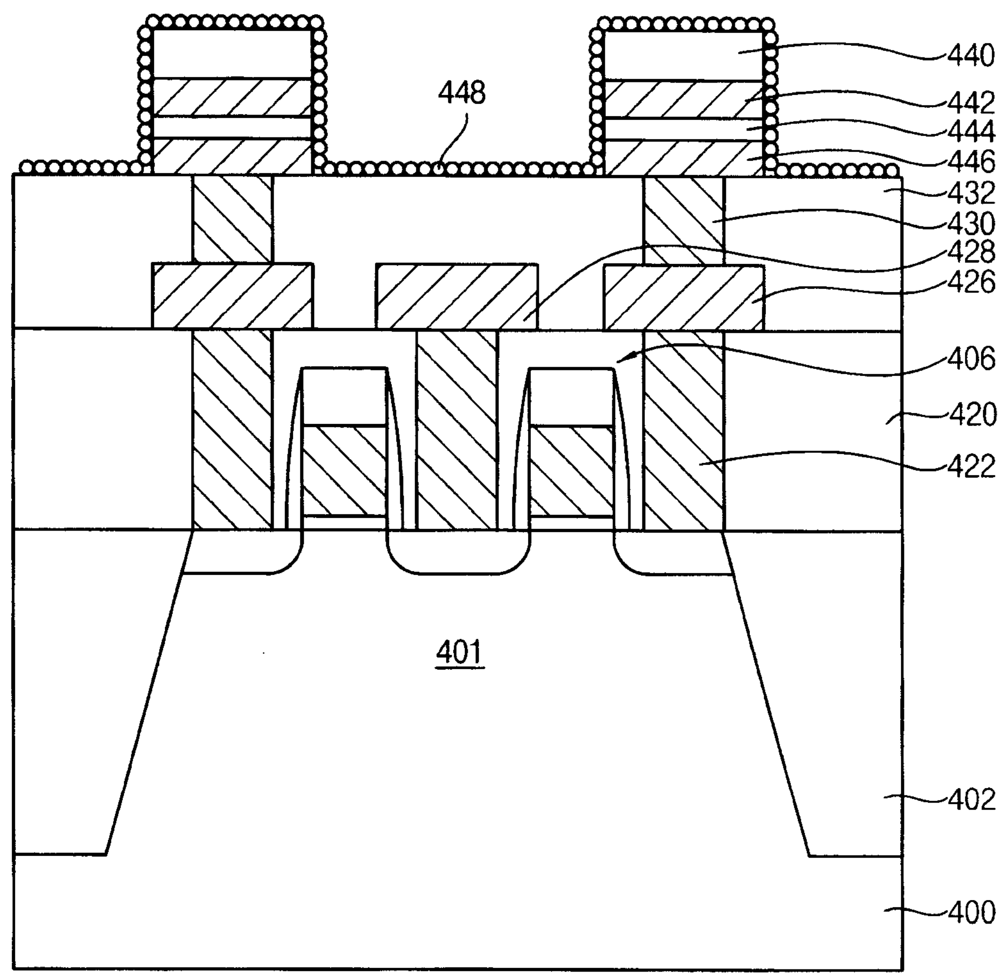
Figure 18C:
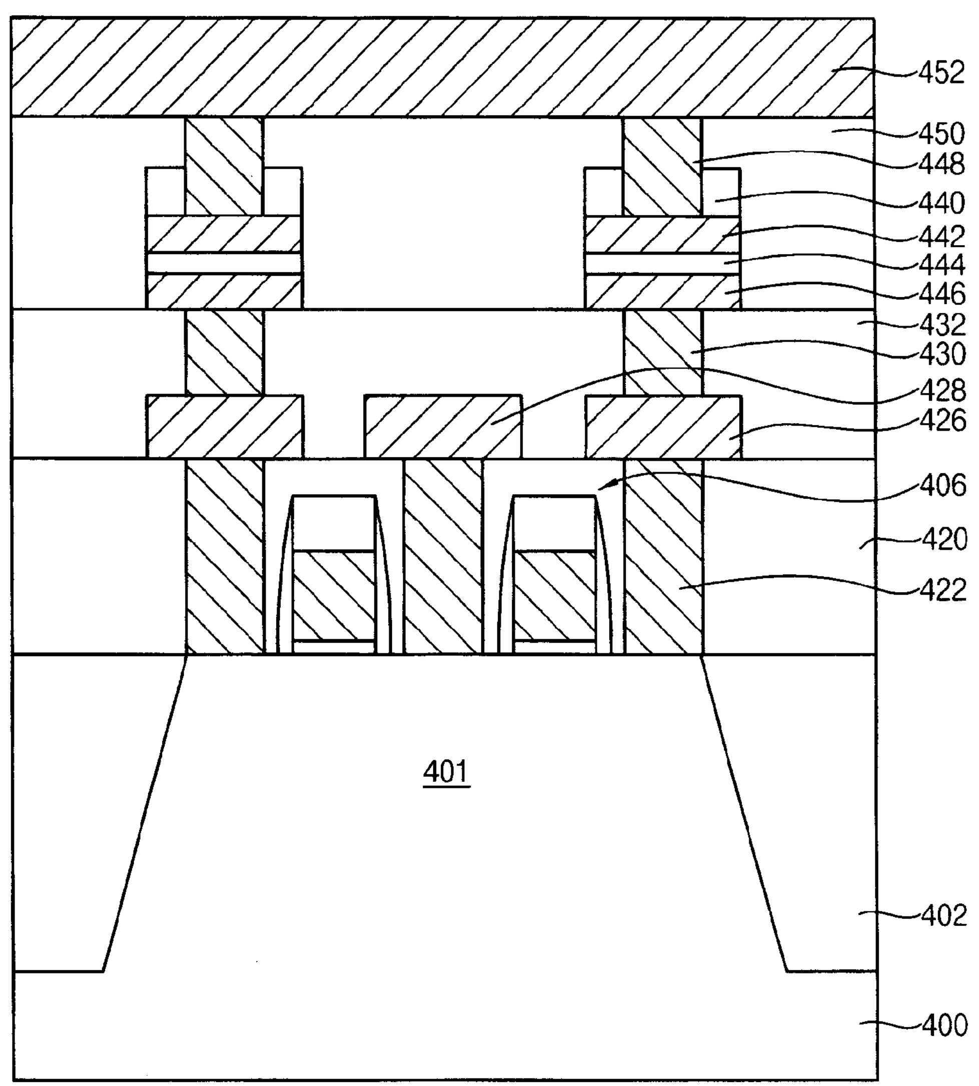

FIGS. 18A to 18C are cross-sectional views illustrating a method of manufacturing a resistive memory device in accordance with some example embodiments.

Referring to FIG. 18A, a substrate 400 including an active region 401 defined through forming a device isolation layer 402 may be prepared. A gate structure 406 including a gate insulating layer pattern 412, a gate conductive layer pattern 410, a mask pattern 408 and a gate spacer 416 may be formed in the active region 401. The process to form the gate structure may be performed in accordance with substantially the same process explained referring to FIGS. 17A to 17C. Impurities may be doped into the substrate 400 through an ion doping process between the gate structures to form a source/drain 418. Accordingly, a transistor in the cell region may be formed on the substrate 400.

A first insulating interlayer 420 may be formed by depositing an insulating material on the substrate 400 including the transistor formed thereon. The first insulating interlayer 420 may be partially removed to form an opening portion exposing the substrate 400 between the gate structures. Then, the opening portion may be filled up with a conductive material to form a first pad 424 and a second pad 422. The first pad 424 may be electrically connected to a common source line 428 and the second pad 422 may be electrically connected to a capacitor.

On the first insulating interlayer 420 including the first pad 424 and the second pad 422 formed thereon, a third pad 426 and a common source line 428 may be formed. The third pad 426 may be formed on the second pad 422 and the common source line 428 may be formed on the first pad 424. A second insulating interlayer 432 may be formed on the first insulating interlayer 420 including the third pad 426 and the common source line 428 formed thereon. The second insulating interlayer 423 may be partially removed to form an opening portion exposing the third pad 426. A conductive material may fill up the opening portion to form a fourth pad 430.

On the second insulating interlayer 423 including the fourth pad 430 formed thereon, a first conductive layer 434, a variable resistive material layer 436 and a second conductive layer 438 may be successively formed. A first conductive layer 434 and/or a second conductive layer 438 may be formed using a conductive material containing a metal. The first conductive layer 434 and/or the second conductive layer 438 may be formed by means of a layer deposition method including a sputtering method, a chemical vapor deposition method, an atomic layer deposition method, etc.

In some embodiments, the first conductive layer 434 and/or the second conductive layer 438 may be formed using a conductive material having a low electric resistivity such as tungsten, tungsten nitride, titanium, titanium nitride, tantalum, tantalum nitride, platinum, etc. In some other embodiments, the first conductive layer 434 and/or the second conductive layer 438 may include a conductive material such as iridium, ruthenium, titanium aluminum nitride, ruthenium oxide, iridium oxide, etc. In some further other embodiments, the first conductive layer 434 and/or the second conductive layer 438 may include conductive polysilicon.

The variable resistive material layer 436 may be formed on the first conductive layer 434. The variable resistive material layer 436 may be formed using a material having a switching characteristic of changing the property thereof from a conductive property to an insulating property or vice versa in accordance with a polarity and/or an intensity of an electric signal such as a voltage or a current applied between electrodes. In some embodiments, the variable resistive material layer 436 may be formed using a metal oxide, a metal oxide having a perovskite structure, a chalcogenide material, etc. The metal oxide may include nickel oxide, niobium oxide, titanium oxide, zirconium oxide, hafnium oxide, cobalt oxide, iron oxide, copper oxide, chromium oxide, etc. The chalcogenide material may include GeSbTe alloy. The variable resistive material layer 436 may be formed by one of processes including a sputtering process, a chemical vapor deposition process, an atomic layer deposition process, etc.

Referring to FIGS. 18A and 18B, a mask pattern 440 may be formed on the second conductive layer 438. The second conductive layer 438, the variable resistive material layer 436 and the first conductive layer 434 may be partially etched to form a second conductive layer pattern 442, a variable resistive material layer pattern 444 and a first conductive layer pattern 446. The etching process of the second conductive layer 438, the variable resistive material layer 436 and the first conductive layer 434 may be performed by a dry etching process and/or a wet etching process.

On the substrate 400 including the second conductive layer pattern 442, the variable resistive material layer pattern 444 and the first conductive layer pattern 446 formed thereon, a residue 448 generated while performing the etching process may be formed. When the first conductive layer 434 and/or the second conductive layer 438 include a metal, the residue 448 may include a metal oxide. When conductive residue remains between neighboring first conductive layers 434 and/or second conductive layers 438, a leakage current may be generated through the residue 448.

A cleaning process using a cleaning gas may be performed at a high temperature to remove the remaining residue 448 on the substrate 400 including the second conductive layer pattern 442, the variable resistive material layer pattern 444 and the first conductive layer pattern 446 formed thereon. The gas phase cleaning process may be performed using a cleaning gas containing an element generating a volatile metal compound through a reaction with a metal or a metal oxide contained in the residue. The cleaning gas may include an element such as silicon capable of generating a nonvolatile insulating material through a reaction with oxygen present in the variable resistive material layer pattern 444, in the second insulating interlayer 432, in the residue or in the atmosphere. The residue 448 may be removed by supplying the cleaning gas at a higher temperature than an evaporation point of the volatile metal compound. Explanation on the gas phase cleaning process may be substantially the same as the explanation described referring to FIGS. 2A to 2C.

In some embodiments, the gas phase cleaning process may be performed using $Si_xCl_y$-based gas or $Si_xCl_yH_z$-based gas including tetrachloro silane ($SiCl_4$), hexachloro disilane ($Si_2Cl_6$), dichloro silane ($SiCl_2H_2$), trichlorosilane ($SiCl_3H$), monochloro silane ($SiClH_3$), etc. The $Si_xCl_y$-based gas or $Si_xCl_yH_z$-based gas may have an appropriate reaction rate with a metal and so, the residue may be selectively removed while suppressing damage of the second conductive layer pattern 442 and the first conductive layer pattern 446. Upon removing the residue, the generation of the leakage current may be suppressed and the generation of a device defect may be decreased.

Referring to FIGS. 18A and 18B, explanation on forming the first conductive layer 434, the variable resistive material layer 436 and the second conductive layer 438 successively on the second insulating interlayer 423, and on performing an etching process using the mask pattern 440 as an etching mask to form the second conductive layer pattern 442, the variable resistive material layer pattern 444 and the first conductive layer pattern 446 has been illustrated. However, the formation of the second conductive layer pattern 442, the variable resistive material layer pattern 444 and the first conductive layer pattern 446 may not be limited to the example embodiments described above.

In some other embodiments, a first conductive layer may be formed on a second insulating interlayer and then, the first conductive layer may be partially etched to form a first conductive layer pattern, even though not illustrated in the drawings. A residue generated while performing the etching process of the first conductive layer may be removed through the gas phase cleaning process illustrated and described in accordance with the example embodiments. A variable resistive material layer may be formed on the first conductive layer pattern and then, a second conductive layer pattern may be formed on the variable resistive material layer, in a perpendicular direction to an extended direction of the first conductive layer pattern. A residue generated while forming the second conductive layer pattern may be also removed through the gas phase cleaning process in accordance with the example embodiments.

Referring to FIG. 18C, a third insulating interlayer 450 covering the second conductive layer pattern 442 may be formed on the second insulating interlayer 432. The third insulating interlayer 450 and the mask pattern 440 may be partially removed to form an opening portion exposing the second conductive layer pattern 442. A conductive material may fill up the opening portion to form a fifth pad 448. A conductive layer may be formed on the third insulating interlayer 450 and the fifth pad 448 and then, the conductive layer may be patterned to form a bit line 452 connected to the fifth pad 448. The bit line 452 may be formed in a perpendicular direction to an extended direction of the gate structure 406.

Semiconductor devices manufactured by some embodiments may be formed in various structures and may be used as a constituting part of various devices. Particularly, various memory devices including nonvolatile memory devices, DRAM devices or resistive memory devices may be applied to accomplish various memory cards, a USB memory, solid-state drivers (SSD), etc.

Figure 19:
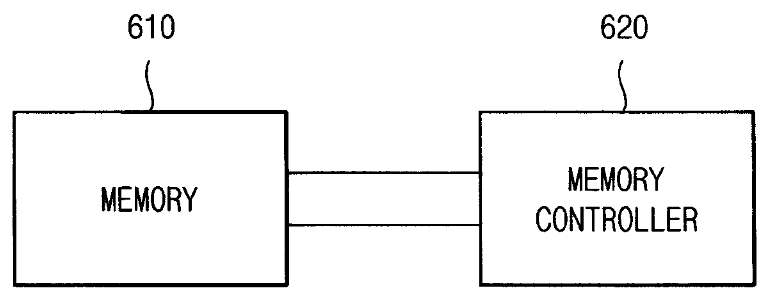

FIG. 19 illustrates a semiconductor apparatus including a semiconductor device manufactured in accordance with some example embodiments.

The semiconductor apparatus in accordance with example embodiments may include a memory 610 and a memory controller 620. The memory 610 may include a nonvolatile memory device, a DRAM device or a resistive memory device manufactured by some embodiments. The memory controller 620 may apply an input signal controlling an operation of the memory 610. Particularly, the memory controller 620 may provide a commanding signal and an address signal. The memory controller 620 may control the memory 610 based on thus received control signal.

Figure 20:
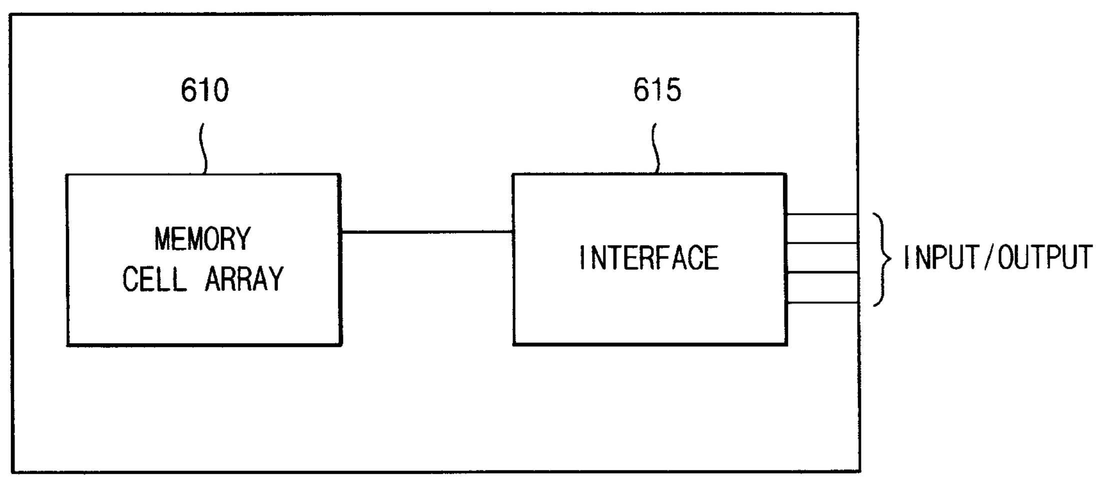

FIG. 20 illustrates a semiconductor apparatus including a semiconductor device manufactured in accordance with some other example embodiments.

The semiconductor apparatus in accordance with some other embodiments may include a memory 610 connected to an interface 615. The memory 610 may include a memory cell array. The memory 610 may include an array of the different configurations of semiconductor memory devices described in accordance with example embodiments. The interface 615 may provide an input signal generated from an exterior source. Particularly, the interface 615 may provide a commanding signal and an address signal. The interface 615 may control various regions of the memory 610 based on control signals generated from an exterior source.

Figure 21:
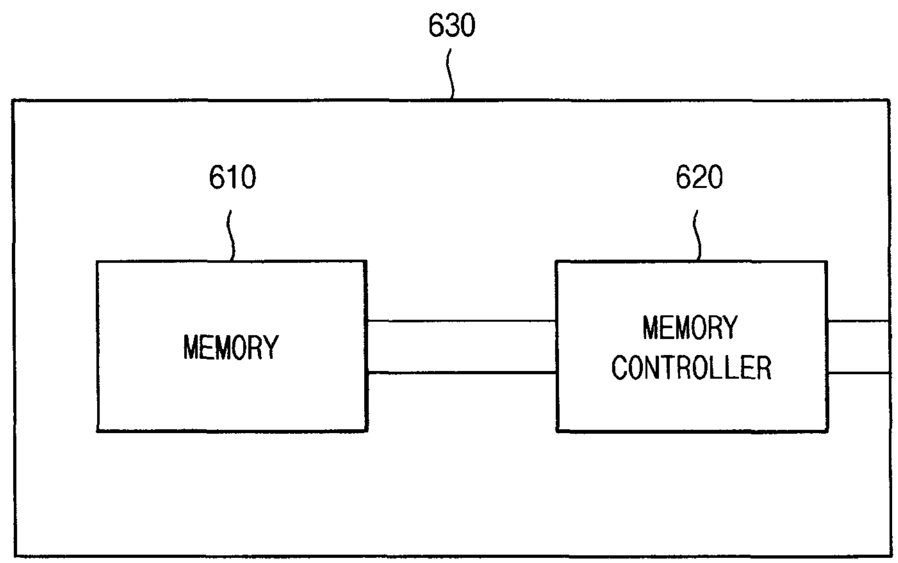

FIG. 21 illustrates a semiconductor apparatus including a semiconductor device manufactured in accordance with some other example embodiments.

Referring to FIG. 21, the semiconductor apparatus in accordance with some other embodiments may include a memory 610 and a memory controller 620 as a memory card 630. The remaining constituents may be similar to the semiconductor apparatus in FIG. 19. Particularly, the memory card 630 may be a memory card satisfying a standard used along with a consumer's electronic device including a digital camera, a personal computer, etc. The memory controller 620 may control the memory 610 based on a controlling signal received by the memory card 630 from a different apparatus e.g., an external apparatus.

Figure 22:
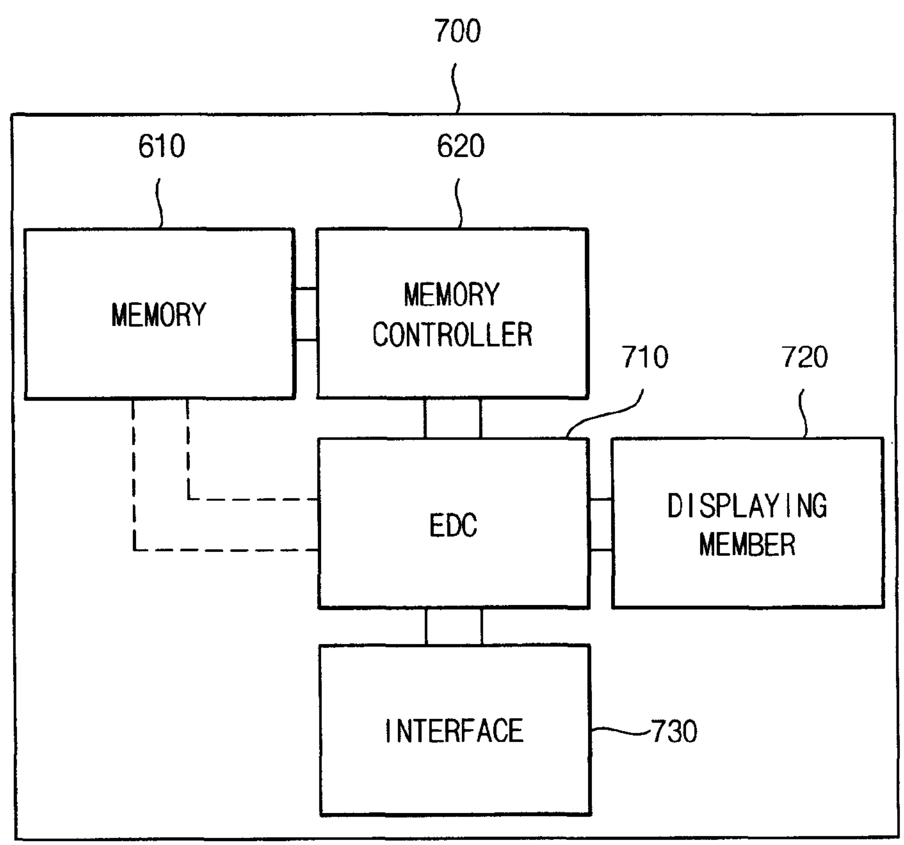

FIG. 22 illustrates a portable apparatus 700 including a semiconductor device manufactured in accordance with some example embodiments.

A portable apparatus 700 may include an MP3, a video player, a video, an audio player, etc. The portable apparatus 700 may include a memory 610 and a memory controller 620 as illustrated in FIG. 22. The memory 610 may include a semiconductor memory device manufactured by the above-described embodiments. The portable apparatus 700 may include an encoder and decoder (EDC) 710, a displaying member 720 and an interface 730. Data including video data and audio data may be exchanged via the memory controller 620 between the memory 610 and the EDC 710. As illustrated in dotted lines, data may be directly exchanged between the memory 610 and the EDC 710.

The EDC 710 may encode data to be stored in the memory 610. Particularly, the EDC 710 may encode audio data for MP3 and may store thereof in the memory 610. In addition, the EDC 710 may encode MPEG video data such as MPEG2, MPEG3, MPEG4, etc., and may store thereof in the memory 610. In addition, the EDC 710 may include various encoders to encode other types of data in accordance with other data format. Particularly, the EDC 710 may include an MP3 encoder for audio data and an MPEG encoder for video data. The EDC 710 may decode audio data for MP3 outputted from the memory 610. Particularly, the EDC 710 may also decode audio data outputted from the memory 610. Alternatively, the EDC 710 may MPEG decode including MPEG2, MPEG3, MPEG4, etc., video data outputted from the memory 610. In addition, the EDC 710 may also include a plurality of decoders to decode various types of data in accordance with other data format.

For example, the EDC 710 may include an MP3 decoder for audio data and an MPEG decoder for video data. The EDC 710 may include only a decoder. Particularly, encoded data may be transferred to the EDC 710, may be decoded and then, may be transferred to the memory controller 620 and/or the memory 610.

The EDC 710 may receive data to encode or encoded data via the interface 730. The interface 730 may follow a well-known standard including a USB, a firewire, etc. The interface 730 may also include one or more interfaces. Particularly, the interface 730 may include a firewire interface, a USB interface, etc. Data provided from the memory 610 may be outputted via the interface 730.

The displaying member 720 may display data decoded by the memory 610 and/or the EDC 710 so that a user may recognize the decoded data. Particularly, the displaying member 720 may include a displaying screen to output video data, a speaker jack to output audio data and so on.

Figure 23:
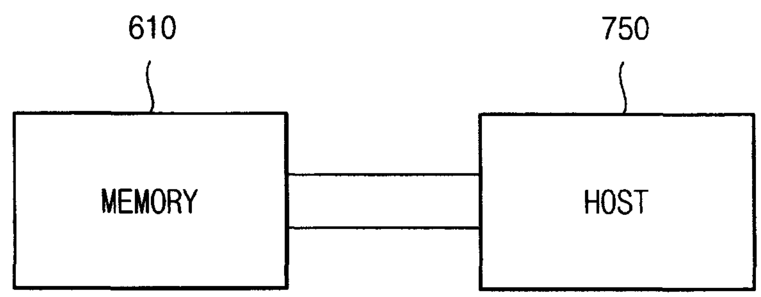

FIG. 23 illustrates a portable apparatus including a semiconductor device manufactured in accordance with some example embodiments.

Referring to FIG. 23, a memory 610 may be connected to a host system 750. The memory 610 may include a semiconductor memory device manufactured in accordance with the above-described embodiments. The host system 750 may be a processing system including a personal computer, a digital camera, etc. The memory 610 may be a memory media which may be attachable and detachable including a memory card, a USB memory, a solid-state driver, etc. The host system 750 may provide an inputting data to control an operation of the memory 610. Particularly, the host system 750 may provide a commanding signal and an address signal.

Figure 24:
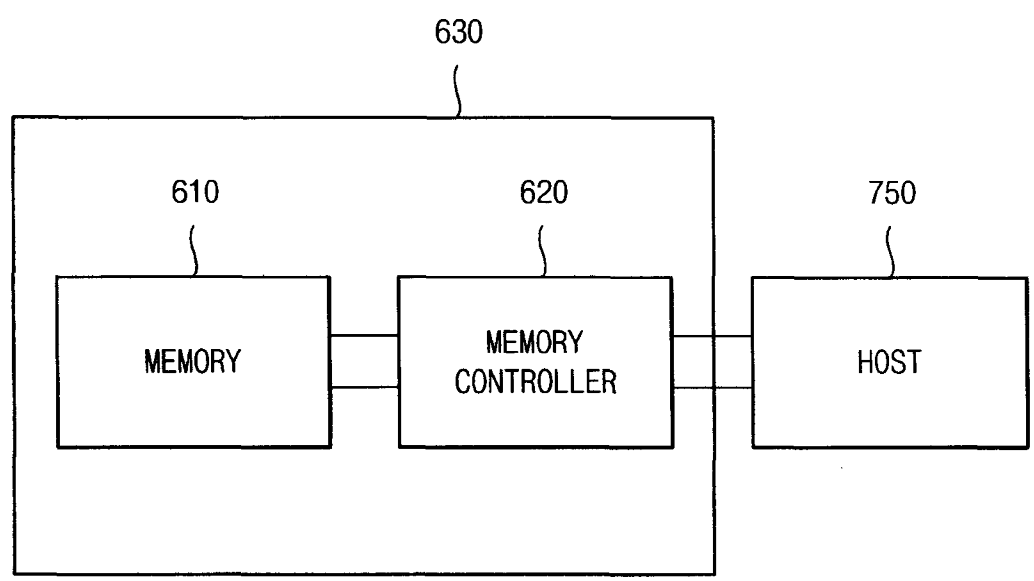

FIG. 24 illustrates a semiconductor apparatus including a semiconductor device manufactured in accordance with some example embodiments. A host system 750 may be connected to a memory card 630 in accordance with some embodiments. The host system 750 may provide a controlling signal to the memory card 630 so that the memory controller 620 may control an operation of the memory 610.

Figure 25:
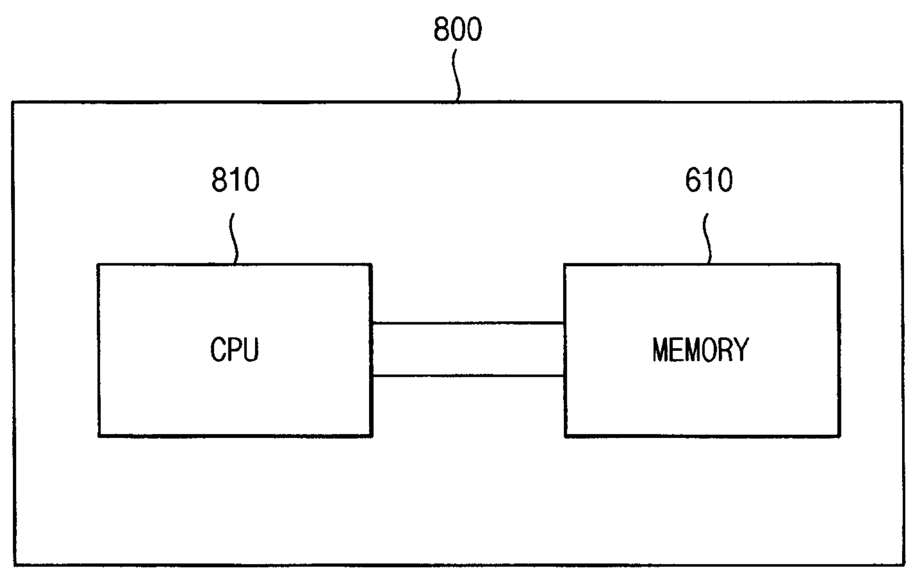

FIG. 25 illustrates a semiconductor apparatus including a semiconductor device manufactured in accordance with some example embodiments. A memory 610 may be connected to a central processing unit (CPU) 810 in a computer system 800 in accordance with some embodiments.

Particularly, the computer system 800 may be a personal computer, a personal data assistant, etc. The memory 610 may be connected to the CPU 810 through a bus.

Figure 26:
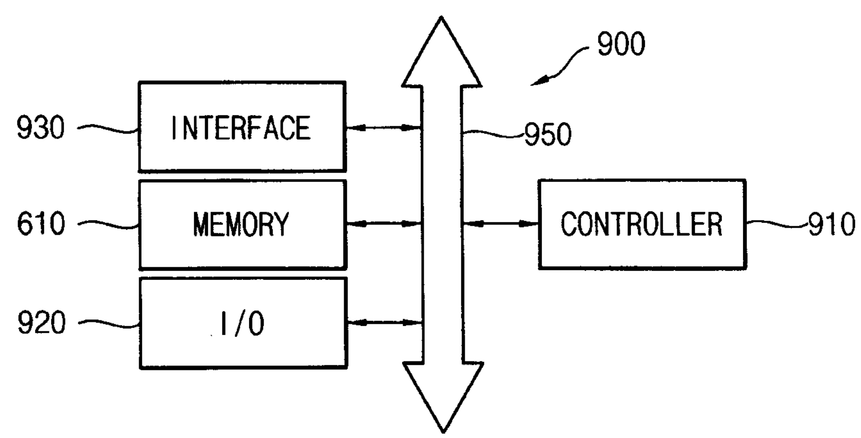

FIG. 26 illustrates a semiconductor apparatus including a semiconductor device manufactured in accordance with some example embodiments.

An apparatus 900 may include a controller, an input/output device 920 including a keyboard and a display, a memory 610, an interface 930 and so on. Each element in the apparatus in accordance with some embodiments may be connected to each other through a bus 950. The controller 910 may include at least one among a micro processor, a digital processor, a micro controller or a processor.

The memory 610 may store data and/or commands executed by the controller 910. The interface 930 may be used to transfer data from other system including a communication network or to other system including the communication network. The apparatus 900 may be a mobile system including PDA, a portable computer, a web tablet, a wireless phone, a mobile phone, a digital music player, a memory card or other system that may send and/or receive information.

As described above, a conductive layer pattern generating no leakage current or no electric defect may be formed through removing a conductive metal residue in accordance with some embodiments. The feature of example embodiments may be applied to form a semiconductor device including a conductive layer pattern such as a wiring, a gate of a transistor, an electrode, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present general inventive concept. Accordingly, all such modifications are intended to be included within the scope of the present general inventive concept as defined in the claims. In the claims, means-plus-function clauses when used are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of removing a residue comprising:

inflowing a cleaning gas onto a substrate including a residue containing a metal element, the cleaning gas containing an element to react with the metal element and generate a volatile metal compound; and evaporating the volatile metal compound to remove the metal component in the residue.

2. The method of claim 1, wherein the residue includes an oxide compound of the metal element.

3. The method of claim 1, wherein the metal element contained in the residue is at least one selected from the group consisting of tungsten, titanium, tantalum and platinum.

4. The method of claim 1, wherein the element to generate the volatile metal compound in the cleaning gas includes chlorine.

5. The method of claim 1, wherein the cleaning gas includes an element to generate a volatile metal oxide and silicon.

6. The method of claim 5, wherein the cleaning gas includes at least one selected from the group consisting of tetrachloro silane ($SiCl_4$), hexachloro silane ($Si_2Cl_6$), dichloro silane ($SiCl_2H_2$), trichloro silane ($SiCl_3H$) and monochloro silane ($SiClH_3$).

7. The method of claim 5, wherein oxygen and the silicon contained in the cleaning gas react to form silicon oxide on the substrate while evaporating the metal compound to remove the metal element contained in the residue.

8. The method of claim 7, further performing a process of removing the silicon oxide.

9. A method of forming a conductive layer pattern comprising:

forming a conductive layer containing a metal element on a substrate;

partially etching the conductive layer to generate a residue including an oxide of the metal element and to form a plurality of separately formed conductive layer patterns;

inflowing a cleaning gas onto the substrate including the conductive layer pattern, the cleaning gas containing an element to react with the metal element and generate a volatile metal compound; and evaporating the metal compound to remove the metal element contained in the residue and forming an insulating interface layer on the conductive layer pattern and a surface portion of the substrate through a reaction of a portion of the cleaning gas and an oxygen.

10. The method of claim 9, wherein the conductive layer pattern includes at least one selected from the group consisting of tungsten, titanium, tantalum and platinum.

11. The method of claim 9, wherein the cleaning gas includes an element to generate a volatile metal oxide and silicon.

12. The method of claim 9, wherein the cleaning gas includes at least one selected from the group consisting of tetrachloro silane ($SiCl_4$), hexachloro silane ($Si_2Cl_6$), dichloro silane ($SiCl_2H_2$), trichloro silane ($SiCl_3H$) and monochloro silane ($SiClH_3$).

13. The method of claim 9, further performing a removing process of the insulating interface layer.

14. The method of claim 9, wherein after the insulating interface layer is formed, the metal compound remaining in the metal element is lifted up above the insulating interface layer such that a bonding state of the metal material to the insulating interface layer is weakened and the metal compound is removed.

15. The method of claim 9, the inflowing of the cleaning gas and the evaporating of the metal compound are performed at a temperature range of from about 200° C. to about 1,000° C.

16. The method of claim 15, further performing a heat treatment of the conductive layer pattern to increase a hardness of the conductive layer pattern.

17. The method of claim 16, wherein the heat treatment is performed simultaneously with the inflowing of the cleaning gas and the evaporating of the metal compound.

18. A method of forming a conductive layer pattern comprising:

forming a conductive layer including a metal element in a first region of a substrate;

forming a polysilicon layer in a second region of the substrate;

partially etching the polysilicon layer to form a polysilicon pattern;

partially etching the conductive layer to form a plurality of separated conductive layer patterns and generating a residue including an oxide compound of the metal element;

inflowing a cleaning gas onto the substrate including the conductive layer pattern, the cleaning gas containing an element to react with the metal element and generating a volatile metal compound;

evaporating the volatile metal compound to remove the residue;

selectively oxidizing a sidewall portion of the polysilicon pattern to form an oxide layer; and forming an insulating layer to form a capping state or layer along surface portions of the conductive layer pattern, the oxide layer and the substrate.

19. The method of claim 18, the inflowing of the cleaning gas, the evaporation of the volatile metal compound, the selective oxidization to form the oxide layer and the forming of the insulating layer to form a capping state or layer are performed in-situ.

20. The method of claim 18, further comprising:

performing a post treating process after evaporating the volatile metal compound to exhaust out remaining gas and to remove polymers remaining on the conductive layer pattern during and after the cleaning process.

21. A method of manufacturing a nonvolatile memory device comprising:

forming a tunnel insulating layer on a substrate;

forming a charge trapping layer and a blocking dielectric layer on the tunnel insulating layer;

forming a conductive layer including a metal element on the blocking dielectric layer;

partially etching the conductive layer to form a plurality of separated conductive layer patterns on the blocking dielectric layer and generating a residue including an oxide compound of the metal element;

inflowing a cleaning gas containing an element to react with the metal element contained in the residue and generating a volatile metal compound; and evaporating the metal compound to remove the metal element in the residue and reacting a portion of the cleaning gas with oxygen to form an insulating interface layer on surface portions of the conductive layer pattern and the substrate.

22. The method of claim 21, wherein the cleaning gas includes chlorine and silicon.

23. The method of claim 21, wherein the conductive layer includes at least one metal element selected from the group consisting of tungsten, titanium, tantalum and platinum.

24. The method of claim 21, wherein the blocking dielectric layer includes at least one metal oxide of aluminum oxide and silicon oxide.

25. The method of claim 21, further performing after inflowing the cleaning gas, a removing process of the insulating interface layer by providing a solution to etch the insulating interface layer from the substrate.

26. The method of claim 21, wherein the inflowing of the cleaning gas is performed at a temperature range of from about 200° C. to about 1,000° C.

27. The method of claim 21, wherein the conductive layer includes tungsten and the inflowing of the cleaning gas is performed at a temperature of about 227° C. or higher.

28. The method of claim 21, further performing prior to performing the inflowing of the cleaning gas, partially removing the blocking dielectric layer and the charge trapping layer to form a blocking dielectric layer pattern and a charge trapping layer pattern.

29. The method of claim 21, further comprising:

generating a residue including an oxide compound of the metal element on side portions of the tunnel insulating layer, charge trapping layer and blocking dielectric layer; and forming an insulating interface layer on the side portions of the tunnel insulating layer, charge trapping layer and blocking dielectric layer after evaporating the metal compound.

30. A method of manufacturing a nonvolatile memory device comprising:

preparing a substrate including a cell region and a peripheral circuit region;

forming a gate insulating layer and a gate electrode including silicon in the peripheral circuit region on the substrate;

successively forming a tunnel insulating layer, a charge trapping layer, a blocking dielectric layer and a conductive layer pattern including a metal element in the cell region on the substrate;

providing a gas containing chlorine and silicon onto the substrate to remove conductive residue remaining between the conductive layer patterns; and selectively oxidizing a surface portion of a sidewall of the gate electrode by providing an oxidizing gas and a reducing gas onto the substrate.

31. The method of claim 30, wherein the removal of the conductive residue and the oxidation of the surface of the sidewall of the gate electrode are performed in-situ in a same equipment.

32. The method of claim 30, further performing after performing the selective oxidization of the surface of the sidewall of the gate electrode, forming an insulating layer to form a capping state or layer on the gate electrode, the conductive layer pattern and the substrate in-situ in the same equipment.

33. A method of manufacturing a vertical type nonvolatile memory device comprising:

forming a vertically extended semiconductor pattern on a substrate;

forming an insulating layer to surround the semiconductor pattern;

forming a plurality of separated opening portions along a vertical direction of the substrate on the insulating layer, the opening portions exposing a portion of a sidewall of the semiconductor pattern;

forming a tunnel insulating layer at an exposed sidewall portion of the semiconductor pattern by the opening portions;

successively forming a conductive layer including a charge trapping layer, a blocking dielectric layer and a metal element on the tunnel insulating layer;

partially removing the conductive layer to form a plurality of conductive layer patterns filling up the opening portions; and providing a gas containing chlorine and silicon onto the substrate including the conductive layer pattern to remove a residue remaining between the conductive layer patterns.

34. The method of claim 33, wherein the conductive layer includes at least one metal element selected from the group consisting of tungsten, titanium, tantalum and platinum.

35. The method of claim 33, wherein the successively formed conductive layer is a control gate layer of a string of serially connected cell transistors.

36. The method of claim 35, wherein the charge trapping layer is connected between the string of serially connected cell transistors.

37. The method of claim 33, further comprising:

forming a second vertically extended semiconductor pattern and a second insulating layer surrounding the second vertically extended semiconductor pattern; and forming a conductive bit line to connect the vertically extended semiconductor pattern to the second vertically extended semiconductor pattern.

38. The method of claim 37, wherein the conductive layers extend in a first direction and the conductive bit line extends in a second direction perpendicular to the first direction.

39. A method of manufacturing a transistor comprising:

forming a gate insulating layer on a substrate;

forming a conductive layer including a metal element on the gate insulating layer;

partially removing the conductive layer to form a plurality of separated conductive layer patterns on the insulating layer; and inflowing a gas containing chlorine and silicon to remove a residue remaining between the conductive layer patterns.

40. The method of claim 39, wherein the removal of the residue is performed by:

reacting chlorine in the cleaning gas with the metal element in the residue to generate a volatile metal compound;

evaporating the metal compound to remove the metal element in the residue; and reacting silicon in the cleaning gas with oxygen to form an insulating interface layer on surface portions of the conductive layer pattern and the substrate.

41. A method of manufacturing a DRAM comprising:

forming a gate electrode structure on a substrate;

forming a first insulating interlayer including a first contact plug electrically connected to a portion of the substrate on the gate electrode structure;

forming a bit line structure including a metal element on the first insulating interlayer;

removing a residue remaining between the bit line structures by inflowing the gas containing chlorine and silicon;

forming a second insulating interlayer including a second contact plug electrically connected to a portion of the first contact plug on the bit line structure; and forming a capacitor electrically connected to the second contact plug.

42. The method of claim 41, wherein the gate electrode structure includes the metal element and a process of removing a residue remaining between the gate electrode structures is further performed by inflowing the gas containing chlorine and silicon.

43. A method of testing a semiconductor device, comprising:

patterning a layer of a first metal formed on an oxide layer of a second metal on a substrate;

measuring a first amount of a residue of the first metal formed on the oxide layer of a second metal;

performing a gas phase cleaning process using on the substrate including the pattern of the first metal;

measuring a second amount of the metal residue remaining on the oxide of the second metal after performing the gas phase cleaning process; and comparing a difference between the second amount and the first amount to determine an amount of the first metal decreased by performing the gas phase cleaning process.

44. The method of claim 43, wherein the measuring of the first and second amounts of residue of the first metal is conducted by measuring an X-ray photoelectron spectroscopy (XPS) spectrum of the oxide layer of the second metal positioned between neighboring patterns of the first metal.

45. The method of claim 43, wherein the first metal is tungsten and the second metal is aluminum.

46. The method of claim 43, wherein the gas cleaning process uses hexachloro disilane ($Si_2Cl_6$) at a temperature of about 600° C. for a first time period.

* * * * *